United States Patent
Kobayashi et al.

(10) Patent No.: US 7,622,318 B2
(45) Date of Patent: *Nov. 24, 2009

(54) METHOD FOR PRODUCING STRUCTURED SUBSTRATE, STRUCTURED SUBSTRATE, METHOD FOR PRODUCING SEMICONDUCTOR LIGHT EMITTING DEVICE, SEMICONDUCTOR LIGHT EMITTING DEVICE, METHOD FOR PRODUCING SEMICONDUCTOR DEVICE, SEMICONDUCTOR DEVICE, METHOD FOR PRODUCING DEVICE, AND DEVICE

(75) Inventors: Toshimasa Kobayashi, Kanagawa (JP); Kensaku Motoki, Osaka (JP)

(73) Assignees: Sony Corporation, Tokyo (JP); Sumitomo Electric Industries, Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/813,528

(22) Filed: Mar. 30, 2004

(65) Prior Publication Data

US 2005/0227458 A1 Oct. 13, 2005

(51) Int. Cl.
*H01L 21/00* (2006.01)
(52) U.S. Cl. .................................................... 438/46
(58) Field of Classification Search ............. 438/22–47
See application file for complete search history.

(56) References Cited

U.S. PATENT DOCUMENTS

| 6,051,849 | A | 4/2000 | Davis et al. | |
|---|---|---|---|---|
| 6,355,497 | B1 * | 3/2002 | Romano et al. | 438/39 |
| 6,570,192 | B1 | 5/2003 | Davis et al. | |
| 6,602,763 | B2 | 8/2003 | Davis et al. | |
| 6,608,327 | B1 | 8/2003 | Davis et al. | |
| 6,667,184 | B2 * | 12/2003 | Motoki et al. | 438/22 |
| 6,693,021 | B1 | 2/2004 | Motoki et al. | |
| 7,091,056 | B2 * | 8/2006 | Asatsuma et al. | 438/22 |
| 7,357,837 | B2 | 4/2008 | Motoki et al. | |
| 2001/0035532 | A1 * | 11/2001 | Ito et al. | 257/103 |
| 2001/0038655 | A1 * | 11/2001 | Tanaka et al. | 372/43 |
| 2003/0020087 | A1 * | 1/2003 | Goto et al. | 257/103 |
| 2005/0042787 | A1 * | 2/2005 | Ito et al. | 438/41 |
| 2005/0221515 | A1 * | 10/2005 | Yanashima et al. | 438/21 |

(Continued)

FOREIGN PATENT DOCUMENTS

JP 2003-183100 3/2003

(Continued)

OTHER PUBLICATIONS

Japanese Office Action, issued on Mar. 3, 2009, 4 pages.

*Primary Examiner*—Savitri Mulpuri
(74) *Attorney, Agent, or Firm*—Sonnenschein Nath & Rosenthal LLP

(57) ABSTRACT

When a semiconductor light emitting device or a semiconductor device is produced using a nitride type III-V group compound semiconductor substrate on which a plurality of second regions made of a crystal having a second average dislocation density are regularly arranged in a first region made of a crystal having a first average dislocation density so as to produce the structured substrate, the second average dislocation density being greater than the first average dislocation density, a light emitting region of the semiconductor light emitting device or an active region of the semiconductor device is formed in such a manner that it does not pass through any one of the second regions.

38 Claims, 26 Drawing Sheets

U.S. PATENT DOCUMENTS

| | | | |
|---|---|---|---|
| 2005/0227392 A1 * | 10/2005 | Asatsuma et al. | 438/22 |
| 2006/0097278 A1 * | 5/2006 | Goto et al. | 257/103 |

FOREIGN PATENT DOCUMENTS

| | | |
|---|---|---|
| JP | 2003-124115 | 4/2003 |
| JP | 2003-124572 | 4/2003 |
| JP | 2003-124573 | 4/2003 |
| JP | 2003-165799 | 10/2003 |
| JP | 2004088134 * | 3/2004 |
| JP | 2001-102307 | 6/2009 |
| WO | WO 99/23693 | 5/1999 |
| WO | WO 99/44224 | 9/1999 |

* cited by examiner

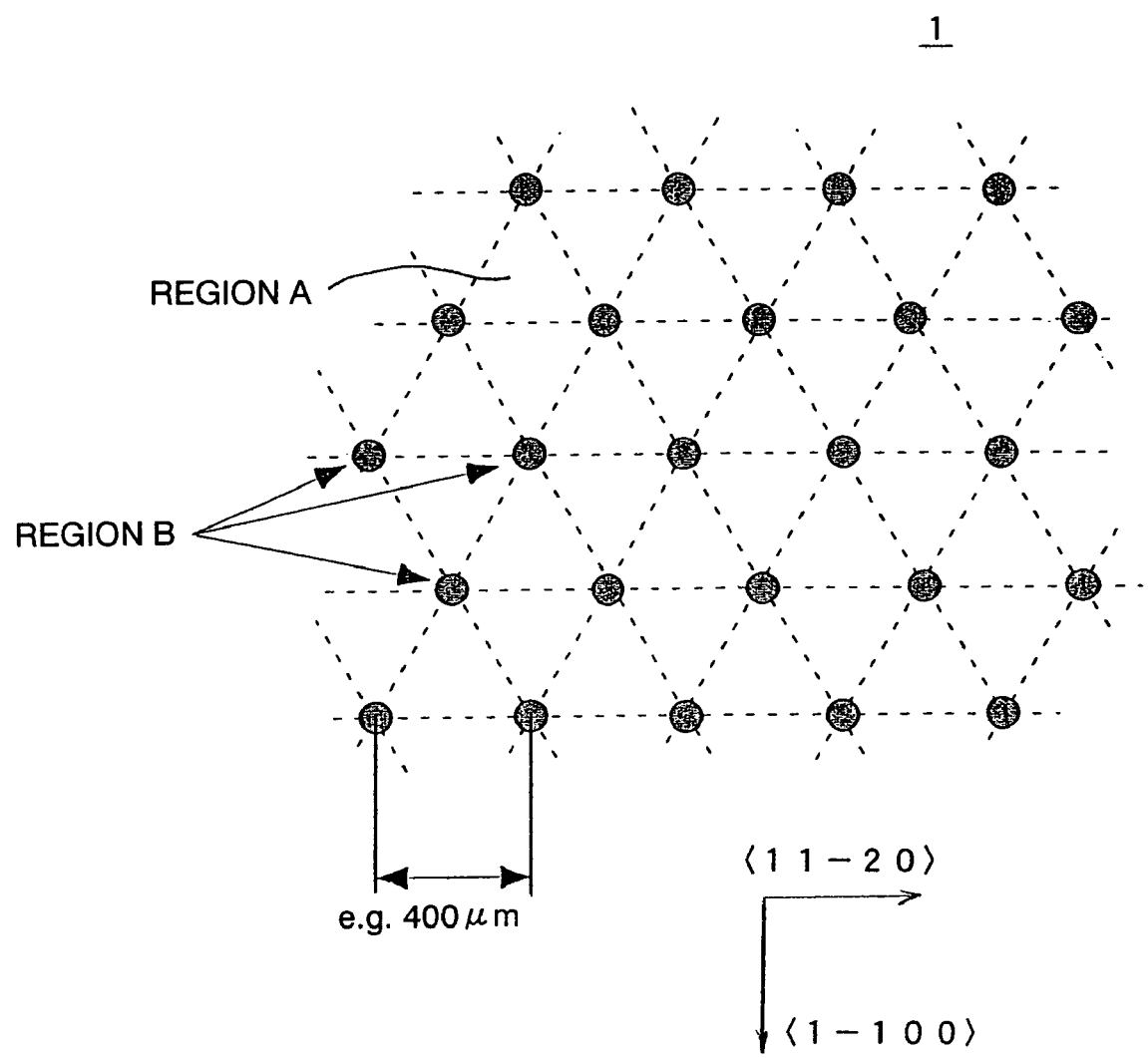

e.g. 400 μm e.g. 400 μm

<11-20> DIRECTION e.g. 400 μm e.g. 400 μm e.g. 400 μm e.g. 400 μm

METHOD FOR PRODUCING STRUCTURED SUBSTRATE, STRUCTURED SUBSTRATE, METHOD FOR PRODUCING SEMICONDUCTOR LIGHT EMITTING DEVICE, SEMICONDUCTOR LIGHT EMITTING DEVICE, METHOD FOR PRODUCING SEMICONDUCTOR DEVICE, SEMICONDUCTOR DEVICE, METHOD FOR PRODUCING DEVICE, AND DEVICE

BACKGROUND OF THE INVENTION

1. Field of the Invention

The present invention relates to a method for producing a structured substrate, a structured substrate, a method for producing a semiconductor light emitting device, a semiconductor light emitting device, a method for producing a semiconductor device, a semiconductor device, a method for producing a device, and a device, in particular, to those suitable for producing a semiconductor laser, a light emitting diode, or an electron traveling device using for example a nitride type III-V group compound semiconductor.

2. Description of the Related Art

Nitride type III-V group compound semiconductors such as GaN, AlGaN, GaInN, and AlGaInN feature in a large band gap $E_g$ and direct transition semiconductor materials in comparison with arsenic type III-V group compound semiconductors such as AlGaInAs and phosphorous type III-V group compound semiconductors such as AlGaInP. Thus, these nitride type III-V group compound semiconductors have attracted considerable attention as materials of semiconductor lasers that can emit short wavelength light ranging from ultraviolet ray to green and materials of semiconductor light emitting devices such as light emitting diodes (LEDs) that can cover a wide range of light emitting wavelengths from ultraviolet ray to red and white. These materials are expected for wide applications such as high density optical discs, full color displays, environmental and medical fields.

In addition, these nitride type III-V group compound semiconductors for example GaN feature in a large saturation speed in a high electric field, a high temperature operation of for example up to around 400° C., and continuous crystal growth for a semiconductor layer and an insulation layer using AlN in for example a metal-insulator-semiconductor (MIS) structure. Thus, these nitride type III-V group compound semiconductors are expected for materials that compose radio frequency electronic devices that can operate at high temperature and with a large output.

In addition, these nitride type III-V group compound semiconductors have the following advantages.

(1) Since they have higher thermal conductivities than GaAs type semiconductors, they are suitable for devices that operate at high temperatures and with large outputs.

(2) Since they are chemically stable and hard, they have good reliability.

(3) They are compound semiconductor materials that less contaminate environment. In other words, AlGaInN type semiconductors do not contain environmental pollutants and poisonous substances. In reality, they do not contain arsenic (As) for AlGaAs type semiconductors, cadmium (Cd) for ZnCdSSe type semiconductors, and a material arsine ($AsH_3$).

However, proper substrate materials for devices using nitride type III-V group compound semiconductors that have good reliability are not known.

To obtain high quality crystals, substrate materials for nitride type III-V group compound semiconductors have the following problems and conditions to be solved and satisfied.

(1) Structural materials GaN, AlGaN, and GaInN of the nitride type III-V group compound semiconductors are of full distortion type of which there are different lattice constants. Thus, compositions, thicknesses, and so forth of nitride type III-V group compound semiconductors and substrates should be designed so that they are free from cracks and obtain good crystal films.

(2) A high quality substrate that can lattice-match GaN has not been developed. Like a high quality GaAs substrate that can lattice-match a GaAs type semiconductor and a GaInP type semiconductor and a high quality InP substrate that can lattice-match a GaInAs type semiconductor, for example a high quality GaN substrate is under development. A SiC substrate having a relatively small difference of lattice constants is expensive. In addition, it is difficult to produce a SiC substrate having a large diameter. Since a tensile distortion takes place in a crystal film, it easily cracks. In addition, there is no substrate that can lattice-match GaN other than those.

(3) Necessary conditions of substrate materials for nitride type III-V group compound semiconductors are a high crystal growth temperature of around 1000° C. and no deterioration and no corrosion of V group materials in an ammonium atmosphere.

In consideration of the foregoing reasons, as a substrate of a nitride type III-V group compound semiconductor, a sapphire substrate is often used.

A sapphire substrate is stable at crystal growth temperature of a nitride type III-V group compound semiconductor. Thus, as an advantage, high quality substrates having a diameter of two inches or three inches can be stably supplied. However, lattice-mismatch of a sapphire substrate to GaN is large (around 13%). Thus, a buffer layer made of GaN or AlN is grown on the sapphire substrate at low temperature. Above the buffer layer, a nitride type III-V group compound semiconductor is grown. As a result, although a single crystal of a nitride type III-V group compound semiconductor can be grown, the defect density is as large as $10^8$ to $10^9$ ($cm^{-2}$) due to lattice mismatching. Thus, when the nitride type III-V group compound semiconductor is used for a semiconductor laser, it does not have reliability for a long time.

In addition, (1) since a sapphire substrate does not have cleavage, an end plane of a laser cannot be stably formed with specular property. (2) Since sapphire is insulative, it is necessary to take out a p-side electrode and an n-side electrode from the upper surface of the substrate. (3) When a crystal growth film is thick, due to the difference of thermal expansion coefficients of a nitride type III-V group compound semiconductor and sapphire, the substrate largely skews at room temperature. As a result, the device forming process is adversely affected.

To obtain a high quality semiconductor crystal that is grown on a substrate such as a sapphire substrate whose lattice constant is different from the semiconductor crystal, a method using epitaxial lateral overgrowth (ELO) is known. In the ELO, high crystal quality regions (lateral growth regions) and low crystal quality regions (or high defect density regions) (on seed crystals, their boundaries, meeting portions, and so forth) periodically take place. However, when the size of an active region (for example, a light emitting region of a light emitting device or an electron traveling region of an electron traveling device) is not large, the period of the ELO can be greater than the interval of stripes of a semiconductor laser and the interval of emitter region/collector region (or source region/drain region) of a transistor. For example, the period of the ELO is 10 to 20 μm, whereas the size of an active region of a device is around several μm. Thus, an active region can be designed to be formed in a high quality region.

When a device is formed on a sapphire substrate by the ELO, in addition to the foregoing problem of bad cleavage due to characteristics of sapphire, there are for example the following problems.

(1) Since the number of steps necessary for the ELO is large, the yield decreases.

(2) Since the crystal film thickness increases for the ELO, the substrate-largely skews due to thermal stress. As a result, the controllabilities of the crystal growing step and wafer process deteriorate.

(3) The device size is restricted. A device such as an LED, a photo detector (PD), and an integrated circuit device that have an active region greater than the ELO period (namely, one side of the active region is for example several hundred μm), since all the device region cannot be formed as high crystal quality regions, the effect of the ELO cannot be fully obtained.

Although the foregoing problems would be solved when a high quality GaN substrate could be obtained. However, so far, a high quality GaN substrate having a large diameter has not been obtained. This is because a good seed crystal cannot be obtained from GaN by hydride vapor phase epitaxy (HVPE), which is high temperature. (high pressure) growth. Thus, single crystal growth cannot be stably performed. As a result, a high quality substrate cannot be easily produced.

Japanese Patent Laid-Open Publication No. 2001-102307 has proposed a method for producing a single crystal GaN substrate so as to solve the foregoing problems. According to the related art, after a GaN seed substrate having a high defect density is formed, a three-dimensional facet as a core is formed at a part thereof. A crystal is grown so that the facet is not closed. Crystal dislocations are gathered around the core portion. As a result, a wide substrate having high quality is produced.

However, that technology disclosed in Japanese Patent Laid-Open Publication No. 2001-102307 causes the through-dislocations to be gathered around a region of a growth layer so as to decease the through-dislocations of the other regions. Thus, a low defect density region and high defect density regions coexist in the obtained single crystal GaN substrate. In addition, the positions of the high defect density regions cannot be controlled. Instead, the high defect density regions randomly take place. Thus, when a semiconductor device for example a semiconductor laser is produced, a nitride type III-V group compound semiconductor layer is grown on a single crystal GaN substrate. At that point, a high defect density region cannot be prevented from being formed in a light emitting region. As a result, light emitting characteristics and reliability of the semiconductor laser deteriorate.

OBJECTS AND SUMMARY OF THE INVENTION

Therefore, in view of the foregoing, it would be desirable to provide a semiconductor light emitting device that has good characteristics such as good light emitting characteristic, good reliability, and long life, to provide a method for producing a structured substrate that allows a semiconductor device that has good characteristics, good reliability, and long life to be easily produced, and to provide such a structured substrate.

In addition, it would be desirable to provide a semiconductor light emitting device that has good characteristics such as a light emitting characteristic, good reliability, and long life and to provide a method for easily producing such a semiconductor light emitting device.

In addition, it would be desirable to provide a semiconductor device that has good characteristics, good reliability, and long life and to provide a method for easily producing such a semiconductor device.

In addition, it would be desirable to provide various types of devices that have good characteristics, good reliabilities, and long lives and to provide a method for easily producing such devices.

The inventor of the present invention intensively studied the foregoing problems and obtained the following result. The obtained result will be described in brief.

The inventor improved the technology disclosed in Japanese Patent Laid-Open Publication No. 2001-102307 and succeeded in controlling the positions of high defect density regions that take place in a low defect density region. In other words, high defect density regions are not gathered while a crystal is being grown. Instead, a seed crystal or the like is artificially, circularly and regularly (for example periodically) formed on a proper substrate such as a GaAs substrate. On the seed crystal, a crystal is grown so as to control the positions of the high defect density regions. As a result, the crystal quality can be improved and a good crystal region can be widened. In this case, by arranging a seed crystal or the like, a pattern of the high defect density regions can be freely changed.

In this case, the seed crystal or the like is for example a polycrystal, an amorphous substance, a single crystal of GaN, a nitride type III-V group compound semiconductor such as AlGaInN other than GaN, or a material other than a nitride type III-V group compound semiconductor. However, as long as the seed crystal or the like is a core that defines the position at which crystal defects gather, the structure of the seed crystal or the like is not restricted.

When a semiconductor light emitting device such as a semiconductor laser, more generally, a semiconductor device is produced using such a substrate, it is necessary to prevent high defect density regions on the substrate from adversely affecting the device. In other words, when a semiconductor layer is grown on a substrate, defects of high defect density regions on a base substrate propagate to the semiconductor layer. Thus, it is necessary to prevent the characteristics of the device and the reliability thereof from deteriorating due to the defects. The inventor evaluated various techniques for solving such a problem and finally found that the following technique is effective.

In other words, on the foregoing substrate, high defect density regions can be regularly arranged. According to the arrangement of the high defect density regions, the position of an active region of the device (for example, a light emitting region of a light emitting device) can be designed. As a result, the active region of the device can be prevented from passing through a high defect density region. Consequently, the device can be prevented from being adversely affected by high defect density regions of the substrate. Thus, the characteristics and reliability of the device can be prevented from deteriorating and lowering due to defects.

The foregoing technique is effective to produce a semiconductor device that uses a semiconductor other than a nitride type III-V group compound semiconductor when it is difficult to obtain a substrate whose material is the same as a semiconductor used for the device and that has a low defect density.

The inventor of the present invention studied the obtained results and finally devised the present invention.

To solve the foregoing problem, a first aspect of the present invention is a method for producing a structured substrate, comprising the step of:

using a nitride type III-V group compound semiconductor substrate on which a plurality of second regions made of a crystal having a second average dislocation density are regularly arranged in a first region made of a crystal having a first average dislocation density so as to produce the structured substrate, the second average dislocation density being greater than the first average dislocation density, wherein the structured substrate has a structure that does not pass through any one of the second regions.

The structured substrate includes one type of which a structure is directly formed on a bulk nitride type III-V group compound semiconductor substrate and another type of which a nitride type III-V group compound semiconductor layer is grown on a bulk nitride type III-V group compound semiconductor substrate so as to form a structure on the nitride type III-V group compound semiconductor layer.

The position and orientation of the structure of the structured substrate are designated so that it does not pass through any one of the second regions. Typically, the plurality of second regions are periodically arranged. In reality, the second regions are formed in a hexagonal lattice shape, a rectangular lattice shape, or a square lattice shape. In addition, two or more types of patterns of the second regions may coexist. Moreover, a portion of which the second regions are periodically arranged and a portion of which the second regions are arranged regularly but not periodically may coexist.

Typically, the structure of the structured substrate and the plurality of second regions are periodically arranged. When the relation of $w_2=n \times w_1$ or $w_1=n \times w_2$ is satisfied depending on the values of $w_1$ and $w_2$, where $w_1$ represents the period of the structure of the structured substrate, $w_2$ represents the period of the plurality of second regions, and n represents any natural number, the structure of the structured substrate does not pass through the second regions on all the surface of the structured substrate.

When a semiconductor device is formed on the structured substrate, the structure of the structured substrate is an active region of the semiconductor device. The semiconductor device includes a light emitting device such as a light emitting diode, a semiconductor laser, or the like, a photo detector, a field effect transistor (FET) such as a high electron mobility transistor, and an electron traveling device such as a hetero junction bipolar transistor (HBT) (this definition applies to the description that follows). The active region represents a light emitting region of a semiconductor light emitting device, a light receiving region of a semiconductor photo detector, and an electron traveling region of an electron traveling device (this definition applies to the description that follows). When the mask pattern that is selectively grown in the lateral direction is formed on the substrate, the structure of the structured substrate represents a portion that is not coated by the mask pattern.

The interval of two adjacent second regions or the arrangement period of the second regions is selected in accordance with the size of the device and so forth. Generally, the interval or arrangement period is 20 µm or greater, 50 µm or greater, or 100 µm or greater. The upper limit of the interval or arrangement period of the second regions is not clearly defined. However, generally, the interval or arrangement period of the second regions is around 1000 µm. The second regions typically pierce a nitride type III-V group compound semiconductor substrate. The second regions are typically formed in an irregular polygonal prism shape although they depend on the shapes of seed crystals. Third regions as transitional regions may be disposed between the first region and the second regions, the third regions having a third average dislocation density that is greater than the first average dislocation density and lower than the second average dislocation density. In this case, most preferably, the structure of the structured substrate is formed so that the structure does not pass through any one of the second regions and the third regions.

The diameter of each of the second regions is typically 10 µm or greater and 100 µm or smaller. The diameter of each of the second regions is more typically 20 µm or greater and 50 µm or smaller. When the third regions are disposed, the diameter of each of the third regions is typically greater than the diameter of each of the second regions by 20 µm or greater and 200 µm or smaller. The diameter of each of the third regions is more typically greater than the diameter of each of the second regions by 40 µm or greater and 160 µm or smaller. The diameter of each of the third regions is most typically greater than the diameter of each of the second regions by 60 µm or greater and 140 µm or smaller.

The average dislocation density of each of the second regions is generally five times greater than the average dislocation density of the first region. The average dislocation density of the first region is typically $2 \times 10^6$ cm$^{-2}$ or smaller and the average dislocation density of each of the second regions is typically $1 \times 10^8$ cm$^{-2}$ or greater. When the third regions are disposed, the average dislocation density of each of the third regions is typically $1 \times 10^8$ cm$^{-2}$ or smaller and $2 \times 10^6$ cm$^{-2}$ or greater.

To prevent the second regions that have a high average dislocation density from adversely affecting an active region of for example a semiconductor device of the structured substrate, the active region is spaced apart from any one of the second regions by 1 µm or greater, preferably 10 µm or greater, more preferably 100 µm or greater. When there are third regions, most preferably an active region of for example a semiconductor device of the structured substrate does not pass through any one of the second regions and the third regions. More practically, when the structured substrate is used for a semiconductor laser, a region in which a drive current flows through a stripe shaped electrode is preferably spaced apart from any one of the second regions by 1 µm or greater, more preferably by 10 µm or greater, further more preferably by 100 µm or greater. When there are third regions, most preferably, a region in which the drive current flows through a stripe shaped electrode does not pass through any one of the second regions and the third regions. The number of stripe shaped electrodes, namely the number of laser stripes, may be one or plurality. The width of the stripe shaped electrode can be selected as required.

When necessary, a plurality of portions that are different from other portions in the interval of the second regions and/or the arrangement thereof as alignment marks may be formed. In this case, these alignment marks can be used to align a mask.

The nitride type III-V group compound semiconductor substrate or the nitride type III-V group compound semiconductor layer is most generally made of $Al_xB_yGa_{1-x-y-z}In_zAs_uN_{1-u-v}P_v$ (where $0 \leq x \leq 1$, $0 \leq y \leq 1$, $0 \leq z \leq 1$, $0 \leq u \leq 1$, $0 \leq v \leq 1$, $0 \leq x+y+z < 1$, $0 \leq u+v < 1$). The nitride type III-V group compound semiconductor substrate or the nitride type III-V group compound semiconductor layer is more practically made of $Al_xB_yGa_{1-x-y-z}In_zN$ (where $0 \leq x \leq 1$, $0 \leq y \leq 1$, $0 \leq z \leq 1$, $0 \leq x+y+z < 1$). The nitride type III-V group compound semiconductor substrate or the nitride type III-V group compound semiconductor layer is typically made of $Al_xGa_{1-x-z}In_zN$ (where $0 \leq x \leq 1$, $0 \leq z \leq 1$). The nitride type III-V group compound semiconductor substrate is most typically made of GaN.

The description for the first aspect of the present invention applies to the other aspects unless that is contrary to characteristics of the other aspects.

A second aspect of the present invention is a structured substrate comprising a nitride type III-V group compound semiconductor substrate on which a plurality of second regions made of a crystal having a second average dislocation density are regularly arranged in a first region made of a crystal having a first average dislocation density, the second average dislocation density being greater than the first average dislocation density, wherein the structured substrate has a structure that does not pass through any one of the second regions.

A third aspect of the present invention is a method for producing a structured substrate, comprising the step of:

using a nitride type III-V group compound semiconductor substrate on which a plurality of second regions made of a crystal having a second average defect density are regularly arranged in a first region made of a crystal having a first average defect density so as to produce the structured substrate, the second average defect density being greater than the first average defect density, wherein the structured substrate has a structure that does not pass through any one of the second regions.

A fourth aspect of the present invention is a structured substrate comprising a nitride type III-V group compound semiconductor substrate on which a plurality of second regions made of a crystal having a second average defect density are regularly arranged in a first region made of a crystal having a first average defect density, the second average defect density being greater than the first average defect density, wherein the structured substrate has a structure that does not pass through any one of the second regions.

According to the third aspect and fourth aspect of the present invention, the "average defect density" represents an average density of all lattice defects that adversely affect characteristics and reliability of a device. The defects include all types of defects such as dislocation, stacking defect, and point defect (this definition applies to the description that follows).

A fifth aspect of the present invention is a method for producing a structured substrate, comprising the step of:

using a nitride type III-V group compound semiconductor substrate on which a plurality of second regions made of a crystal are regularly arranged in a first region made of a crystal so as to produce the structured substrate, the crystallinity of the second regions being worse than the crystallinity of the first region, wherein the structured substrate has a structure that does not pass through any one of the second regions.

A sixth aspect of the present invention is a structured substrate comprising a nitride type III-V group compound semiconductor substrate on which a plurality of second regions made of a crystal are regularly arranged in a first region made of a crystal, the crystallinity of the second regions being worse than the crystallinity of the first region, wherein the structured substrate has a structure that does not pass through any one of the second regions.

According to the fifth aspect and sixth aspect of the present invention, the first region made of a crystal is a single crystal. The second regions whose crystallinity is worse than the first region is a single crystal, an amorphous substance, or a mixture of at least two thereof (this definition applied to the description that follows). This corresponds to the case that the average dislocation density or average defect density of the second regions is greater than that of the first region.

A seventh aspect of the present invention is a method for producing a semiconductor light emitting device, comprising the step of:

using a nitride type III-V group compound semiconductor substrate on which a plurality of second regions made of a crystal having a second average dislocation density are regularly arranged in a first region made of a crystal having a first average dislocation density so as to produce the semiconductor light emitting device, the second average dislocation density being greater than the first average dislocation density, wherein the semiconductor light emitting device has a light emitting region that does not pass through any one of the second regions.

An eighth aspect of the present invention is a semiconductor light emitting device comprising a nitride type III-V group compound semiconductor substrate on which a plurality of second regions made of a crystal having a second average dislocation density are regularly arranged in a first region made of a crystal having a first average dislocation density, the second average dislocation density being greater than the first average dislocation density, wherein the semiconductor light emitting device has a light emitting region that does not pass through any one of the second regions.

A ninth aspect of the present invention is a method for producing a semiconductor light emitting device, comprising the step of:

using a nitride type III-V group compound semiconductor substrate on which a plurality of second regions made of a crystal having a second average defect density are regularly arranged in a first region made of a crystal having a first average defect density so as to produce the semiconductor light emitting device, the second average defect density being greater than the first average defect density, wherein the semiconductor light emitting device has a light emitting region that does not pass through any one of the second regions.

A tenth aspect of the present invention is a semiconductor light emitting device comprising a nitride type III-V group compound semiconductor substrate on which a plurality of second regions made of a crystal having a second average defect density are regularly arranged in a first region made of a crystal having a first average defect density, the second average defect density being greater than the first average defect density, wherein the semiconductor light emitting device has a light emitting region that does not pass through any one of the second regions.

An eleventh aspect of the present invention is a method for producing a semiconductor light emitting device, comprising the step of:

using a nitride type III-V group compound semiconductor substrate on which a plurality of second regions made of a crystal are regularly arranged in a first region made of a crystal so as to produce the semiconductor light emitting device, the crystallinity of the second regions being worse than the crystallinity of the first region, wherein the semiconductor light emitting device has a light emitting region that does not pass through any one of the second regions.

A twelfth aspect of the present invention is a semiconductor light emitting device comprising a nitride type III-V group compound semiconductor substrate on which a plurality of second regions made of a crystal are regularly arranged in a first region made of a crystal, the crystallinity of the second regions being worse than the crystallinity of the first region, wherein the semiconductor light emitting device has a light emitting region that does not pass through any one of the second regions.

A thirteenth aspect of the present invention is a method for producing a semiconductor device, comprising the step of:

using a nitride type III-V group compound semiconductor substrate on which a plurality of second regions made of a crystal having a second average dislocation density are regularly arranged in a first region made of a crystal having a first average dislocation density so as to produce the semiconductor device, the second average dislocation density being greater than the first average dislocation density, wherein the semiconductor device has an active region that does not pass through any one of the second regions.

A fourteenth aspect of the present invention is a semiconductor device comprising a nitride type III-V group compound semiconductor substrate on which a plurality of second regions made of a crystal having a second average dislocation density are regularly arranged in a first region made of a crystal having a first average dislocation density, the second average dislocation density being greater than the first average dislocation density, wherein the semiconductor device has an active region that does not pass through any one of the second regions.

A fifteenth aspect of the present invention is a method for producing a semiconductor device, comprising the step of:

using a nitride type III-V group compound semiconductor substrate on which a plurality of second regions made of a crystal having a second average defect density are regularly arranged in a first region made of a crystal having a first average defect density so as to produce the semiconductor device, the second average defect density being greater than the first average defect density, wherein the semiconductor device has an active region that does not pass through any one of the second regions.

A sixteenth aspect of the present invention is a semiconductor device comprising a nitride type III-V group compound semiconductor substrate on which a plurality of second regions made of a crystal having a second average defect density are regularly arranged in a first region made of a crystal having a first average defect density, the second average defect density being greater than the first average defect density, wherein the semiconductor device has an active region that does not pass through any one of the second regions.

A seventeenth aspect of the present invention is a method for producing a semiconductor device, comprising the step of:

using a nitride type III-V group compound semiconductor substrate on which a plurality of second regions made of a crystal are regularly arranged in a first region made of a crystal so as to produce the semiconductor device, the crystallinity of the second regions being worse than the crystallinity of the first region, wherein the semiconductor device has an active region that does not pass through any one of the second regions.

An eighteenth aspect of the present invention is a semiconductor device comprising a nitride type III-V group compound semiconductor substrate on which a plurality of second regions made of a crystal are regularly arranged in a first region made of a crystal, the crystallinity of the second regions being worse than the crystallinity of the first region, wherein the semiconductor device has an active region that does not pass through any one of the second regions.

A nineteenth aspect of the present invention is a method for producing a structured substrate, comprising the step of:

using a semiconductor substrate on which a plurality of second regions made of a crystal having a second average dislocation density are regularly arranged in a first region made of a crystal having a first average dislocation density so as to produce the structured substrate, the second average dislocation density being greater than the first average dislocation density, wherein the structured substrate has a structure that does not pass through any one of the second regions.

A twentieth aspect of the present invention is a structured substrate comprising a semiconductor substrate on which a plurality of second regions made of a crystal having a second average dislocation density are regularly arranged in a first region made of a crystal having a first average dislocation density, the second average dislocation density being greater than the first average dislocation density, wherein the structured substrate has a structure that does not pass through any one of the second regions.

A twenty first aspect of the present invention is a method for producing a structured substrate, comprising the step of:

using a semiconductor substrate on which a plurality of second regions made of a crystal having a second average defect density are regularly arranged in a first region made of a crystal having a first average defect density so as to produce the structured substrate, the second average defect density being greater than the first average defect density, wherein the structured substrate has a structure that does not pass through any one of the second regions.

A twenty second aspect of the present invention is a structured substrate comprising a semiconductor substrate on which a plurality of second regions made of a crystal having a second average defect density are regularly arranged in a first region made of a crystal having a first average defect density, the second average defect density being greater than the first average defect density, wherein the structured substrate has a structure that does not pass through any one of the second regions.

A twenty third aspect of the present invention is a method for producing a structured substrate, comprising the step of:

using a semiconductor substrate on which a plurality of second regions made of a crystal are regularly arranged in a first region made of a crystal so as to produce the structured substrate, the crystallinity of the second regions being worse than the crystallinity of the first region, wherein the structured substrate has a structure that does not pass through any one of the second regions.

A twenty fourth aspect of the present invention is a structured substrate comprising a semiconductor substrate on which a plurality of second regions made of a crystal are regularly arranged in a first region made of a crystal, the crystallinity of the second regions being worse than the crystallinity of the first region, wherein the structured substrate has a structure that does not pass through any one of the second regions.

A twenty fifth aspect of the present invention is a method for producing a semiconductor light emitting device, comprising the step of:

using a semiconductor substrate on which a plurality of second regions made of a crystal having a second average dislocation density are regularly arranged in a first region made of a crystal having a first average dislocation density so as to produce the semiconductor light emitting device, the second average dislocation density being greater than the first average dislocation density, wherein the semiconductor light emitting device has a light emitting region that does not pass through any one of the second regions.

A twenty sixth aspect of the present invention is a semiconductor light emitting device comprising a semiconductor substrate on which a plurality of second regions made of a crystal having a second average dislocation density are regularly arranged in a first region made of a crystal having a first average dislocation density, the second average dislocation density being greater than the first average dislocation density, wherein the semiconductor light emitting device has a light emitting region that does not pass through any one of the second regions.

A twenty seventh aspect of the present invention is a method for producing a semiconductor light emitting device, comprising the step of:

using a semiconductor substrate on which a plurality of second regions made of a crystal having a second average defect density are regularly arranged in a first region made of a crystal having a first average defect density so as to produce the semiconductor light emitting device, the second average defect density being greater than the first average defect density, wherein the semiconductor light emitting device has a light emitting region that does not pass through any one of the second regions.

A twenty eighth aspect of the present invention is a semiconductor light emitting device comprising a semiconductor substrate on which a plurality of second regions made of a crystal having a second average defect density are regularly arranged in a first region made of a crystal having a first average defect density, the second average defect density being greater than the first average defect density, wherein the semiconductor light emitting device has a light emitting region that does not pass through any one of the second regions.

A twenty ninth aspect of the present invention is a method for producing a semiconductor light emitting device, comprising the step of:

using a semiconductor substrate on which a plurality of second regions made of a crystal are regularly arranged in a first region made of a crystal so as to produce the semiconductor light emitting device, the crystallinity of the second regions being worse than the crystallinity of the first region, wherein the semiconductor light emitting device has a light emitting region that does not pass through any one of the second regions.

A thirtieth aspect of the present invention is a semiconductor light emitting device comprising a semiconductor substrate on which a plurality of second regions made of a crystal are regularly arranged in a first region made of a crystal, the crystallinity of the second regions being worse than the crystallinity of the first region, wherein the semiconductor light emitting device has a light emitting region that does not pass through any one of the second regions.

A thirty first aspect of the present invention is a method for producing a semiconductor device, comprising the step of:

using a semiconductor substrate on which a plurality of second regions made of a crystal having a second average dislocation density are regularly arranged in a first region made of a crystal having a first average dislocation density so as to produce the semiconductor device, the second average dislocation density being greater than the first average dislocation density, wherein the semiconductor device has an active region that does not pass through any one of the second regions.

A thirty second aspect of the present invention is a semiconductor device comprising a semiconductor substrate on which a plurality of second regions made of a crystal having a second average dislocation density are regularly arranged in a first region made of a crystal having a first average dislocation density, the second average dislocation density being greater than the first average dislocation density, wherein the semiconductor device has an active region that does not pass through any one of the second regions.

A thirty third aspect of the present invention is a method for producing a semiconductor device, comprising the step of:

using a semiconductor substrate on which a plurality of second regions made of a crystal having a second average defect density are regularly arranged in a first region made of a crystal having a first average defect density so as to produce the semiconductor device, the second average defect density being greater than the first average defect density, wherein the semiconductor device has an active region that does not pass through any one of the second regions.

A thirty fourth aspect of the present invention is a semiconductor device comprising a semiconductor substrate on which a plurality of second regions made of a crystal having a second average defect density are regularly arranged in a first region made of a crystal having a first average defect density, the second average defect density being greater than the first average defect density, wherein the semiconductor device has an active region that does not pass through any one of the second regions.

A thirty fifth aspect of the present invention is a method for producing a semiconductor device, comprising the step of:

using a semiconductor substrate on which a plurality of second regions made of a crystal are regularly arranged in a first region made of a crystal so as to produce the semiconductor device, the crystallinity of the second regions being worse than the crystallinity of the first region, wherein the semiconductor device has an active region that does not pass through any one of the second regions.

A thirty sixth aspect of the present invention is a semiconductor device comprising a semiconductor substrate on which a plurality of second regions made of a crystal are regularly arranged in a first region made of a crystal, the crystallinity of the second regions being worse than the crystallinity of the first region, wherein the semiconductor device has an active region that does not pass through any one of the second regions.

According to the nineteenth aspect to thirty sixth aspect of the present invention, the material of the semiconductor substrate or the semiconductor layer is a nitride type III-V group compound semiconductor, another semiconductor having a wurtzit structure, more generally a hexagonal crystal structure for example ZnO, $\alpha$-ZnS, $\alpha$-CdS, or $\alpha$-CdSe, or various types of semiconductors having other crystal structures.

A thirty seventh aspect of the present invention is a method for producing a structured substrate, comprising the step of:

using a substrate on which a plurality of second regions made of a crystal having a second average dislocation density are regularly arranged in a first region made of a crystal having a first average dislocation density so as to produce the structured substrate, the second average dislocation density being greater than the first average dislocation density, wherein the structured substrate has a structure that does not pass through any one of the second regions.

A thirty eighth aspect of the present invention is a structured substrate comprising a substrate on which a plurality of second regions made of a crystal having a second average dislocation density are regularly arranged in a first region made of a crystal having a first average dislocation density, the second average dislocation density being greater than the first average dislocation density, wherein the structured substrate has a structure that does not pass through any one of the second regions.

A thirty ninth aspect of the present invention is a method for producing a structured substrate, comprising the step of:

using a substrate on which a plurality of second regions made of a crystal having a second average defect density are regularly arranged in a first region made of a crystal having a first average defect density so as to produce the structured substrate, the second average defect density being greater than the first average defect density, wherein the structured substrate has a structure that does not pass through any one of the second regions.

A fortieth aspect of the present invention is a structured substrate comprising a substrate on which a plurality of second regions made of a crystal having a second average defect density are regularly arranged in a first region made of a crystal having a first average defect density, the second average defect density being greater than the first average defect density, wherein the structured substrate has a structure that does not pass through any one of the second regions.

A forty first aspect of the present invention is a method for producing a structured substrate, comprising the step of:

using a substrate on which a plurality of second regions made of a crystal are regularly arranged in a first region made of a crystal so as to produce the structured substrate, the crystallinity of the second regions being worse than the crystallinity of the first region, wherein the structured substrate has a structure that does not pass through any one of the second regions.

A forty second aspect of the present invention is a structured substrate comprising a substrate on which a plurality of second regions made of a crystal are regularly arranged in a first region made of a crystal, the crystallinity of the second regions being worse than the crystallinity of the first region, wherein the structured substrate has a structure that does not pass through any one of the second regions.

A forty third aspect of the present invention is a method for producing a device, comprising the step of:

using a substrate on which a plurality of second regions made of a crystal having a second average dislocation density are regularly arranged in a first region made of a crystal having a first average dislocation density so as to produce the device, the second average dislocation density being greater than the first average dislocation density, wherein the device has an active region that does not pass through any one of the second regions.

A forty fourth aspect of the present invention is a device comprising a substrate on which a plurality of second regions made of a crystal having a second average dislocation density are regularly arranged in a first region made of a crystal having a first average dislocation density, the second average dislocation density being greater than the first average dislocation density, wherein the device has an active region that does not pass through any one of the second regions.

A forty fifth aspect of the present invention is a method for producing a device, comprising the step of:

using a substrate on which a plurality of second regions made of a crystal having a second average defect density are regularly arranged in a first region made of a crystal having a first average defect density so as to produce the device, the second average defect density being greater than the first average defect density, wherein the device has an active region that does not pass through any one of the second regions.

A forty sixth aspect of the present invention is a device comprising a substrate on which a plurality of second regions made of a crystal having a second average defect density are regularly arranged in a first region made of a crystal having a first average defect density, the second average defect density being greater than the first average defect density, wherein the device has an active region that does not pass through any one of the second regions.

A forty seventh aspect of the present invention is a method for producing a device, comprising the step of:

using a substrate on which a plurality of second regions made of a crystal are regularly arranged in a first region made of a crystal so as to produce the device, the crystallinity of the second regions being worse than the crystallinity of the first region, wherein the device has an active region that does not pass through any one of the second regions.

A forty eighth aspect of the present invention is a device comprising a substrate on which a plurality of second regions made of a crystal are regularly arranged in a first region made of a crystal, the crystallinity of the second regions being worse than the crystallinity of the first region, wherein the device has an active region that does not pass through any one of the second regions.

According to the forty third aspect to forty eighth aspect of the present invention, the device is a semiconductor device (for example, a light emitting device, a photo detector, or an electron traveling device), a piezoelectric device, an electricity collecting device, an optical device (for example, a secondary higher harmonic wave generating device), a dielectric device (including a ferrodielectric device), a superconductive device, or the like. In this case, as the material of the substrate or layer, the foregoing various types of semiconductors can be used. As the material of a piezoelectric device, an electricity collecting device, an optical device, a dielectric device, or a superconductive device, various types of materials (for example, an oxide) can be used. As the material of the oxide, many types of materials for example disclosed in Journal of the Society of Japan, Vol. 103, No. 11 (1995), pp. 1099-1111 and Materials Science and Engineering, B41 (1996) pp. 166-173 can be used.

A forty ninth aspect of the present invention is a method for producing a structured substrate, comprising the step of:

using a nitride type III-V group compound semiconductor substrate on which a plurality of second regions made of a crystal having a second average dislocation density are regularly arranged in a first region made of a crystal having a first average dislocation density so as to produce a structured substrate, the second average dislocation density being greater than the first average dislocation density, the second regions being arranged at a first interval in a first direction and at a second interval in a second direction perpendicular to the first direction, the second interval being smaller than the first interval, wherein the structured substrate has a structure that does not pass through-any one of the second regions.

A fiftieth aspect of the present invention is a structured substrate comprising a nitride type III-V group compound semiconductor substrate on which a plurality of second regions made of a crystal having a second average dislocation density are regularly arranged in a first region made of a crystal having a first average dislocation density, the second average dislocation density being greater than the first average dislocation density, the second regions being arranged at a first interval in a first direction and at a second interval in a second direction perpendicular to the first direction, the second interval being smaller than the first interval, wherein the structured substrate has a structure that does not pass through any one of the second regions.

A fifty first aspect of the present invention is a method for producing a structured substrate, comprising the step of:

using a nitride type III-V group compound semiconductor substrate on which a plurality of second regions made of a crystal having a second average defect density are regularly arranged in a first region made of a crystal having a first average defect density so as to produce a structured substrate, the second average defect density being greater than the first average defect density, the second regions being arranged at a first interval in a first direction and at a second interval in a second direction perpendicular to the first direction, the second interval being smaller than the first interval, wherein the structured substrate has a structure that does not pass through any one of the second regions.

A fifty second aspect of the present invention is a structured substrate comprising a nitride type III-V group compound semiconductor substrate on which a plurality of second regions made of a crystal having a second average defect density are regularly arranged in a first region made of a crystal having a first average defect density, the second average defect density being greater than the first average defect density, the second regions being arranged at a first interval in a first direction and at a second interval in a second direction perpendicular to the first direction, the second interval being smaller than the first interval, wherein the structured substrate has a structure that does not pass through any one of the second regions.

A fifty third aspect of the present invention is a method for producing a structured substrate, comprising the step of:

using a nitride type III-V group compound semiconductor substrate on which a plurality of second regions made of a crystal are regularly arranged in a first region made of a crystal so as to produce a structured substrate, the crystallinity of the second regions being worse than the crystallinity of the first region, the second regions being arranged at a first interval in a first direction and at a second interval in a second direction perpendicular to the first direction, the second interval being smaller than the first interval, wherein the structured substrate has a structure that does not pass through any one of the second regions.

A fifty fourth aspect of the present invention is a structured substrate comprising a nitride type III-V group compound semiconductor substrate on which a plurality of second regions made of a crystal are regularly arranged in a first region made of a crystal, the crystallinity of the second regions being worse than the crystallinity of the first region, the second regions being arranged at a first interval in a first direction and at a second interval in a second direction perpendicular to the first direction, the second interval being smaller than the first interval, wherein the structured substrate has a structure that does not pass through any one of the second regions.

A fifty fifth aspect of the present invention is a method for producing a structured substrate, comprising the step of:

using a nitride type III-V group compound semiconductor substrate on which a plurality of second regions that linearly extend and that are made of a crystal having a second average dislocation density are regularly arranged in parallel in a first region made of a crystal having a first average dislocation density so as to produce a structured substrate, the second average dislocation density being greater than the first average dislocation density, wherein the structured substrate has a structure that does not pass through any one of the second regions.

A fifty sixth aspect of the present invention is a structured substrate comprising a nitride type III-V group compound semiconductor substrate on which a plurality of second regions that linearly extend and that are made of a crystal having a second average dislocation density are regularly arranged in parallel in a first region made of a crystal having a first average dislocation density, the second average dislocation density being greater than the first average dislocation density, wherein the structured substrate has a structure that does not pass through any one of the second regions.

A fifty seventh aspect of the present invention is a method for producing a structured substrate, comprising the step of:

using a nitride type III-V group compound semiconductor substrate on which a plurality of second regions that linearly extend and that are made of a crystal having a second average defect density are regularly arranged in parallel in a first region made of a crystal having a first average defect density so as to produce a structured substrate, the second average defect density being greater than the first average defect density, wherein the structured substrate has a structure that does not pass through any one of the second regions.

A fifty eighth aspect of the present invention is a structured substrate comprising a nitride type III-V group compound semiconductor substrate on which a plurality of second regions that linearly extend and that are made of a crystal having a second average defect density are regularly arranged in parallel in a first region made of a crystal having a first average defect density, the second average defect density being greater than the first average defect density, wherein the structured substrate has a structure that does not pass through any one of the second regions.

A fifty ninth aspect of the present invention is a method for producing a structured substrate, comprising the step of:

using a nitride type III-V group compound semiconductor substrate on which a plurality of second regions that linearly extend and that are made of a crystal are regularly arranged in parallel in a first region made of a crystal so as to produce a structured substrate, the crystallinity of the second regions being worse than the crystallinity of the first region, wherein the structured substrate has a structure that does not pass through any one of the second regions.

A sixtieth aspect of the present invention is a structured substrate comprising a nitride type III-V group compound semiconductor substrate on which a plurality of second regions that linearly extend and that are made of a crystal are regularly arranged in parallel in a first region made of a crystal, the crystallinity of the second regions being worse than the crystallinity of the first region, wherein the structured substrate has a structure that does not pass through any one of the second regions.

A sixty first aspect of the present invention is a method for producing a semiconductor light emitting device, comprising the step of:

using a nitride type III-V group compound semiconductor substrate on which a plurality of second regions made of a crystal having a second average dislocation density are regularly arranged in a first region made of a crystal having a first average dislocation density so as to produce a semiconductor light emitting device, the second average dislocation density being greater than the first average dislocation density, the second regions being arranged at a first interval in a first direction and at a second interval in a second direction perpendicular to the first direction, the second interval being smaller than the first interval, wherein the semiconductor light emitting device has a light emitting region that does not pass through any one of the second regions.

A sixty second aspect of the present invention is a semiconductor light emitting device comprising a nitride type III-V group compound semiconductor substrate on which a plurality of second regions made of a crystal having a second average dislocation density are regularly arranged in a first region made of a crystal having a first average dislocation density, the second average dislocation density being greater than the first average dislocation density, the second regions being arranged at a first interval in a first direction and at a second interval in a second direction perpendicular to the first direction, the second interval being smaller than the first interval, wherein the semiconductor light emitting device has a light emitting region that does not pass through any one of the second regions.

A sixty third aspect of the present invention is a method for producing a semiconductor light emitting device, comprising the step of:

using a nitride type III-V group compound semiconductor substrate on which a plurality of second regions made of a crystal having a second average defect density are regularly arranged in a first region made of a crystal having a first average defect density so as to produce a semiconductor light emitting device, the second average defect density being greater than the first average defect density, the second regions being arranged at a first interval in a first direction and at a second interval in a second direction perpendicular to the first direction, the second interval being smaller than the first interval, wherein the semiconductor light emitting device has a light emitting region that does not pass through any one of the second regions.

A sixty fourth aspect of the present invention is a semiconductor light emitting device comprising a nitride type III-V group compound semiconductor substrate on which a plurality of second regions made of a crystal having a second average defect density are regularly arranged in a first region made of a crystal having a first average defect density, the second average defect density being greater than the first average defect density, the second regions being arranged at a first interval in a first direction and at a second interval in a second direction perpendicular to the first direction, the second interval being smaller than the first interval, wherein the semiconductor light emitting device has a light emitting region that does not pass through any one of the second regions.

A sixty fifth aspect of the present invention is a method for producing a semiconductor light emitting device, comprising the step of:

using a nitride type III-V group compound semiconductor substrate on which a plurality of second regions made of a crystal are regularly arranged in a first region made of a crystal so as to produce a semiconductor light emitting device, the crystallinity of the second regions being worse than the crystallinity of the first region, the second regions being arranged at a first interval in a first direction and at a second interval in a second direction perpendicular to the first direction, the second interval being smaller than the first interval, wherein the semiconductor light emitting device has a light emitting region that does not pass through any one of the second regions.

A sixty sixth aspect of the present invention is a semiconductor light emitting device comprising a nitride type III-V group compound semiconductor substrate on which a plurality of second regions made of a crystal are regularly arranged in a first region made of a crystal, the crystallinity of the second regions being worse than the crystallinity of the first region, the second regions being arranged at a first interval in a first direction and at a second interval in a second direction perpendicular to the first direction, the second interval being smaller than the first interval, wherein the semiconductor light emitting device has a light emitting region that does not pass through any one of the second regions.

A sixty seventh aspect of the present invention is a method for producing a semiconductor light emitting device, comprising the step of:

using a nitride type III-V group compound semiconductor substrate on which a plurality of second regions that linearly extend and that are made of a crystal having a second average dislocation density are regularly arranged in parallel in a first region made of a crystal having a first average dislocation density so as to produce a semiconductor light emitting device, the second average dislocation density being greater than the first average dislocation density, wherein the semiconductor light emitting device has a light emitting region that does not pass through any one of the second regions.

A sixty eighth aspect of the present invention is a semiconductor light emitting device comprising a nitride type III-V group compound semiconductor substrate on which a plurality of second regions that linearly extend and that are made of a crystal having a second average dislocation density are regularly arranged in parallel in a first region made of a crystal having a first average dislocation density, the second average dislocation density being greater than the first average dislocation density, wherein the semiconductor light emitting device has a light emitting region that does not pass through any one of the second regions.

A sixty ninth aspect of the present invention is a method for producing a semiconductor light emitting device, comprising the step of:

using a nitride type III-V group compound semiconductor substrate on which a plurality of second regions that linearly extend and that are made of a crystal having a second average defect density are regularly arranged in parallel in a first region made of a crystal having a first average defect density so as to produce a semiconductor light emitting device, the second average defect density being greater than the first average defect density, wherein the semiconductor light emitting device has a light emitting region that does not pass through any one of the second regions.

A seventieth aspect of the present invention is a semiconductor light emitting device comprising a nitride type III-V group compound semiconductor substrate on which a plurality of second regions that linearly extend and that are made of a crystal having a second average defect density are regularly arranged in parallel in a first region made of a crystal having a first average defect density, the second average defect density being greater than the first average defect density, wherein the semiconductor light emitting device has a light emitting region that does not pass through any one of the second regions.

A seventy first aspect of the present invention is a method for producing a semiconductor light emitting device, comprising the step of:

using a nitride type III-V group compound semiconductor substrate on which a plurality of second regions that linearly extend and that are made of a crystal are regularly arranged in parallel in a first region made of a crystal so as to produce a semiconductor light emitting device, the crystallinity of the second regions being worse than the crystallinity of the first region, wherein the semiconductor light emitting device has a light emitting region that does not pass through any one of the second regions.

A seventy second aspect of the present invention is a semiconductor light emitting device comprising a nitride type III-V group compound semiconductor substrate on which a plurality of second regions that linearly extend and that are made of a crystal are regularly arranged in parallel in a first region made of a crystal, the crystallinity of the second regions being worse than the crystallinity of the first region, wherein the semiconductor light emitting device has a light emitting region that does not pass through any one of the second regions.

A seventy third aspect of the present invention is a method for producing a semiconductor device, comprising the step of:

using a nitride type III-V group compound semiconductor substrate on which a plurality of second regions made of a crystal having a second average dislocation density are regularly arranged in a first region made of a crystal having a first average dislocation density so as to produce a semiconductor device, the second average dislocation density being greater than the first average dislocation density, the second regions being arranged at a first interval in a first direction and at a second interval in a second direction perpendicular to the first direction, the second interval being smaller than the first interval, wherein the semiconductor device has an active region that does not pass through any one of the second regions.

A seventy fourth aspect of the present invention is a semiconductor device comprising a nitride type III-V group compound semiconductor substrate on which a plurality of second regions made of a crystal having a second average dislocation density are regularly arranged in a first region made of a crystal having a first average dislocation density, the second average dislocation density being greater than the first average dislocation density, the second regions being arranged at a first interval in a first direction and at a second interval in a second direction perpendicular to the first direction, the second interval being smaller than the first interval, wherein the semiconductor device has an active region that does not pass through any one of the second regions.

A seventy fifth aspect of the present invention is a method for producing a semiconductor device, comprising the step of:

using a nitride type III-V group compound semiconductor substrate on which a plurality of second regions made of a crystal having a second average defect density are regularly arranged in a first region made of a crystal having a first average defect density so as to produce a semiconductor device, the second average defect density being greater than the first average defect density, the second regions being arranged at a first interval in a first direction and at a second interval in a second direction perpendicular to the first direction, the second interval being smaller than the first interval, wherein the semiconductor device has an active region that does not pass through any one of the second regions.

A seventy sixth aspect of the present invention is a semiconductor device comprising a nitride type III-V group compound semiconductor substrate on which a plurality of second regions made of a crystal having a second average defect density are, regularly arranged in a first region made of a crystal having a first average defect density, the second average defect density being greater than the first average defect density, the second regions being arranged at a first interval in a first direction and at a second interval in a second direction perpendicular to the first direction, the second interval being smaller than the first interval, wherein the semiconductor device has an active region that does not pass through any one of the second regions.

A seventy seventh aspect of the present invention is a method for producing a semiconductor device, comprising the step of:

using a nitride type III-V group compound semiconductor substrate on which a plurality of second regions made of a crystal are regularly arranged in a first region made of a crystal so as to produce a semiconductor device, the crystallinity of the second regions being worse than the crystallinity of the first region, the second regions being arranged at a first interval in a first direction and at a second interval in a second direction perpendicular to the first direction, the second interval being smaller than the first interval, wherein the semiconductor device has an active region that does not pass through any one of the second regions.

A seventy eighth aspect of the present invention is a semiconductor device comprising a nitride type III-V group compound semiconductor substrate on which a plurality of second regions made of a crystal are regularly arranged in a first region made of a crystal, the crystallinity of the second regions being worse than the crystallinity of the first region, the second regions being arranged at a first interval in a first direction and at a second interval in a second direction perpendicular to the first direction, the second interval being smaller than the first interval, wherein the semiconductor device has an active region that does not pass through any one of the second regions.

A seventy ninth aspect of the present invention is a method for producing a semiconductor device, comprising the step of:

using a nitride type III-V group compound semiconductor substrate on which a plurality of second regions that linearly extend and that are made of a crystal having a second average dislocation density are regularly arranged in parallel in a first region made of a crystal having a first average dislocation density so as to produce a semiconductor device, the second average dislocation density being greater than the first average dislocation density, wherein the semiconductor device has an active region that does not pass through any one of the second regions.

An eightieth aspect of the present invention is a semiconductor device comprising a nitride type III-V group compound semiconductor substrate on which a plurality of second regions that linearly extend and that are made of a crystal having a second average dislocation density are regularly arranged in parallel in a first region made of a crystal having a first average dislocation density, the second average dislocation density being greater than the first average dislocation density, wherein the semiconductor device has an active region that does not pass through any one of the second regions.

An eighty first aspect of the present invention is a method for producing a semiconductor device, comprising the step of:

using a nitride type III-V group compound semiconductor substrate on which a plurality of second regions that linearly extend and that are made of a crystal having a second average defect density are regularly arranged in parallel in a first region made of a crystal having a first average defect density so as to produce a semiconductor device, the second average defect density being greater than the first average defect density, wherein the semiconductor device has an active region that does not pass through any one of the second regions.

An eighty second aspect of the present invention is a semiconductor device comprising a nitride type III-V group compound semiconductor substrate on which a plurality of second regions that linearly extend and that are made of a crystal having a second average defect density are regularly arranged in parallel in a first region made of a crystal having a first average defect density, the second average defect density being greater than the first average defect density, wherein the semiconductor device has an active region that does not pass through any one of the second regions.

An eighty third aspect of the present invention is a method for producing a semiconductor device, comprising the step of:

using a nitride type III-V group compound semiconductor substrate on which a plurality of second regions that linearly extend and that are made of a crystal are regularly arranged in parallel in a first region made of a crystal so as to produce a semiconductor device, the crystallinity of the second regions being worse than the crystallinity of the first region, wherein the semiconductor device has an active region that does not pass through any one of the second regions.

An eighty fourth aspect of the present invention is a semiconductor device comprising a nitride type III-V group compound semiconductor substrate on which a plurality of second regions that linearly extend and that are made of a crystal are regularly arranged in parallel in a first region made of a crystal, the crystallinity of the second regions being worse than the crystallinity of the first region, wherein the semiconductor device has an active region that does not pass through any one of the second regions.

An eighty fifth aspect of the present invention is a method for producing a structured substrate, comprising the step of:

using a semiconductor substrate on which a plurality of second regions made of a crystal having a second average dislocation density are regularly arranged in a first region made of a crystal having a first average dislocation density so as to produce a structured substrate, the second average dislocation density being greater than the first average dislocation density, the second regions being arranged at a first interval in a first direction and at a second interval in a second direction perpendicular to the first direction, the second interval being smaller than the first interval, wherein the structured substrate has a structure that does not pass through any one of the second regions.

An eighty sixth aspect of the present invention is a structured substrate comprising a semiconductor substrate on which a plurality of second regions made of a crystal having a second average dislocation density are regularly arranged in a first region made of a crystal having a first average dislocation density, the second average dislocation density being greater than the first average dislocation density, the second regions being arranged at a first interval in a first direction and at a second interval in a second direction perpendicular to the first direction, the second interval being smaller than the first interval, wherein the structured substrate has a structure that does not pass through any one of the second regions.

An eighty seventh aspect of the present invention is a method for producing a structured substrate, comprising the step of:

using a semiconductor substrate on which a plurality of second regions made of a crystal having a second average defect density are regularly arranged in a first region made of a crystal having a first average defect density so as to produce a structured substrate, the second average defect density being greater than the first average defect density, the second regions being arranged at a first interval in a first direction and at a second interval in a second direction perpendicular to the first direction, the second interval being smaller than the first interval, wherein the structured substrate has a structure that does not pass through any one of the second regions.

An eighty eighth aspect of the present invention is a structured substrate comprising a semiconductor substrate on which a plurality of second regions made of a crystal having a second average defect density are regularly arranged in a first region made of a crystal having a first average defect density, the second average defect density being greater than the first average defect density, the second regions being arranged at a first interval in a first direction and at a second interval in a second direction perpendicular to the first direction, the second interval being smaller than the first interval, wherein the structured substrate has a structure that does not pass through any one of the second regions.

An eighty ninth aspect of the present invention is a method for producing a structured substrate, comprising the step of:

using a semiconductor substrate on which a plurality of second regions made of a crystal are regularly arranged in a first region made of a crystal so as to produce a structured substrate, the crystallinity of the second regions being worse than the crystallinity of the first region, the second regions being arranged at a first interval in a first direction and at a second interval in a second direction perpendicular to the first direction, the second interval being smaller than the first interval, wherein the structured substrate has a structure that does not pass through any one of the second regions.

A ninetieth aspect of the present invention is a structured substrate comprising a semiconductor substrate on which a plurality of second regions made of a crystal are regularly arranged in a first region made of a crystal, the crystallinity of the second regions being worse than the crystallinity of the first region, the second regions being arranged at a first interval in a first direction and at a second interval in a second direction perpendicular to the first direction, the second interval being smaller than the first interval, wherein the structured substrate has a structure that does not pass through any one of the second regions.

A ninety first aspect of the present invention is a method for producing a structured substrate, comprising the step of:

using a semiconductor substrate on which a plurality of second regions that linearly extend and that are made of a crystal having a second average dislocation density are regularly arranged in parallel in a first region made of a crystal having a first average dislocation density so as to produce a structured substrate, the second average dislocation density being greater than the first average dislocation density, wherein the structured substrate has a structure that does not pass through any one of the second regions.

A ninety second aspect of the present invention is a structured substrate comprising a semiconductor substrate on which a plurality of second regions that linearly extend and that are made of a crystal having a second average dislocation density are regularly arranged in parallel in a first region made of a crystal having a first average dislocation density, the second average dislocation density being greater than the first average dislocation density, wherein the structured substrate has a structure that does not pass through any one of the second regions.

A ninety third aspect of the present invention is a method for producing a structured substrate, comprising the step of:

using a semiconductor substrate on which a plurality of second regions that linearly extend and that are made of a crystal having a second average defect density are regularly arranged in parallel in a first region made of a crystal having a first average defect density so as to produce a structured substrate, the second average defect density being greater than the first average defect density, wherein the structured substrate has a structure that does not pass through any one of the second regions.

A ninety fourth aspect of the present invention is a structured substrate comprising a semiconductor substrate on which a plurality of second regions that linearly extend and that are made of a crystal having a second average defect density are regularly arranged in parallel in a first region made of a crystal having a first average defect density, the second average defect density being greater than the first average defect density, wherein the structured substrate has a structure that does not pass through any one of the second regions.

A ninety fifth aspect of the present invention is a method for producing a structured substrate, comprising the step of:

using a semiconductor substrate on which a plurality of second regions that linearly extend and that are made of a crystal are regularly arranged in parallel in a first region made of a crystal so as to produce a structured substrate, the crystallinity of the second regions being worse than the crystallinity of the first region, wherein the structured substrate has a structure that does not pass through any one of the second regions.

A ninety sixth aspect of the present invention is a structured substrate comprising a semiconductor substrate on which a plurality of second regions that linearly extend and that are made of a crystal are regularly arranged in parallel in a first region made of a crystal, the crystallinity of the second regions being worse than the crystallinity of the first region, wherein the structured substrate has a structure that does not pass through any one of the second regions.

A ninety seventh aspect of the present invention is a method for producing a semiconductor light emitting device, comprising the step of:

using a semiconductor substrate on which a plurality of second regions made of a crystal having a second average dislocation density are regularly arranged in a first region made of a crystal having a first average dislocation density so as to produce a semiconductor light emitting device, the second average dislocation density being greater than the first average dislocation density, the second regions being arranged at a first interval in a first direction and at a second interval in a second direction perpendicular to the first direction, the second interval being smaller than the first interval, wherein the semiconductor light emitting device has a light emitting region that does not pass through any one of the second regions.

A ninety eighth aspect of the present invention is a semiconductor light emitting device comprising a semiconductor substrate on which a plurality of second regions made of a crystal having a second average dislocation density are regularly arranged in a first region made of a crystal having a first average dislocation density, the second average dislocation density being greater than the first average dislocation density, the second regions being arranged at a first interval in a first direction and at a second interval in a second direction perpendicular to the first direction, the second interval being smaller than the first interval, wherein the semiconductor light emitting device has a light emitting region that does not pass through any one of the second regions.

A ninety ninth aspect of the present invention is a method for producing a semiconductor light emitting device, comprising the step of:

using a semiconductor substrate on which a plurality of second regions made of a crystal having a second average defect density are regularly arranged in a first region made of a crystal having a first average defect density so as to produce a semiconductor light emitting device, the second average defect density being greater than the first average defect density, the second regions being arranged at a first interval in a first direction and at a second interval in a second direction perpendicular to the first direction, the second interval being smaller than the first interval, wherein the semiconductor light emitting device has a light emitting region that does not pass through any one of the second regions.

A hundredth aspect of the present invention is a semiconductor light emitting device comprising a semiconductor substrate on which a plurality of second regions made of a crystal having a second average defect density are regularly arranged in a first region made of a crystal having a first average defect density, the second average defect density being greater than the first average defect density, the second regions being arranged at a first interval in a first direction and at a second interval in a second direction perpendicular to the first direction, the second interval being smaller than the first interval, wherein the semiconductor light emitting device has a light emitting region that does not pass through any one of the second regions.

A hundred first aspect of the present invention is a method for producing a semiconductor light emitting device, comprising the step of:

using a semiconductor substrate on which a plurality of second regions made of a crystal are regularly arranged in a first region made of a crystal so as to produce a semiconductor light emitting device, the crystallinity of the second regions being worse than the crystallinity of the first region, the second regions being arranged at a first interval in a first direction and at a second interval in a second direction perpendicular to the first direction, the second interval being smaller than the first interval, wherein the semiconductor light emitting device has a light emitting region that does not pass through any one of the second regions.

A hundred second aspect of the present invention is a semiconductor light emitting device comprising a semiconductor substrate on which a plurality of second regions made of a crystal are regularly arranged in a first region made of a crystal, the crystallinity of the second regions being worse than the crystallinity of the first region, the second regions being arranged at a first interval in a first direction and at a second interval in a second direction perpendicular to the first direction, the second interval being smaller than the first interval, wherein the semiconductor light emitting device has a light emitting region that does not pass through any one of the second regions.

A hundred third aspect of the present invention is a method for producing a semiconductor light emitting device, comprising the step of:

using a semiconductor substrate on which a plurality of second regions that linearly extend and that are made of a crystal having a second average dislocation density are regularly arranged in parallel in a first region made of a crystal having a first average dislocation density so as to produce a semiconductor light emitting device, the second average dislocation density being greater than the first average dislocation density, wherein the semiconductor light emitting device has a light emitting region that does not pass through any one of the second regions.

A hundred fourth aspect of the present invention is a semiconductor light emitting device comprising a semiconductor substrate on which a plurality of second regions that linearly extend and that are made of a crystal having a second average dislocation density are regularly arranged in parallel in a first region made of a crystal having a first average dislocation density, the second-average dislocation density being greater than the first average dislocation density, wherein the semiconductor light emitting device has a light emitting region that does not pass through any one of the second regions.

A hundred fifth aspect of the present invention is a method for producing a semiconductor light emitting device, comprising the step of:

using a semiconductor substrate on which a plurality of second regions that linearly extend and that are made of a crystal having a second average defect density are regularly arranged in parallel in a first region made of a crystal having a first average defect density so as to produce a semiconductor light emitting device, the second average defect density being greater than the first average defect density, wherein the semiconductor light emitting device has a light emitting region that does not pass through any one of the second regions.

A hundred sixth aspect of the present invention is a semiconductor light emitting device comprising a semiconductor substrate on which a plurality of second regions that linearly extend and that are made of a crystal having a second average defect density are regularly arranged in parallel in a first region made of a crystal having a first average defect density, the second average defect density being greater than the first average defect density, wherein the semiconductor light emitting device has a light emitting region that does not pass through any one of the second regions.

A hundred seventh aspect of the present invention is a method for producing a semiconductor light emitting device, comprising the step of:

using a semiconductor substrate on which a plurality of second regions that linearly extend and that are made of a crystal are regularly arranged in parallel in a first region made of a crystal so as to produce a semiconductor light emitting device, the crystallinity of the second regions being worse than the crystallinity of the first region, wherein the semiconductor light emitting device has a light emitting region that does not pass through any one of the second regions.

A hundred eighth aspect of the present invention is a semiconductor light emitting device comprising a semiconductor substrate on which a plurality of second regions that linearly extend and that are made of a crystal are regularly arranged in parallel in a first region made of a crystal, the crystallinity of the second regions being worse than the crystallinity of the first region, wherein the semiconductor light emitting device has a light emitting region that does not pass through any one of the second regions.

A hundred ninth aspect of the present invention is a method for producing a semiconductor device, comprising the step of:

using a semiconductor substrate on which a plurality of second regions made of a crystal having a second average dislocation density are regularly arranged in a first region made of a crystal having a first average dislocation density so as to produce a semiconductor device, the second average dislocation density being greater than the first average dislocation density, the second regions being arranged at a first interval in a first direction and at a second interval in a second direction perpendicular to the first direction, the second interval being smaller than the first interval, wherein the semiconductor device has an active region that does not pass through any one of the second regions.

A hundred tenth aspect of the present invention is a semiconductor device comprising a semiconductor substrate on which a plurality of second regions made of a crystal having a second average dislocation density are regularly arranged in a first region made of a crystal having a first average dislocation density, the second average dislocation density being greater than the first average dislocation density, the second regions being arranged at a first interval in a first direction and at a second interval in a second direction perpendicular to the first direction, the second interval being smaller than the first interval, wherein the semiconductor device has an active region that does not pass through any one of the second regions.

A hundred eleventh aspect of the present invention is a method for producing a semiconductor device, comprising the step of:

using a semiconductor substrate on which a plurality of second regions made of a crystal having a second average defect density are regularly arranged in a first region made of a crystal having a first average defect density so as to produce a semiconductor device, the second average defect density being greater than the first average defect density, the second regions being arranged at a first interval in a first direction and at a second interval in a second direction perpendicular to the first direction, the second interval being smaller than the first interval, wherein the semiconductor device has an active region that does not pass through any one of the second regions.

A hundred twelfth aspect of the present invention is a semiconductor device comprising a semiconductor substrate on which a plurality of second regions made of a crystal having a second average defect density are regularly arranged in a first region made of a crystal having a first average defect density, the second average defect density being greater than the first average defect density, the second regions being arranged at a first interval in a first direction and at a second interval in a second direction perpendicular to the first direction, the second interval being smaller than the first interval, wherein the semiconductor device has an active region that does not pass through any one of the second regions.

A hundred thirteenth aspect of the present invention is a method for producing a semiconductor device, comprising the step of:

using a semiconductor substrate on which a plurality of second regions made of a crystal are regularly arranged in a first region made of a crystal so as to produce a semiconductor device, the crystallinity of the second regions being worse than the crystallinity of the first region, the second regions being arranged at a first interval in a first direction and at a second interval in a second direction perpendicular to the first direction, the second interval being smaller than the first interval, wherein the semiconductor device has an active region that does not pass through any one of the second regions.

A hundred fourteenth aspect of the present invention is a semiconductor device comprising a semiconductor substrate on which a plurality of second regions made of a crystal are regularly arranged in a first region made of a crystal, the crystallinity of the second regions being worse than the crystallinity of the first region, the second regions being arranged at a first interval in a first direction and at a second interval in a second direction perpendicular to the first direction, the second interval being smaller than the first interval, wherein the semiconductor device has an active region that does not pass through any one of the second regions.

A hundred fifteenth aspect of the present invention is a method for producing a semiconductor device, comprising the step of:

using a semiconductor substrate on which a plurality of second regions that linearly extend and that are made of a crystal having a second average dislocation density are regularly arranged in parallel in a first region made of a crystal having a first average dislocation density so as to produce a semiconductor device, the second average dislocation density being greater than the first average dislocation density, wherein the semiconductor device has an active region that does not pass through any one of the second regions.

A hundred sixteenth aspect of the present invention is a semiconductor device comprising a semiconductor substrate on which a plurality of second regions that linearly extend and that are made of a crystal having a second average dislocation density are regularly arranged in parallel in a first region made of a crystal having a first average dislocation density, the second average dislocation density being greater than the first average dislocation density, wherein the semiconductor device has an active region that does not pass through any one of the second regions.

A hundred seventeenth aspect of the present invention is a method for producing a semiconductor device, comprising the step of:

using a semiconductor substrate on which a plurality of second regions that linearly extend and that are made of a crystal having a second average defect density are regularly arranged in parallel in a first region made of a crystal having a first average defect density so as to produce a semiconductor device, the second average defect density being greater than the first average defect density, wherein the semiconductor device has an active region that does not pass through any one of the second regions.

A hundred eighteenth aspect of the present invention is a semiconductor device comprising a semiconductor substrate on which a plurality of second regions that linearly extend and that are made of a crystal having a second average defect density are regularly arranged in parallel in a first region made of a crystal having a first average defect density, the second average defect density being greater than the first average defect density, wherein the semiconductor device has an active region that does not pass through any one of the second regions.

A hundred nineteenth aspect of the present invention is a method for producing a semiconductor device, comprising the step of:

using a semiconductor substrate on which a plurality of second regions that linearly extend and that are made of a crystal are regularly arranged in parallel in a first region made of a crystal so as to produce a semiconductor device, the crystallinity of the second regions being worse than the crystallinity of the first region, wherein the semiconductor device has an active region that does not pass through any one of the second regions.

A hundred twentieth aspect of the present invention is a semiconductor device comprising a semiconductor substrate on which a plurality of second regions that linearly extend and that are made of a crystal are regularly arranged in parallel in a first region made of a crystal, the crystallinity of the second regions being worse than the crystallinity of the first region, wherein the semiconductor device has an active region that does not pass through any one of the second regions.

A hundred twenty first aspect of the present invention is a method for producing a structured substrate, comprising the step of:

using a substrate on which a plurality of second regions made of a crystal having a second average dislocation density are regularly arranged in a first region made of a crystal having a first average dislocation density so as to produce a structured substrate, the second average dislocation density being greater than the first average dislocation density, the second regions being arranged at a first interval in a first direction and at a second interval in a second direction perpendicular to the first direction, the second interval being smaller than the first interval, wherein the structured substrate has a structure that does not pass through any one of the second regions.

A hundred twenty second aspect of the present invention is a structured substrate comprising a substrate on which a plurality of second regions made of a crystal having a second average dislocation density are regularly arranged in a first region made of a crystal having a first average dislocation density, the second average dislocation density being greater than the first average dislocation density, the second regions being arranged at a first interval in a first direction and at a second interval in a second direction perpendicular to the first direction, the second interval being smaller than the first interval, wherein the structured substrate has a structure that does not pass through any one of the second regions.

A hundred twenty third aspect of the present invention is a method for producing a structured substrate, comprising the step of:

using a substrate on which a plurality of second regions made of a crystal having a second average defect density are regularly arranged in a first region made of a crystal having a first average defect density so as to produce a structured substrate, the second average defect density being greater than the first average defect density, the second regions being arranged at a first interval in a first direction and at a second interval in a second direction perpendicular to the first direction, the second interval being smaller than the first interval, wherein the structured substrate has a structure that does not pass through any one of the second regions.

A hundred twenty fourth aspect of the present invention is a structured substrate comprising a substrate on which a plurality of second regions made of a crystal having a second average defect density are regularly arranged in a first region made of a crystal having a first average defect density, the second average defect density being greater than the first average defect density, the second regions being arranged at a first interval in a first direction and at a second interval in a second direction perpendicular to the first direction, the second interval being smaller than the first interval, wherein the structured substrate has a structure that does not pass through any one of the second regions.

A hundred twenty fifth aspect of the present invention is a method for producing a structured substrate, comprising the step of:

using a substrate on which a plurality of second regions made of a crystal are regularly arranged in a first region made of a crystal so as to produce a structured substrate, the crystallinity of the second regions being worse than the crystallinity of the first region, the second regions being arranged at a first interval in a first direction and at a second interval in a second direction perpendicular to the first direction, the second interval being smaller than the first interval, wherein the structured substrate has a structure that does not pass through any one of the second regions.

A hundred twenty sixth aspect of the present invention is a structured substrate comprising a substrate on which a plurality of second regions made of a crystal are regularly arranged in a first region made of a crystal, the crystallinity of the second regions being worse than the crystallinity of the first region, the second regions being arranged at a first interval in a first direction and at a second interval in a second direction perpendicular to the first direction, the second interval being smaller than the first interval, wherein the structured substrate has a structure that does not pass through any one of the second regions.

A hundred twenty seventh aspect of the present invention is a method for producing a structured substrate, comprising the step of:

using a substrate on which a plurality of second regions that linearly extend and that are made of a crystal having a second average dislocation density are regularly arranged in parallel in a first region made of a crystal having a first average dislocation density so as to produce a structured substrate, the second average dislocation density being greater than the first average dislocation density, wherein the structured substrate has a structure that does not pass through any one of the second regions.

A hundred twenty eighth aspect of the present invention is a structured substrate comprising a substrate on which a plurality of second regions that linearly extend and that are made of a crystal having a second average dislocation density are regularly arranged in parallel in a first region made of a crystal having a first average dislocation density, the second average dislocation density being greater than the first average dislocation density, wherein the structured substrate has a structure that does not pass through any one of the second regions.

A hundred twenty ninth aspect of the present invention is a method for producing a structured substrate, comprising the step of:

using a substrate on which a plurality of second regions that linearly extend and that are made of a crystal having a second average defect density are regularly arranged in parallel in a first region made of a crystal having a first average defect density so as to produce a structured substrate, the second average defect density being greater than the first average defect density, wherein the structured substrate has a structure that does not pass through any one of the second regions.

A hundred thirtieth aspect of the present invention is a structured substrate comprising a substrate on which a plurality of second regions that linearly extend and that are made of a crystal having a second average defect density are regularly arranged in parallel in a first region made of a crystal having a first average defect density, the second average defect density being greater than the first average defect density, wherein the structured substrate has a structure that does not pass through any one of the second regions.

A hundred thirty first aspect of the present invention is a method for producing a structured substrate, comprising the step of:

using a substrate on which a plurality of second regions that linearly extend and that are made of a crystal are regularly arranged in parallel in a first region made of a crystal so as to produce a structured substrate, the crystallinity of the second regions being worse than the crystallinity of the first region, wherein the structured substrate has a structure that does not pass through any one of the second regions.

A hundred thirty second aspect of the present invention is a structured substrate comprising a substrate on which a plurality of second regions that linearly extend and that are made of a crystal are regularly arranged in parallel in a first region made of a crystal, the crystallinity of the second regions being worse than the crystallinity of the first region, wherein the structured substrate has a structure that does not pass through any one of the second regions.

A hundred thirty third aspect of the present invention is a method for producing a device, comprising the step of:

using a substrate on which a plurality of second regions made of a crystal having a second average dislocation density are regularly arranged in a first region made of a crystal having a first average dislocation density so as to produce a device, the second average dislocation density being greater than the first average dislocation density, the second regions being arranged at a first interval in a first direction and at a second interval in a second direction perpendicular to the first direction, the second interval being smaller than the first interval, wherein the device has an active region that does not pass through any one of the second regions.

A hundred thirty fourth aspect of the present invention is a device comprising a substrate on which a plurality of second regions made of a crystal having a second average dislocation density are regularly arranged in a first region made of a crystal having a first average dislocation density, the second average dislocation density being greater than the first average dislocation density, the second regions being arranged at a first interval in a first direction and at a second interval in a second direction perpendicular to the first direction, the second interval being smaller than the first interval, wherein the device has an active region that does not pass through any one of the second regions.

A hundred thirty fifth aspect of the present invention is a method for producing a device, comprising the step of:

using a substrate on which a plurality of second regions made of a crystal having a second average defect density are regularly arranged in a first region made of a crystal having a first average defect density so as to produce a device, the second average defect density being greater than the first average defect density, the second regions being arranged at a first interval in a first direction and at a second interval in a second direction perpendicular to the first direction, the second interval being smaller than the first interval, wherein the device has an active region that does not pass through any one of the second regions.

A hundred thirty sixth aspect of the present invention is a device comprising a substrate on which a plurality of second regions made of a crystal having a second average defect density are regularly arranged in a first region made of a crystal having a first average defect density, the second average defect density being greater than the first average defect density, the second regions being arranged at a first interval in a first direction and at a second interval in a second direction perpendicular to the first direction, the second interval being smaller than the first interval, wherein the device has an active region that does not pass through any one of the second regions.

A hundred thirty seventh aspect of the present invention is a method for producing a device, comprising the step of:

using a substrate on which a plurality of second regions made of a crystal are regularly arranged in a first region made of a crystal so as to produce a device, the crystallinity of the second regions being worse than the crystallinity of the first region, the second regions being arranged at a first interval in a first direction and at a second interval in a second direction perpendicular to the first direction, the second interval being smaller than the first interval, wherein the device has an active region that does not pass through any one of the second regions.

A hundred thirty eighth aspect of the present invention is a device comprising a substrate on which a plurality of second regions made of a crystal are regularly arranged in a first region made of a crystal, the crystallinity of the second regions being worse than the crystallinity of the first region, the second regions being arranged at a first interval in a first direction and at a second interval in a second direction perpendicular to the first direction, the second interval being smaller than the first interval, wherein the device has an active region that does not pass through any one of the second regions.

A hundred thirty ninth aspect of the present invention is a method for producing a device, comprising the step of:

using a substrate on which a plurality of second regions that linearly extend and that are made of a crystal having a second average dislocation density are regularly arranged in parallel in a first region made of a crystal having a first average dislocation density so as to produce a device, the second average dislocation density being greater than the first average dislocation density, wherein the device has an active region that does not pass through any one of the second regions.

A hundred fortieth aspect of the present invention is a device comprising a substrate on which a plurality of second regions that linearly extend and that are made of a crystal having a second average dislocation density are regularly arranged in parallel in a first region made of a crystal having a first average dislocation density, the second average dislocation density being greater than the first average dislocation density, wherein the device has an active region that does not pass through any one of the second regions.

A hundred forty first aspect of the present invention is a method for producing a device, comprising the step of:

using a substrate on which a plurality of second regions that linearly extend and that are made of a crystal having a second average defect density are regularly arranged in parallel in a first region made of a crystal having a first average defect density so as to produce a device, the second average defect density being greater than the first average defect density, wherein the device has an active region that does not pass through any one of the second regions.

A hundred forty second aspect of the present invention is a device comprising a substrate on which a plurality of second regions that linearly extend and that are made of a crystal having a second average defect density are regularly arranged in parallel in a first region made of a crystal having a first average defect density, the second average defect density being greater than the first average defect density, wherein the device has an active region that does not pass through any one of the second regions.

A hundred forty third aspect of the present invention is a method for producing a device, comprising the step of:

using a substrate on which a plurality of second regions that linearly extend and that are made of a crystal are regularly arranged in parallel in a first region made of a crystal so as to produce a device, the crystallinity of the second regions being worse than the crystallinity of the first region, wherein the device has an active region that does not pass through any one of the second regions.

A hundred forty fourth aspect of the present invention is a device comprising a substrate on which a plurality of second regions that linearly extend and that are made of a crystal are regularly arranged in parallel in a first region made of a crystal, the crystallinity of the second regions being worse than the crystallinity of the first region, wherein the device has an active region that does not pass through any one of the second regions.

According to the forty ninth aspect to hundred forty fourth aspect of the present invention, the interval (first interval) of the second regions in the first direction or the interval of the second regions that linearly extend is the same as the interval of the second regions or the arrangement interval of the second regions according to the first aspect of the present invention. In addition, the interval (first interval) of the second regions in the first direction or the interval of the second regions that linearly extend is the same as the interval of the second regions or the arrangement interval of the second regions according to the first aspect of the present invention except that the former is typically 50 μm or greater. According to the forty ninth aspect to fifty fourth aspect, the sixty first aspect to sixty sixth aspect, the seventy third aspect to seventy eighth aspect, the eighty fifth aspect to ninetieth aspect, the ninety seventh aspect to hundred second aspect, the hundred ninth aspect to hundred fourteenth aspect, the hundred twenty first aspect to hundred twenty sixth aspect, and hundred thirty third aspect to hundred thirty eighth aspect, the interval of the second regions in the second direction can be freely selected in the condition that the interval of the second regions is smaller than the first interval. Although the interval of the second regions depends on the size of each of the second regions, the interval of the second regions is generally 10 μm or greater and 1000 μm or smaller, typically, 20 μm or greater and 200 μm or smaller. In addition, in a chip region (hereinafter referred to as device region) that is formed by scrubbing the substrate, the number of rows of second regions in the second direction or the number of second regions that linearly extend is substantially not greater than seven. The maximum number of rows of second regions in the second direction or the maximum number of second regions that linearly extend is seven because the device region may contain seven second regions depending on the relation between the number of rows of second regions in the second direction or the interval of second regions that linearly extend and the chip size of the device. The number of rows of second regions in the second direction or the number of second regions that linearly extend of a semiconductor light emitting device is typically three or less.

Except for the foregoing description, the description for the first aspect to forty eighth aspect of the present invention applies to the forty ninth aspect to hundred forty fourth aspect unless that is contrary to characteristics thereof.

According to the present invention, since a structure, for example, an active region for a semiconductor device, or a light emitting region for a semiconductor light emitting device is formed on a nitride type III-V group compound semiconductor substrate, a semiconductor substrate, or a substrate in such a manner that the active region or the semiconductor light emitting device does not pass through any one of the second regions whose average dislocation density, average defect density, or crystallinity is greater or worse than the first region, the active region or light emitting region can be prevented from being adversely affected by the second regions.

When a plurality of portions that are different from other portions in the interval of the second regions and/or the arrangement thereof as alignment marks are formed, these alignment marks can be used to accurately align a mask.

These and other objects, features and advantages of the present invention will become more apparent in light of the following detailed description of a best mode embodiment thereof, as illustrated in the accompanying drawings.

BRIEF DESCRIPTION OF THE DRAWINGS

FIG. 2 is a plan view showing the GaN substrate according to the first embodiment of the present invention.

DETAILED DESCRIPTION OF THE PREFERRED EMBODIMENTS

Next, with reference to the accompanying drawings, embodiments of the present invention will be described.

First Embodiment

Figure 1A:
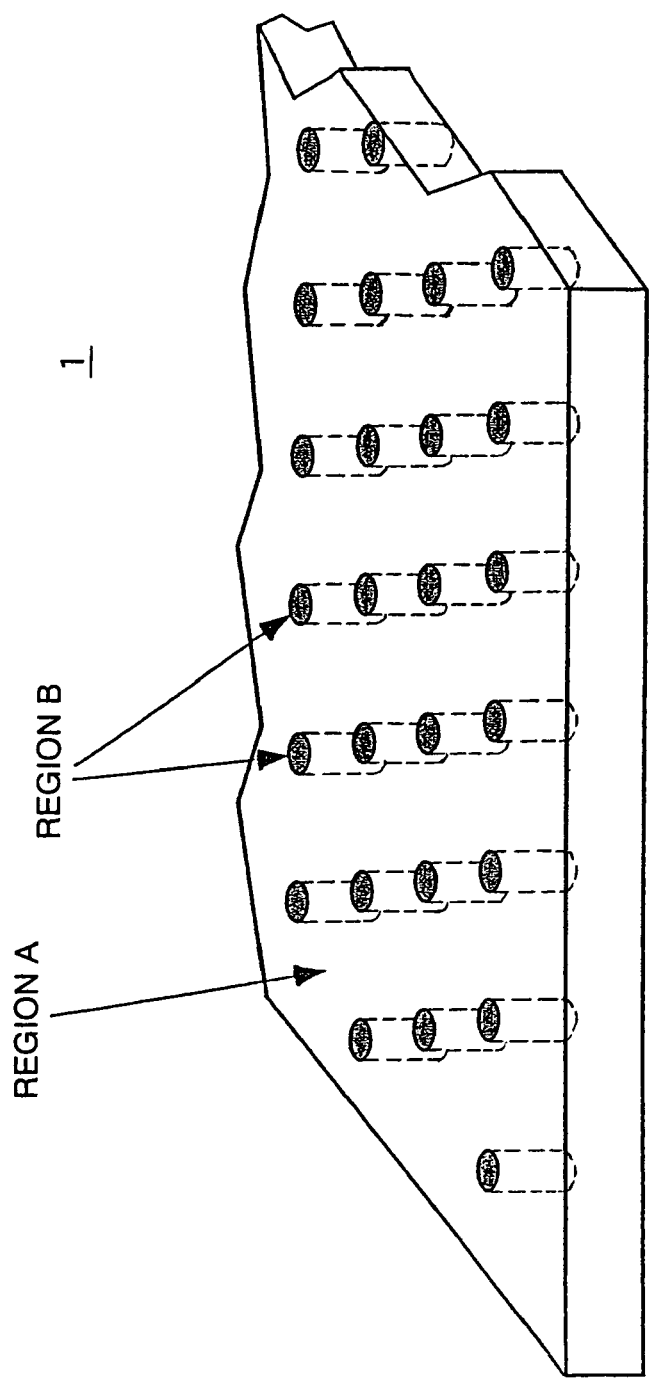
FIG. 1A and FIG. 1B are a perspective view and a sectional view, respectively, showing a GaN substrate according to a first embodiment of the present invention.
Figure 1B:
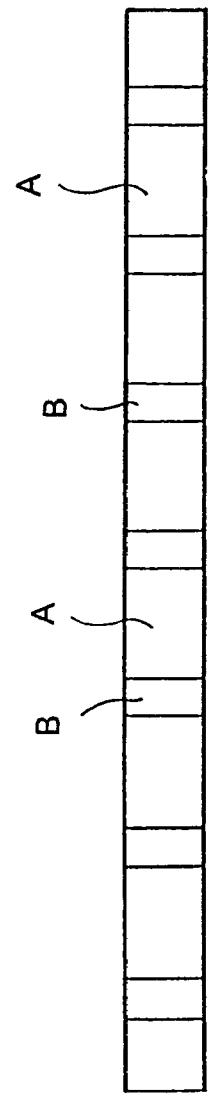

FIG. 1A, FIG. 1B, and FIG. 2 show a GaN substrate 1 according to a first embodiment of the present invention. FIG. 1A is a perspective view showing the GaN substrate 1. FIG. 1B is a sectional view showing regions B in the most adjacent direction of the GaN substrate 1. FIG. 2 is a plan view showing the GaN substrate 1. The GaN substrate 1 is made of an n-type transistor and has a (0001) plane (C plane) orientation. However, the GaN substrate 1 may have an R plane orientation, an A plane orientation, or an M plane orientation. The GaN substrate 1 has a region A and regions B. The region A is made of a crystal having a low average dislocation density. The regions B are made of a crystal having a high average dislocation density. The regions B are periodically arranged in the region A in a hexagonal lattice shape. It can be said that each of the regions B is arranged at a vertex of a closest-packed regular triangle. The regions B generally have an irregular polygonal prism shape. For simplicity, FIG. 1A shows the regions B in a cylinder shape (this applies to the description that follows). In this case, a straight line that connects the most adjacent regions B accords with a <11-20> direction of GaN and its equivalent direction. A direction perpendicular to the straight line accords with a <1-100> direction of GaN and its equivalent direction. Alternatively, the straight line that connects the most adjacent regions B may accord with a <1-100> direction of GaN and its equivalent direction. The direction perpendicular to the straight line may accord with the <11-20> direction and its equivalent direction. The regions B pierce the GaN substrate 1. The thickness of the GaN substrate 1 is for example in the range from 200 to 600 μm. In FIG. 2, dotted lines represent only relative relations of the regions B, not real (physical) lines (this applies to the description that follows).

Figure 3:
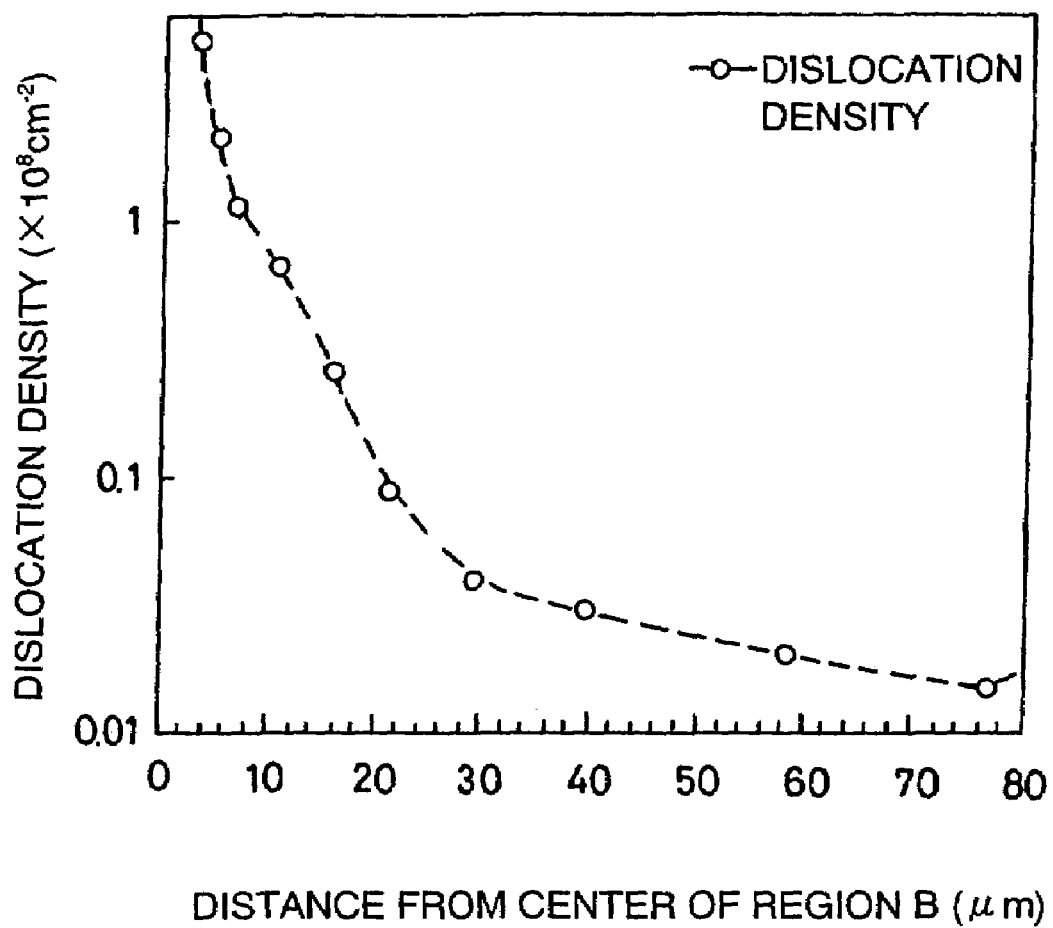
FIG. 3 is a schematic diagram showing an example of a distribution of dislocation densities near a region B of the GaN substrate according to the first embodiment of the present invention.

The arrangement period of the regions B (for example, the interval between the centers of the most adjacent regions B) is for example 400 µm and the diameter thereof is for example 20 µm. The average dislocation density of the region A is for example $2 \times 10^6$ cm$^{-2}$. The average dislocation density of each of the regions B is for example $1 \times 10^8$ cm$^{-2}$. FIG. 3 shows an example of a distribution of dislocation densities in the radius direction from the center of each of the region B.

The GaN substrate 1 can be produced by a crystal growing technology as follows.

The GaN substrate 1 is produced by the following crystal growing mechanism. A crystal is grown on a facet plane that is an inclined plane. The crystal is continuously grown on the inclined facet plane so as to propagate dislocations and gather them to a predetermined position. The region in which the crystal has been grown on the facet plane and from which dislocations have been propagated becomes a low density defect region. At a lower portion of the inclined facet plane, the crystal is grown and becomes a high density defect region having a clear boundary. The dislocations gather at the boundary of the high density defect region or the inside thereof. As a result, the dislocations disappear or stay at the boundary of the high density defect region or the inside thereof.

The shape of the facet plane depends on the shape of the high density defect region. When the defect region is formed in a dot shape, the facet plane surrounds the bottom of the dot and forms a pit. When the defect region is formed in a stripe shape, the facet plane is formed in a triangular prism shape of which the stripe is placed at the bottom and inclined facet planes are placed on both the sides of the stripe.

Thereafter, the front surface of the grown layer is ground and abraded. As a result, the front surface of the grown layer is smoothened so that the GaN substrate 1 can be used as a substrate.

The foregoing high density defect region may have several states. For example, the high density defect region may be made of a polycrystal. Alternatively, the high density defect region may be made of a single crystal that is slightly inclined against the adjacent low density defect region. Alternatively, the high density defect region may have an inverted C axis against the adjacent low density defect region. Thus, since the high density defect region has a clear boundary against the low density defect region, they are distinguished from each other.

With the high density defect region, the crystal can be continuously grown while the adjacent facet plane is kept, not buried.

To form the high density defect region, a seed thereof is pre-formed. The seed is for example a layer of an amorphous substance or a layer of a polycrystal. By growing a crystal of GaN on the seed, the high density defect region can be formed in the region of the seed.

The GaN substrate 1 can be practically produced in the following manner. First of all, a base substrate is prepared. As the base substrate, various types of substrates can be used. Although a sapphire substrate may be used, since it is not easily removed at a later step, it is preferable to use a GaAs substrate that can be easily removed. Thereafter, a seed made of for example a SiO$_2$ film is formed on the base substrate. The seed can be formed in a dot shape or a stripe shape. Many seeds can be regularly formed. More practically, in this case, seeds are formed in accordance with the arrangement of the regions B shown in FIG. 2. Thereafter, GaN is grown as a thick film by for example hydride vapor phase expitaxy (HVPE). After GaN is grown, a facet plane is formed in accordance with a pattern of seeds. When seeds are formed in a dot shaped pattern according to the first embodiment, pits composed of the facet plane are regularly formed. In contrast, when seeds are formed in a stripe shaped pattern, a prism shaped facet plane is formed.

Thereafter, the base substrate is removed. The thick film layer of GaN is ground and abraded so as to flatten the front surface thereof. As a result, the GaN substrate 1 can be produced. The thickness of the GaN substrate 1 can be freely designated.

The GaN substrate 1 produced in the foregoing manner has a principal plane that is the C plane. On the principal plane, a dot shaped (or stripe shaped) high density defect region that has a predetermined size, namely regions B, are regularly formed. The dislocation density of the single crystal region other than the regions B, namely the region A, is lower than that of the regions B.

Figure 4:
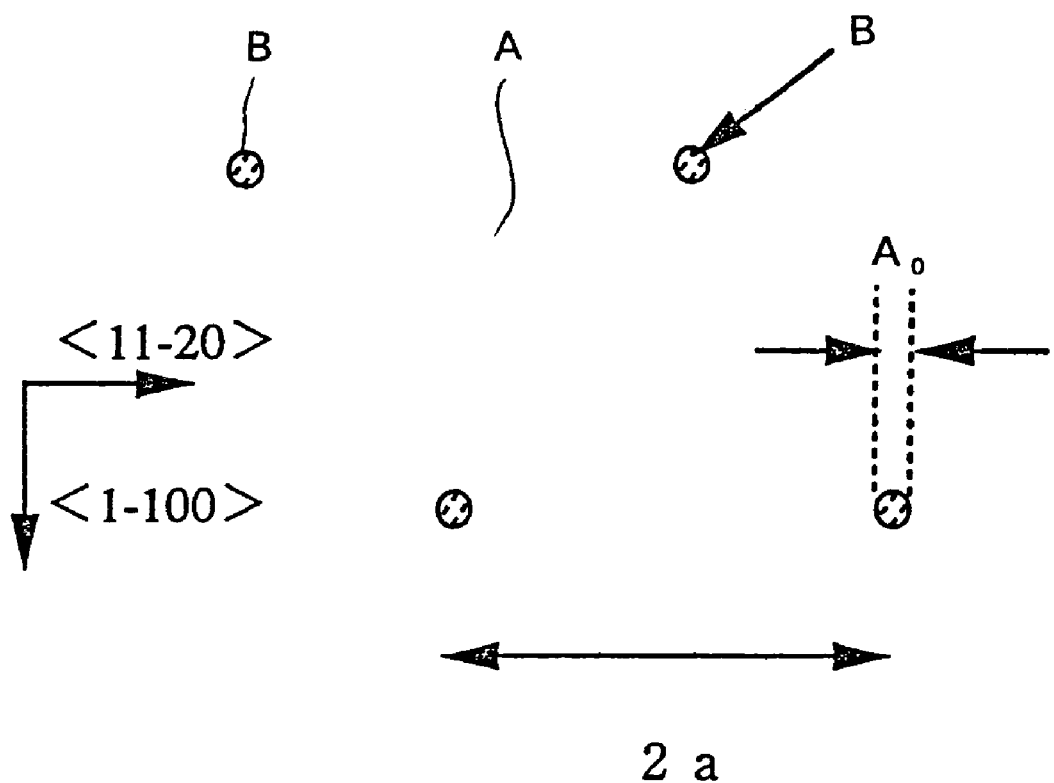
FIG. 4 is a schematic diagram showing the GaN substrate according to the first embodiment of the present invention.

As shown in FIG. 4, the interval between the most adjacent regions B is denoted by 2a and the diameter of each region B is denoted by $A_0$.

Figure 5:
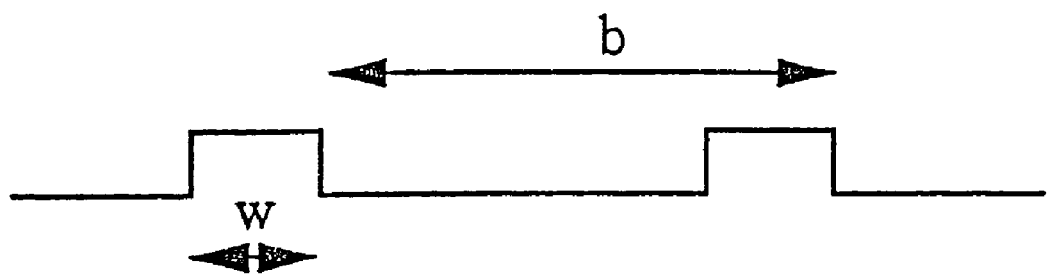
FIG. 5 is a sectional view showing a structured substrate according to the first embodiment of the present invention.

FIG. 5 shows an example of a structured substrate using the GaN substrate 1. Ridges R are formed at an interval b on the principal plane of the GaN substrate 1. The ridges R each have a width W and extend in a direction <1-100>. This structure can be formed by selectively etching the principal plane of the GaN substrate 1. The ridges R may be formed on the GaN substrate 1 as a bulk substrate or on a GaN type semiconductor laser grown on the GaN substrate 1. In the former, for example the ridges R may be used as device regions. In other words, a device structure, for example, a GaN type semiconductor layer that forms a laser structure, is grown on a ridge R. As a result, a laser device is formed. In the latter case, a GaN type semiconductor laser that forms a laser structure is grown on the GaN substrate 1. A ridge R that becomes a laser stripe portion is formed on the top of the GaN type semiconductor laser. This point will be practically described later. FIG. 5 shows an example of which a ridge R has a rectangular section. However, the shape of the section of a ridge R is not limited to a rectangle, but any other shapes (for example, a triangle).

When the direction in which the ridges R extend and the arrangement direction of the regions B are the <1-100> direction and the ridges R are periodically formed in the direction, the relative positions of the regions B and the ridges R can be regularly designated on the surface of the substrate.

When the relations of b≧a and b=na (where n represents any natural number) are satisfied, since the periodicity can be also obtained in a <11-20> direction, the same relation of positions of the regions B and the ridges R can be obtained anywhere on the surface of the substrate. When a device is formed at the top of a ridge R that is formed at a position of a region A, not a region B, the device has a good reliability. When a device is formed at the bottom of a ridge R, the active region of the device can be positioned in a region A, which is a high crystal quality region.

When the relations of b≦a and a=nb (where n is any natural number) are satisfied, the periodicity can be also obtained in the <1-20> direction. As a simple theory, when the relation of $A_0$<a−W where $A_0$ represents the diameter of a region B and w represents the width of a ridge R, the ridge can be formed in such a manner that it does not pass through the top of any region B on all the surface of the substrate.

Even if ridges R cannot be formed in the region A on all the surface of the substrate, when the foregoing relation (a=nb) is satisfied, in particular, n is as small as 2 or 3, many good devices can be periodically formed in comparison with any arrangement or any relation of a and b.

Figure 6:
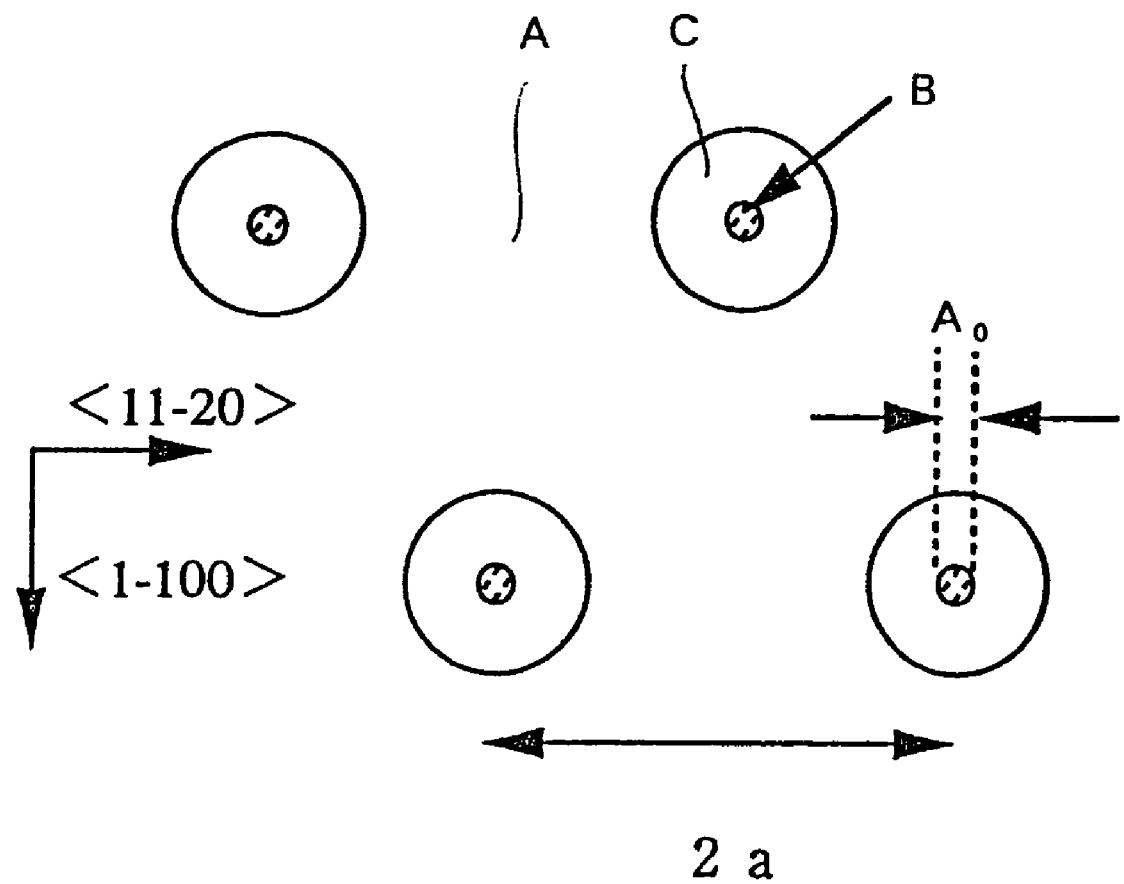
FIG. 6 is a plan view showing another example of the GaN substrate according to the first embodiment of the present invention.

The case that the regions B are periodically arranged in the region A on the GaN substrate 1 has been described. As shown in FIG. 6, there may be a region C between a region A and a region B, where the average dislocation density (for example, around $1 \times 10^7$ cm$^{-2}$) of the region C is in the middle of the average dislocation density of the region A and the average dislocation density of the region B. In this case, like the foregoing description, ridges R should not pass through the regions B. To form good devices, it is preferred to form ridges R so that they do not pass through the regions B and regions C. Even if a region C is large and a ridge R cannot be formed in a region A on all the surface of the substrate, when the foregoing relation (a=nb) is satisfied, in particular, n is as small as 2 or 3, many good devices can be periodically formed in comparison with any arrangement or any relation of a and b.

Next, an example of a GaN type semiconductor laser according to the first embodiment will be described. The GaN type semiconductor laser has a ridge structure and a separate confinement heterostructure.

Figure 7:
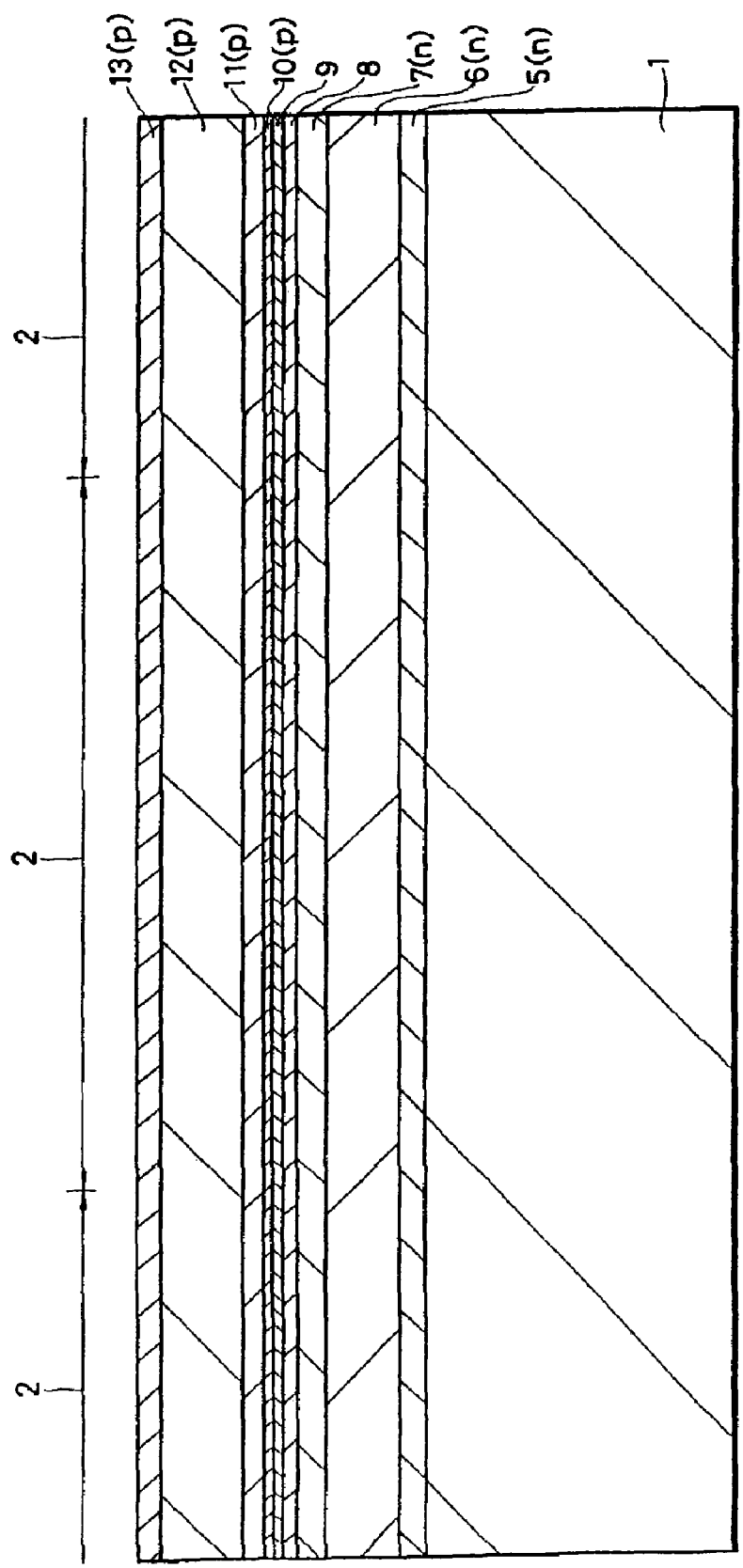
FIG. 7 is a sectional view describing a method for producing a GaN type semiconductor laser according to the first embodiment of the present invention.

As shown in FIG. 7, the front surface of the GaN substrate 1 is cleaned by thermal cleaning or the like. Thereafter, an n-type GaN buffer layer 5, an n-type AlGaN clad layer 6, an n-type GaN optical waveguide layer 7, an undoped $Ga_{1-x}In_xN/Ga_{1-y}In_yN$ multiple quantum well structure active layer 8, an undoped InGaN deterioration protection layer 9, a p-type AlGaN cap layer 10, a p-type GaN optical waveguide layer 11, a p-type AlGaN clad layer 12, and a p-type GaN contact layer 13 are epitaxially grown on the front surface of the GaN substrate 1 by the MOCVD method.

The thickness of the n-type GaN buffer layer 5 is for example 0.05 μm. For example, Si is doped as n-type impurities in the n-type GaN buffer layer 5. The thickness of the n-type AlGaN clad layer 6 is for example 1.0 μm. For example, Si is doped as n-type impurities in the n-type AlGaN clad layer 6. The composition of Al of the n-type AlGaN clad layer 6 is for example 0.08. The thickness of the n-type GaN optical waveguide layer 7 is for example 0.1 μm. For example, Si is doped as n-type impurities in the n-type GaN optical waveguide layer 7. The undoped $Ga_{1-x}In_xN/Ga_{1-y}In_yN$ multiple quantum well structure active layer 8 has an $In_xGa_{1-x}N$ layer as a well layer and an $In_yGa_{1-y}N$ layer as a barrier layer. The $In_xGa_{1-x}N$ layer has a thickness of 3.5 nm. x of $In_xGa_{1-x}N$ is 0.14. The $In_yGa_{1-y}N$ layer has a thickness of 7 nm. y of $In_yGa_{1-y}N$ is 0.02. The InyGa1-yN layer has three wells.

The undoped InGaN deterioration protection layer 9 has a grated structure of which the In composition gradually decreases from the plane that is in contact with the active layer 8 to the plane that is in contact with the undoped InGaN deterioration protection layer 9. The composition of In of the plane that is in contact with the active layer 8 accords with the composition y of In of the $In_yGa_{1-y}N$ layer as the barrier layer of the active layer 8. The composition of In of the plane that is in contact with the p-type AlGaN cap layer 10 is 0. The thickness of the undoped InGaN deterioration protection layer 9 is for example 20 nm.

The thickness of the p-type AlGaN cap layer 10 is for example 10 nm. For example, magnesium (Mg) is doped as p-type impurities in the p-type AlGaN cap layer 10. The composition of Al of the p-type AlGaN cap layer 10 is for example 0.2. The p-type AlGaN cap layer 10 prevents In from being removed from the active layer 8 and it from deteriorating when the p-type GaN optical waveguide layer 11, the p-type AlGaN clad layer 12, and the p-type GaN contact layer 13 are grown. In addition, the p-type AlGaN cap layer 10 prevents carriers (electrons) from overflowing from the active layer 8. The thickness of the p-type GaN optical waveguide layer 11 is for example 0.1 μm. For example, Mg is doped as p-type impurities in the p-type GaN optical waveguide layer 11. The thickness of the p-type AlGaN clad layer 12 is for example 0.5 μm. For example, Mg is doped as p-type impurities in the p-type AlGaN clad layer 12. The composition of Al of the p-type AlGaN clad layer 12 is for example 0.08. The thickness of the p-type GaN contact layer 13 is for example 0.1 μm. For example, Mg is doped as p-type impurities in the p-type GaN contact layer 13.

The growing temperatures of the n-type GaN buffer layer 5, the n-type AlGaN clad layer 6, the n-type GaN optical waveguide layer 7, the p-type AlGaN cap layer 10, the p-type GaN optical waveguide layer 11, the p-type AlGaN clad layer 12, and the p-type GaN contact layer 13, which do not contain In, are for example around 1000° C. The growing temperature of the $Ga_{1-x}In_xN/Ga_{1-y}In_yN$ multiple quantum well structure active layer 8, which contains In, is for example in the range from 700 to 800° C., preferably for example 730° C. The growing temperature at which the undoped InGaN deterioration protection layer 9 starts growing is set to for example 730° C., which is the same as the growing temperature of the active layer 8. Thereafter, the temperature of the undoped InGaN deterioration protection layer 9 is linearly raised. The temperature at which the undoped InGaN deterioration protection layer 9 ends growing is set to for example 835° C., which is the same as the growing temperature of the p-type AlGaN cap layer 10.

With respect to growing materials of the GaN type semiconductor layer, as a material of Ga, trimethyl gallium (($CH_3$)$_3$Ga, TMG) is used; as a material of Al, trimethyl aluminum (($CH_3$)$_3$Al, TMA) is used; as a material of In, trimethyl indium (($CH_3$)$_3$In, TMI) is used; as a material of N; $NH_3$ is used. As a carrier gas, for example $H_2$ is used. With respect to dopants, as an n-type dopant, for example monosilane ($SiH_4$) is used. As a p-type dopant, for example bis= (methylcyclopentyl) magnesium (($CH_3C_5H_4$)$_2$Mg) or bis= (cyclopentyl) magnesium (($C_5H_5$)$_2$Mg) is used.

Thereafter, the GaN substrate 1 on which the GaN type semiconductor layer has been grown in the foregoing manner is removed from the MOCVD apparatus. Thereafter, an $SiO_2$ film (not shown) is formed for a thickness of for example 0.1 μm on all the surface of the p-type contact layer 13 by the CVD method, vacuum evaporating method, spattering method or the like. Thereafter, a resist pattern (not shown) is formed in a predetermined shape in accordance with the shape of the ridge portion on the $SiO_2$ film by lithography. With a mask of the resist pattern, the $SiO_2$ film is etched by a wet-etching method using for example hydrochloric acid type etching solution or the RIE method using an etching gas containing fluorine for example $CF_4$ or $CHF_3$.

Figure 8:
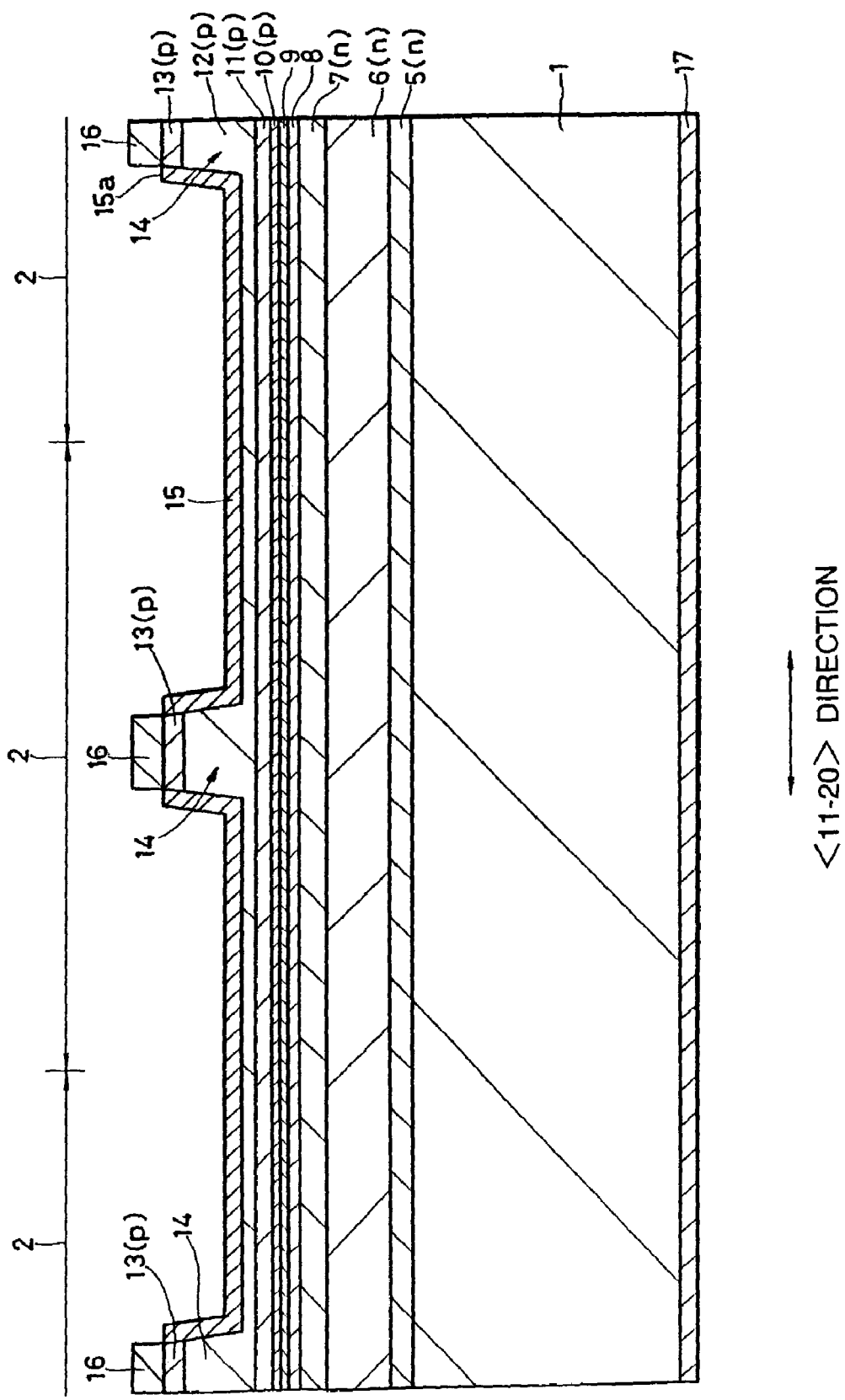
FIG. 8 is a sectional view describing a method for producing a GaN type semiconductor laser according to the first embodiment of the present invention.

Next, with a mask of the $SiO_2$ film, the p-type AlGaN clad layer 12 is etched for a predetermined thickness by the RIE method. As a result, as shown in FIG. 8, a ridge 14 that extends in a <1-100> direction is formed. The width of the ridge 14 is for example 3 μm. As an etching gas for the RIE, for example a chlorine type gas is used.

Thereafter, the $SiO_2$ film as the etching mask is etched out. Thereafter, an insulation film 15 such as a $SiO_2$ film having a thickness of for example 0.3 μm is formed on all the surface of the substrate by the CVD method, vacuum evaporating method, spattering method, or the like. The insulation film 15 serves to electrically insulate the substrate and protect the front surface of the substrate.

Thereafter, a resist pattern (not shown) that covers the front surface of the insulation film 15 excluding a p-type electrode forming region is formed by lithography.

Thereafter, with a mask of the resist pattern, the insulation film 15 is etched. As a result, an opening 15a is formed.

While the resist pattern is left, for example a Pd film, a Pt film, and an Au film are successively formed on all the surface of the substrate by the vacuum evaporating method. Thereafter, the resist pattern is removed from the substrate along with the Pd film, the Pt film, and the Au film formed on the resist pattern (lift-off process). As a result, a p-side electrode 16 that is in contact with the p-type contact layer 13 through the opening 15a of the insulation film 15 is formed. The thicknesses of the Pd film, the Pt film, and the Au film that compose the p-type electrode 16 are for example 10 nm, 100 nm, and 300 nm, respectively. Thereafter, an alloy process is performed for the substrate so as to ohmic-contact the p-side electrode 16 thereto.

Thereafter, for example a Ti film, a Pt film, and an Au film are successively formed on the rear surface of the GaN substrate 1 by for example vacuum evaporating method. As a result, an n-side electrode 17 having a Ti/Pt/Au structure is formed. The thicknesses of the Ti film, the Pt film, and the Au film that compose the n-side electrode 17 are for example 10 nm, 50 nm, and 100 nm, respectively. Thereafter, an alloy process is performed for the substrate so as to ohmic-contact the n-side electrode 17 thereto.

Figure 9:
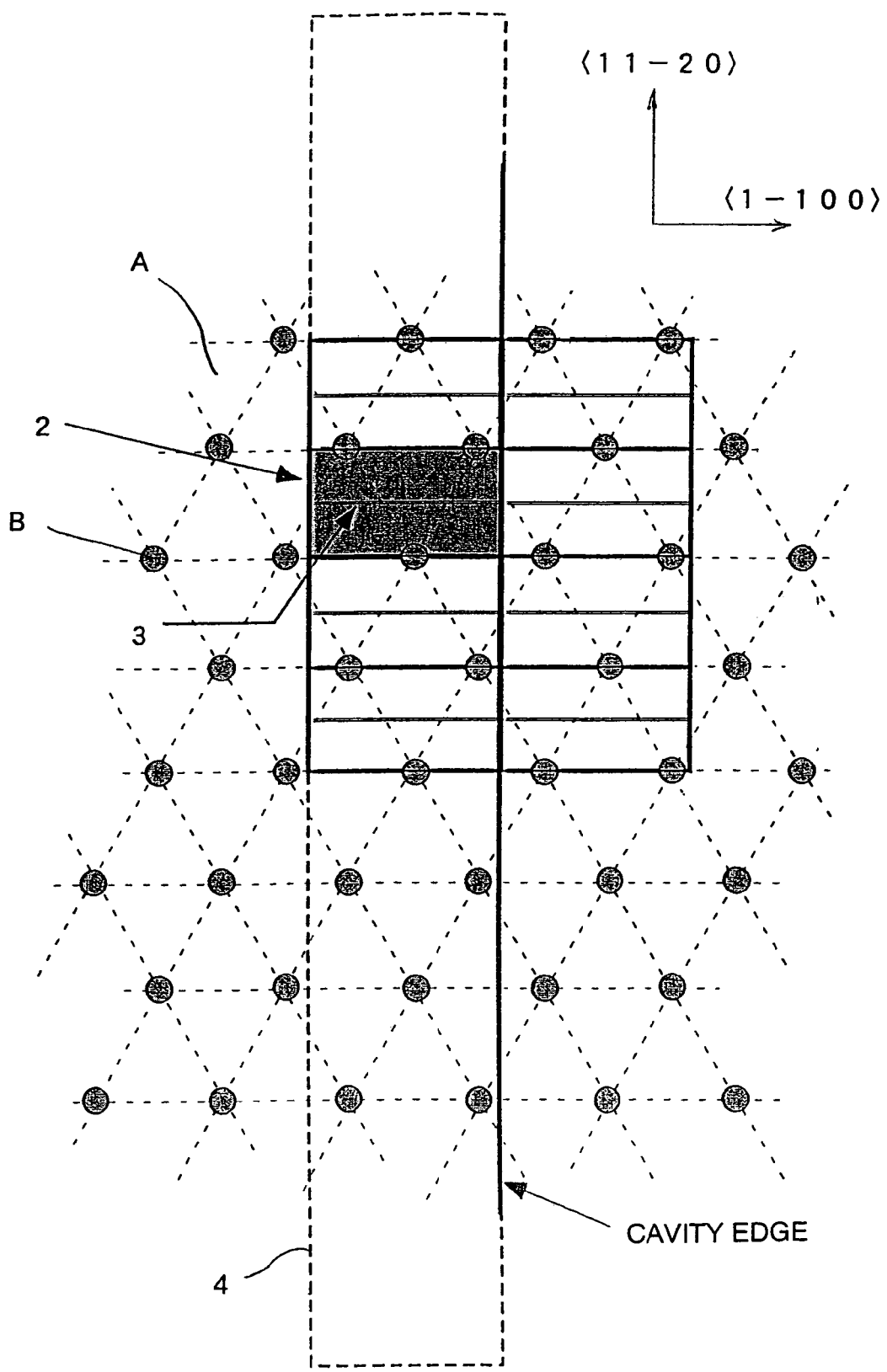
FIG. 9 is a plan view describing the method for producing the GaN type semiconductor laser according to the first embodiment of the present invention.

Thereafter, as shown in FIG. 9, the GaN substrate 1 on which the foregoing laser structure has been formed is scrubbed, for example, cleaved, along the contour lines of a device region 2 (one section surrounded by thick lines). As a result, a laser bar 4 having end planes of a resonator is formed. The end planes of the resonator are coated. Thereafter, the laser bar 4 is scrubbed, for example, cleaved, so as to obtain a chip.

In FIG. 9, one gray rectangle represents a GaN type semiconductor laser. A straight line drawn near the center of the gray rectangle represents a ridge 14, namely, a laser stripe 3. The ridge 14 accords with the position of a light emitting region. In addition, a rectangle illustrated by broken lines represents the laser bar 4. Longer sides of the laser bar 4 accord with the end planes of the resonator.

In the example shown in FIG. 9, the size of the GaN type semiconductor laser is for example 600 μm×346 μm. The substrate is scrubbed in the lateral direction (longer side direction) along a straight line that connects the regions B and in the lengthwise direction (shorter side direction) along a straight line that does not pass through the regions B. As a result, a GaN type semiconductor laser of the size is separated from the substrate.

In this case, since the regions B exist on the end planes of the longer sides of each GaN type semiconductor laser, when a device is designed so that the laser stripe 3 is positioned near a straight line that connects the center points of the shorter sides of the laser stripe 3, the light emitting region can be prevented from being affected by the regions B.

By scrubbing, for example, cleaving, the substrate along the straight line in the lengthwise direction shown in FIG. 9, mirrors of the resonator are formed on the end planes. Since the straight line does not pass through the regions B, the mirrors are not adversely affected by dislocations of the regions B. Thus, a GaN type semiconductor laser having good light emitting characteristics and good reliability can be obtained.

Figure 10:
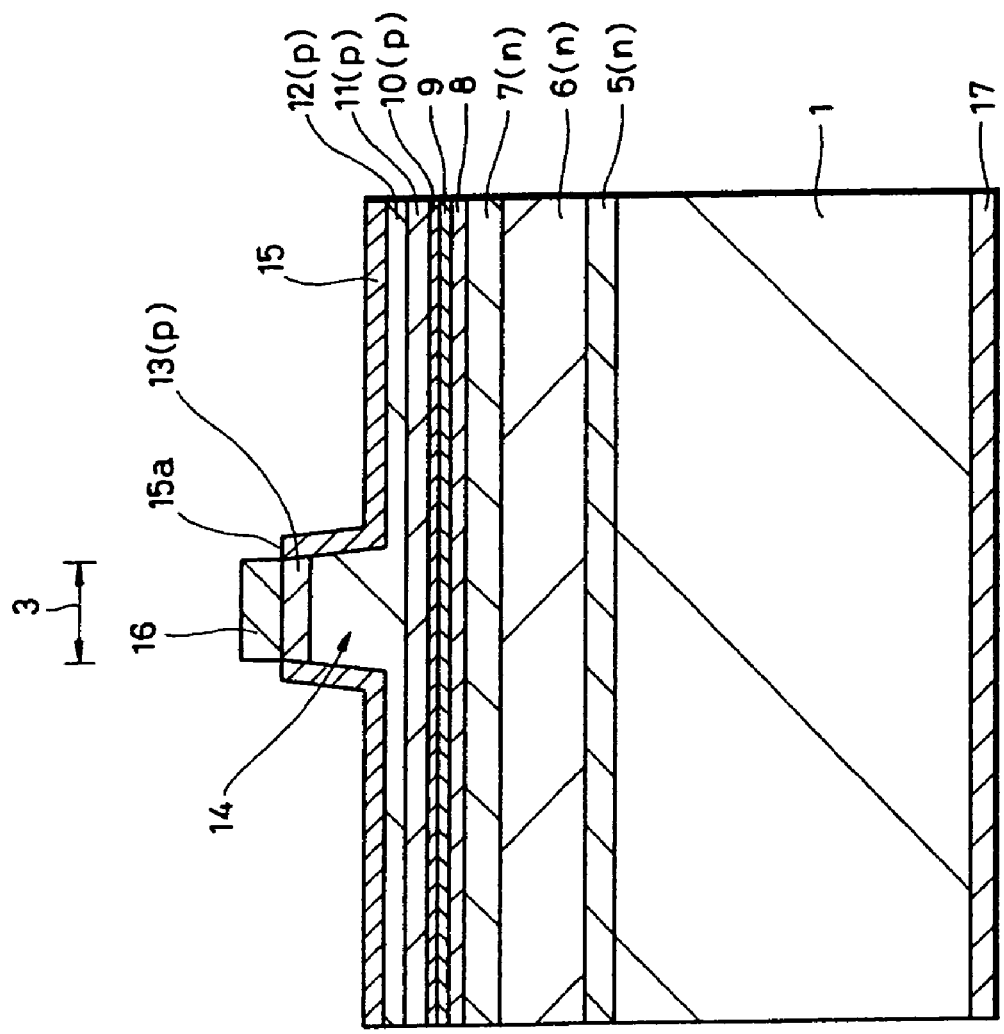
FIG. 10 is a sectional view describing the method for producing the GaN type semiconductor laser according to the first embodiment of the present invention.

Thus, as shown in FIG. 10, a GaN type semiconductor laser having desired ridge structure and SCH structure is produced.

As described above, according to the first embodiment, a GaN type semiconductor layer that forms a laser structure is grown on the GaN substrate 1 of which the regions B having a high average dislocation density are periodically arranged in a hexagonal lattice shape in the region A having a low average dislocation density. A ridge 14 is formed on the p-type GaN contact layer 13 and the p-type AlGaN clad layer 12 so that the ridge 14 does not pass through any one of regions B. As a result, the light emitting region of the GaN type semiconductor laser can be prevented from being adversely affected by the regions B. Thus, a GaN type semiconductor laser that has good light emitting characteristics, good reliability, and long life can be accomplished.

In addition, according to the first embodiment, the undoped InGaN deterioration protection layer 9 is disposed adjacent to the active layer 8. In addition, the p-type AlGaN cap layer 10 is disposed adjacent to the undoped InGaN deterioration protection layer 9. Thus, the undoped InGaN deterioration protection layer 9 can remarkably suppress a stress that takes place on the active layer 8 by the p-type AlGaN cap layer 10. In addition, the undoped InGaN deterioration protection layer 9 can effectively prevent Mg as a p-type dopant of a p-type layer from diffusing in the active layer 8.

Second Embodiment

Next, a second embodiment of the present invention will be described.

In the first embodiment, a structured substrate, which is unsmoothly formed, was described. The front surface of the structured substrate may be partly coated with a pattern made of an insulation film or the like. According to the second embodiment, a structured substrate of which a mask grown by the ELO, namely an ELO pattern, is formed on a GaN substrate 1 will be described.

Figure 11A:
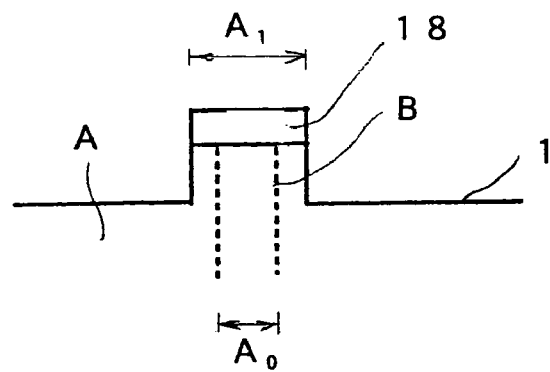
FIG. 11A, FIG. 11B, and FIG. 11C are sectional views showing structured substrates according to a second embodiment of the present invention.
Figure 11B:
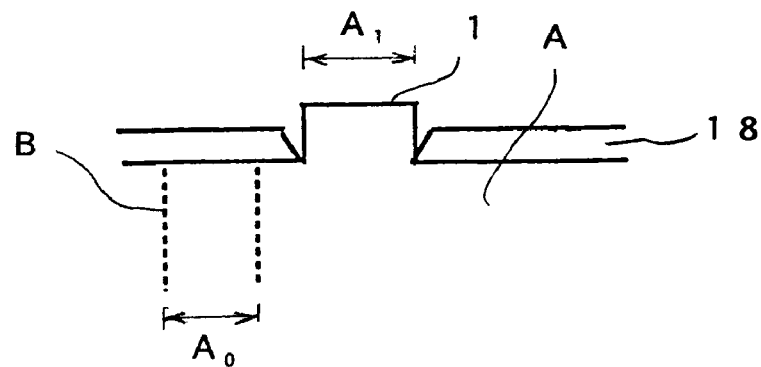
Figure 11C:
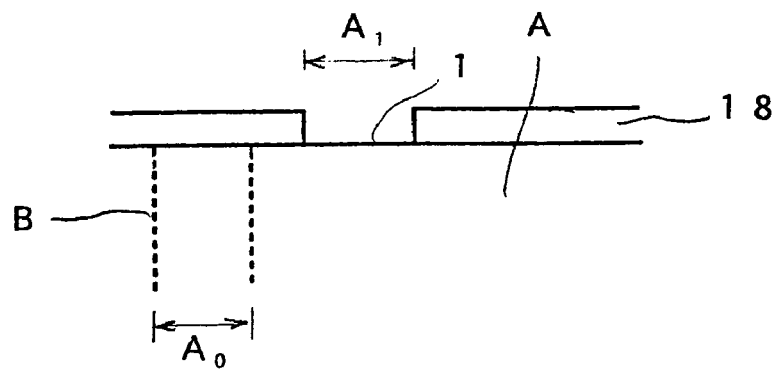

FIG. 11A, FIG. 11B, and FIG. 11C show three examples of structured substrates. FIG. 11A shows an example of which an ELO pattern made of an insulation film 18 such as a $SiO_2$ film is formed in a stripe shape that extends in a <1-100> direction in such a manner that the insulation film 18 coats a region B on the principal plane of the GaN substrate 1. With the insulation film 18 as a mask, an upper portion of the GaN substrate 1 is etched for a predetermined depth. In this case, as with the first embodiment, the arrangement direction of the region B is matched with the direction in which the ELO pattern extends and the relation of a=nb is satisfied. In the example shown in FIG. 11B, an upper portion of the GaN substrate 1 is formed in a stripe shape that extends in the <1-100> direction. An insulation film 18 such as a $SiO_2$ film is formed on the GaN substrate 1 in such a manner that the insulation film 18 coats the region B. In this case, as with the first embodiment, the arrangement direction of the region B is matched with the direction in which the ELO pattern extends and the relation of a=nb is satisfied. In the example-shown in FIG. 1C, a insulation film 18 such as a $SiO_2$ film that has an opening in a stripe shape that extends in the <1-100> direction is formed on the principal plane of the GaN substrate 1 in such a manner that the insulation film 18 coats the region B. In this case, as with the first embodiment, the arrangement direction of the region B is matched with the direction in which the ELO pattern extends and the relation of a=nb is satisfied.

In the examples shown in FIG. 11A, FIG. 11B, and FIG. 11C, when the relation of $A_1 \geq A_0$ is satisfied where $A_0$ represents the diameter of the region B and $A_1$ represents the width of the ELO pattern, the region B can be formed below the insulation film 18 on all the surface of the substrate. When a GaN type semiconductor layer is laterally grown by the ELO on the structured substrate, in accordance with the theory of the ELO, since crystal defects of the region B do not propagate to a growth layer that is coated with the insulation film 18, a good GaN type semiconductor layer can be grown on all the surface of the substrate.

When there is a relation of $A_1 \leq A_0$, all the surface of the region B cannot be coated with the insulation film 18. However, in comparison with the case that the insulation film 18 is formed at any position on the GaN substrate 1, the crystal quality of the growth layer can be improved.

The period b of the ELO patterns is generally around several to 20 μm and the period 2a of the regions B is generally around 100 to 1000 μm. Because of these relations, although the case of b=na is not shown, when there were an ELO pattern that satisfies them, it would be included.

When a GaN type semiconductor laser according to the first embodiment is produced with the structured substrate, an n-type GaN layer is grown for a sufficient thickness on for example one of the structured substrates shown in FIG. 11A, FIG. 11B, and FIG. 11C by the ELO. Thereafter, a GaN type semiconductor layer that forms a laser structure is grown on the n-type GaN layer.

Except for the foregoing portion, the second embodiment is the same as the first embodiment. Thus, the description of the other portions of the second embodiment is omitted.

According to the second embodiment, the same advantage as the first embodiment can be obtained.

Third Embodiment

Next, a third embodiment of the present invention will be described.

According to the first embodiment and the second embodiment, a region B of the GaN substrate 1 is arranged at the vertex of a closest-packed regular triangle.

When a structured substrate is produced or a device is formed thereon, a structure or device should be patterned in such a manner that the orientation thereof accords with the arrangement of the regions B. The patterning process includes a resist exposing step. When the resist is exposed, an alignment mark is required to align a mask. Thus, according to the third embodiment, an alignment mark forming method and a mask aligning method will be described.

In other words, since the GaN substrate 1 is transparent, a boundary of a seed crystal as a source of a region B and a bulk growth layer can be visually observed through the GaN substrate 1 by an optical microscope or the like. The arrangement of the region B can be detected from the outside. Thus, using the region B, the mask can be aligned.

However, when regions B are periodically formed on all the surface of the substrate, the orientation of a straight line that connects the regions B may be mistakenly obtained. Thus, regions B that deviate by for example one row may be selected.

Figure 12:
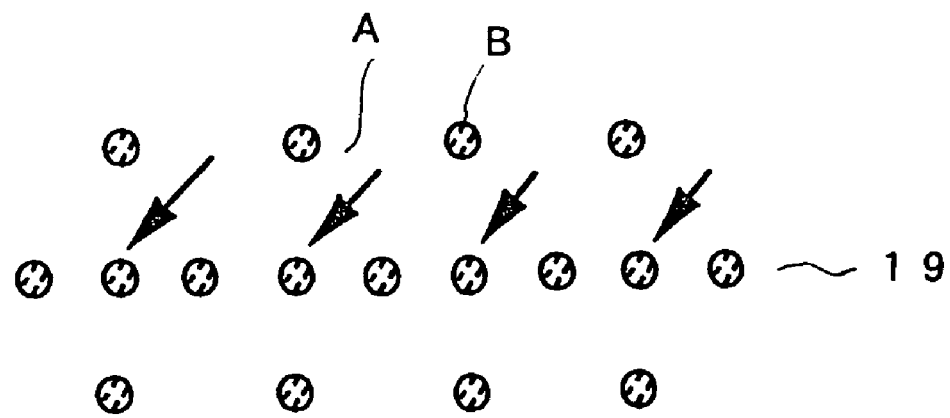
FIG. 12 is a plan view showing a GaN substrate according to a third embodiment of the present invention.
Figure 13:
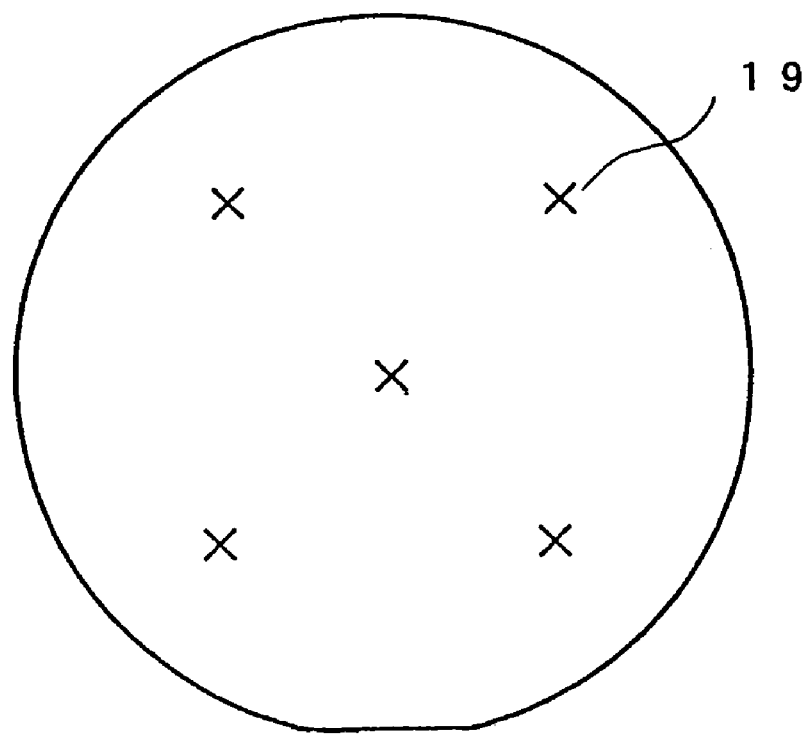
FIG. 13 is a plan view showing the GaN substrate according to the third embodiment of the present invention.

Thus, according to the third embodiment, as shown in FIG. 12, the regions B are not periodically arranged on all the surface of the GaN substrate 1. For example, the interval of regions B of a particular row is halved for a predetermined length (the density of regions B is doubled). This portion is used as an alignment mark 19 that represents an orientation. In FIG. 12, regions B that have been added to the example shown in FIG. 2 are represented by arrows.

When the GaN substrate 1 is grown from a crystal seed, if the interval of regions B is too large, grown layers do not properly combine. However, when the interval of regions B of a particular row is narrowed as shown in FIG. 12, such a problem does not take place.

Alignment marks 19 as shown in FIG. 12 are formed at a plurality of (for example, five) positions on the GaN substrate 1.

When a resist is exposed in a patterning process for a structured substrate or a device that is formed thereon, a mask can be accurately aligned with the alignment marks 19.

It is clear that the alignment marks 19 can be used for defining coordinates of the substrate as well as aligning an orientation.

Except for the foregoing portion, the third embodiment is the same as the first embodiment. Thus, the description of the other portions of the third embodiment is omitted.

According to the third embodiment, in addition to the same advantage as the first embodiment, a mask can be highly accurately aligned in an exposing step for a structured substrate and a device formed thereon.

Fourth Embodiment

Next, a fourth embodiment of the present invention will be described.

Figure 14:
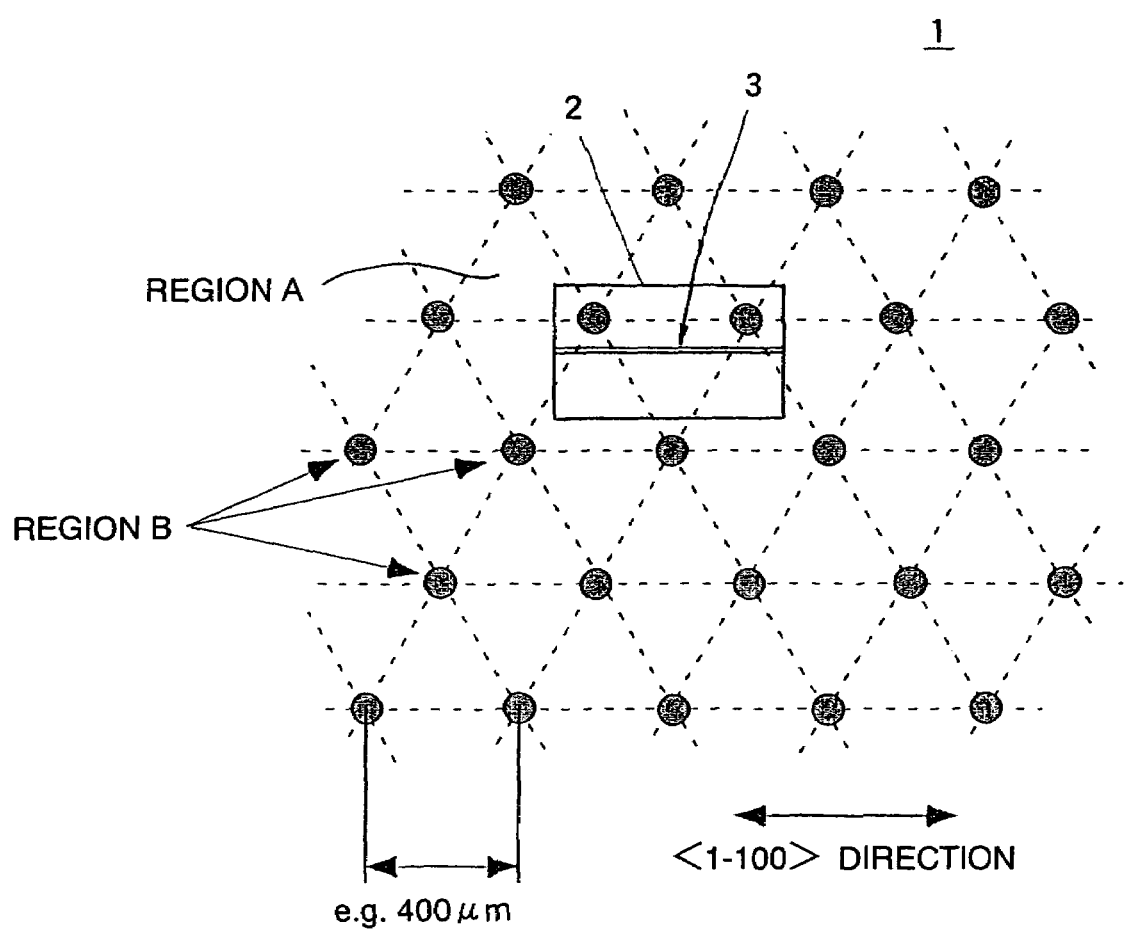
FIG. 14 is a plan view describing a method for producing a GaN type semiconductor laser according to a fourth embodiment of the present invention.

FIG. 14 is a plan view showing a GaN substrate according to the fourth embodiment. As shown in FIG. 14, according to the fourth embodiment, a device region 2 is confined so that regions B are not contained in a laser stripe 3. In this case, the laser stripe 3 is spaced apart from each of the regions B by 50 μm or greater. In this case, the device region 2 contains two regions B.

Except for the foregoing portion, the fourth embodiment is the same as the first embodiment. Thus, the description of the other portions of the fourth embodiment is omitted.

According to the fourth embodiment, the same advantage as the first embodiment can be obtained.

Fifth Embodiment

Next, a fifth embodiment of the present invention will be described.

Figure 15:
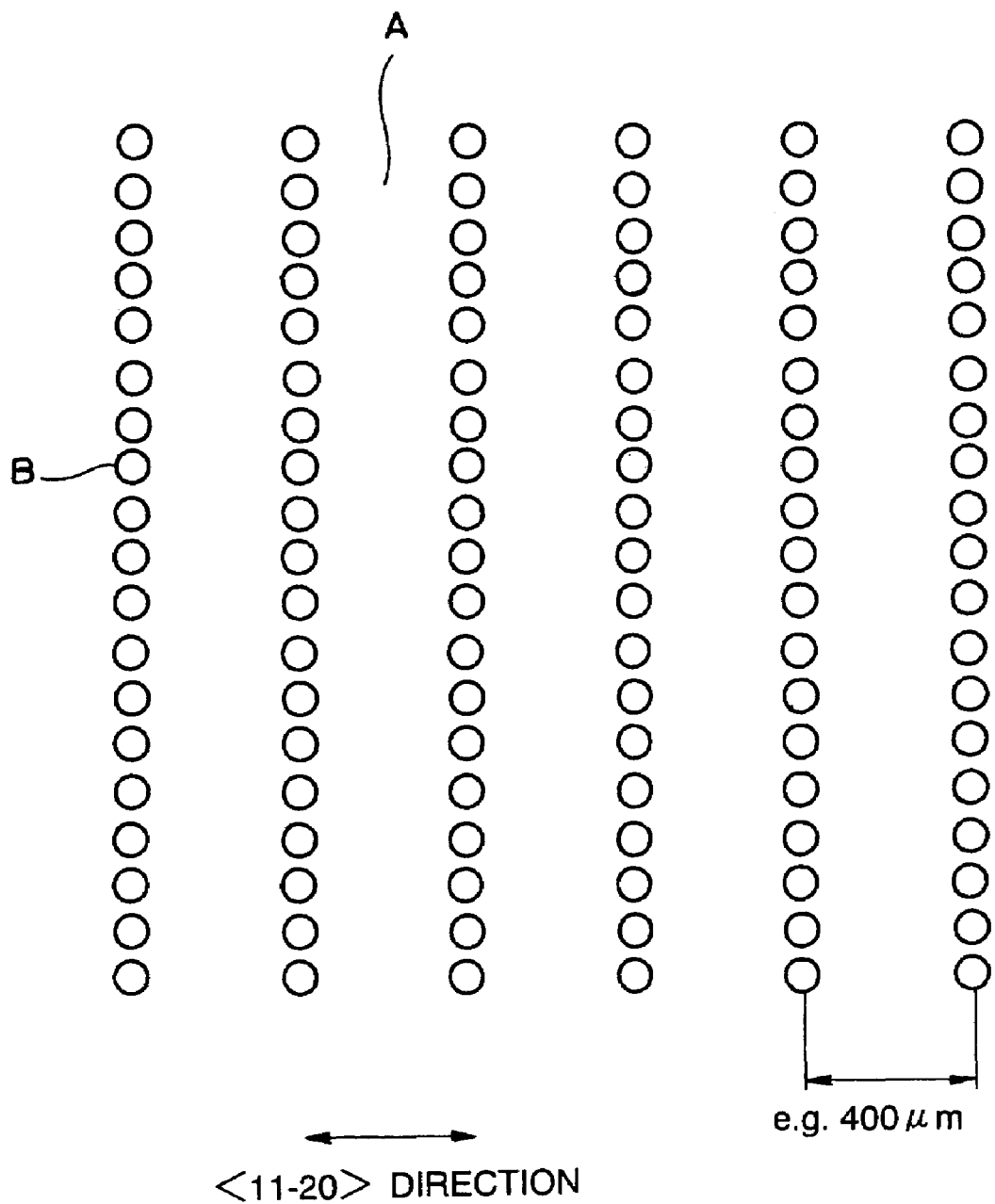
FIG. 15 is a plan view describing a method for producing the GaN type semiconductor laser according to fourth embodiment of the present invention.

FIG. 15 is a plan view showing a GaN substrate according to the fifth embodiment. The GaN substrate 1 is an n-type semiconductor and has a C plane orientation. Alternatively, the GaN substrate 1 may have an R plane orientation, an A plane orientation, or an M plane orientation. In the GaN substrate 1, regions B made of a crystal having a high average dislocation density are periodically arranged in a <11-20> direction of GaN at an interval of for example 400 μm and at an interval of for example 20 to 100 μm in a <1-100> direction that is perpendicular to the <11-20> direction in a region A made of a crystal having a low average dislocation density. Alternatively, the <11-20> direction may be substituted for the direction <1-100>.

Figure 16:
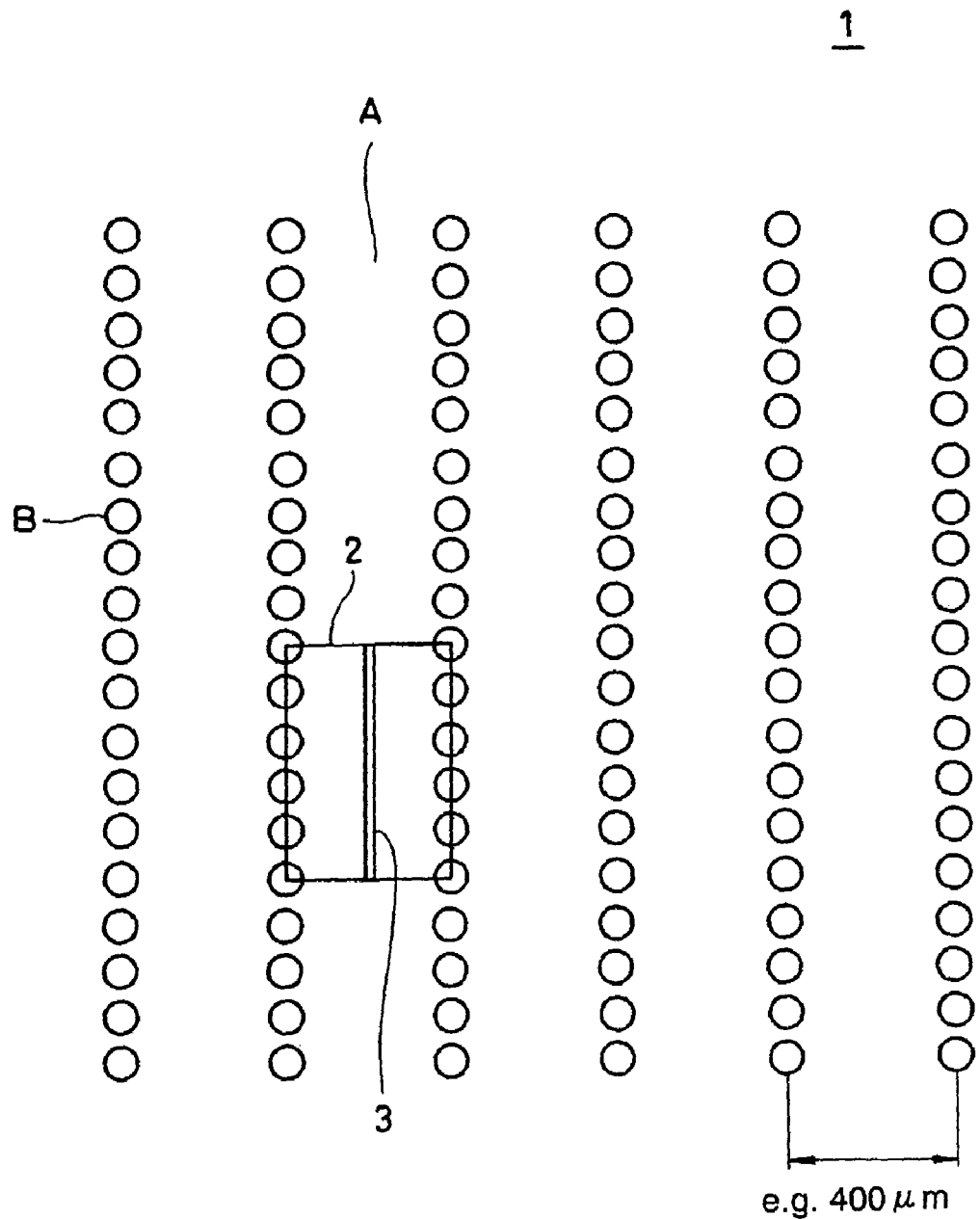
FIG. 16 is a plan view describing a method for producing a GaN type semiconductor laser according to a fifth embodiment of the present invention.

According to the fifth embodiment, as shown in FIG. 16, a device region 2 is confined so that a pair of end planes that are in parallel with a laser stripe 3 pass through a row of regions B in the <1-100> direction and that a laser stripe 3 is positioned near the center of a region between two rows of the regions B. In this case, the device region 2 does not substantially contain rows of the regions B.

Except for the foregoing portion, the fifth embodiment is the same as the first embodiment. Thus, the description of the other portions of the fifth embodiment is omitted.

According to the fifth embodiment, the same advantage as the first embodiment can be obtained.

Sixth Embodiment

Next, a sixth embodiment of the present invention will be described.

Figure 17:
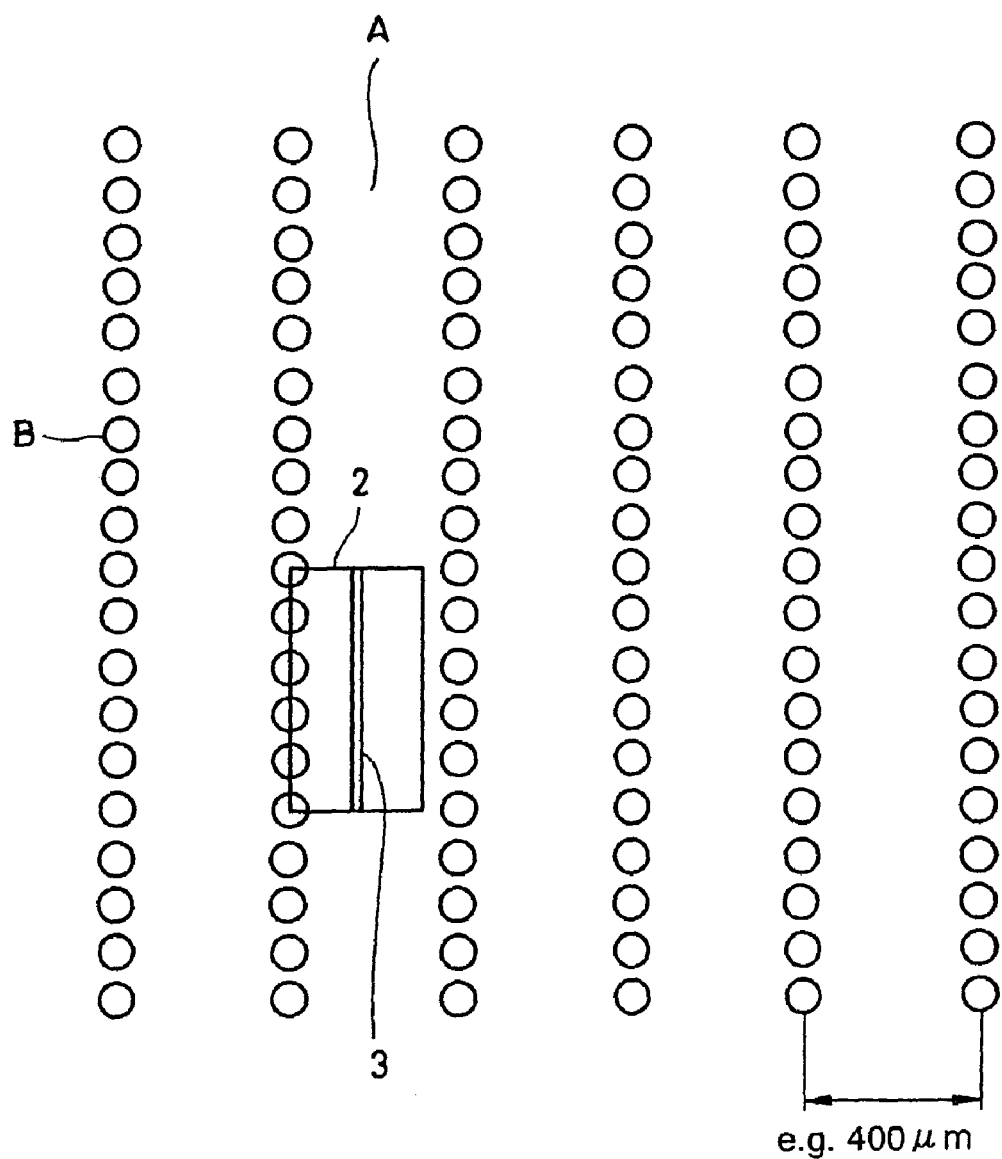
FIG. 17 is a plan view describing a method for producing a GaN type semiconductor laser according to a sixth embodiment of the present invention.

As shown in FIG. 17, according to the sixth embodiment, a GaN substrate 1 that is the same as the fifth embodiment is used. However, unlike with the fifth embodiment, one end plane that is in parallel with a laser stripe 3 passes through a row of regions B in a <1-100> direction. Another end plane passes through a position that is apart from a row of the regions B. In this case, a device region 2 does not substantially contain a row of the regions B.

Except for the foregoing portion, the sixth embodiment is the same as the first embodiment. Thus, the description of the other portions of the sixth embodiment is omitted.

According to the sixth embodiment, the same advantage as the first embodiment can be obtained.

Seventh Embodiment

Next, a seventh embodiment of the present invention will be described.

Figure 18:
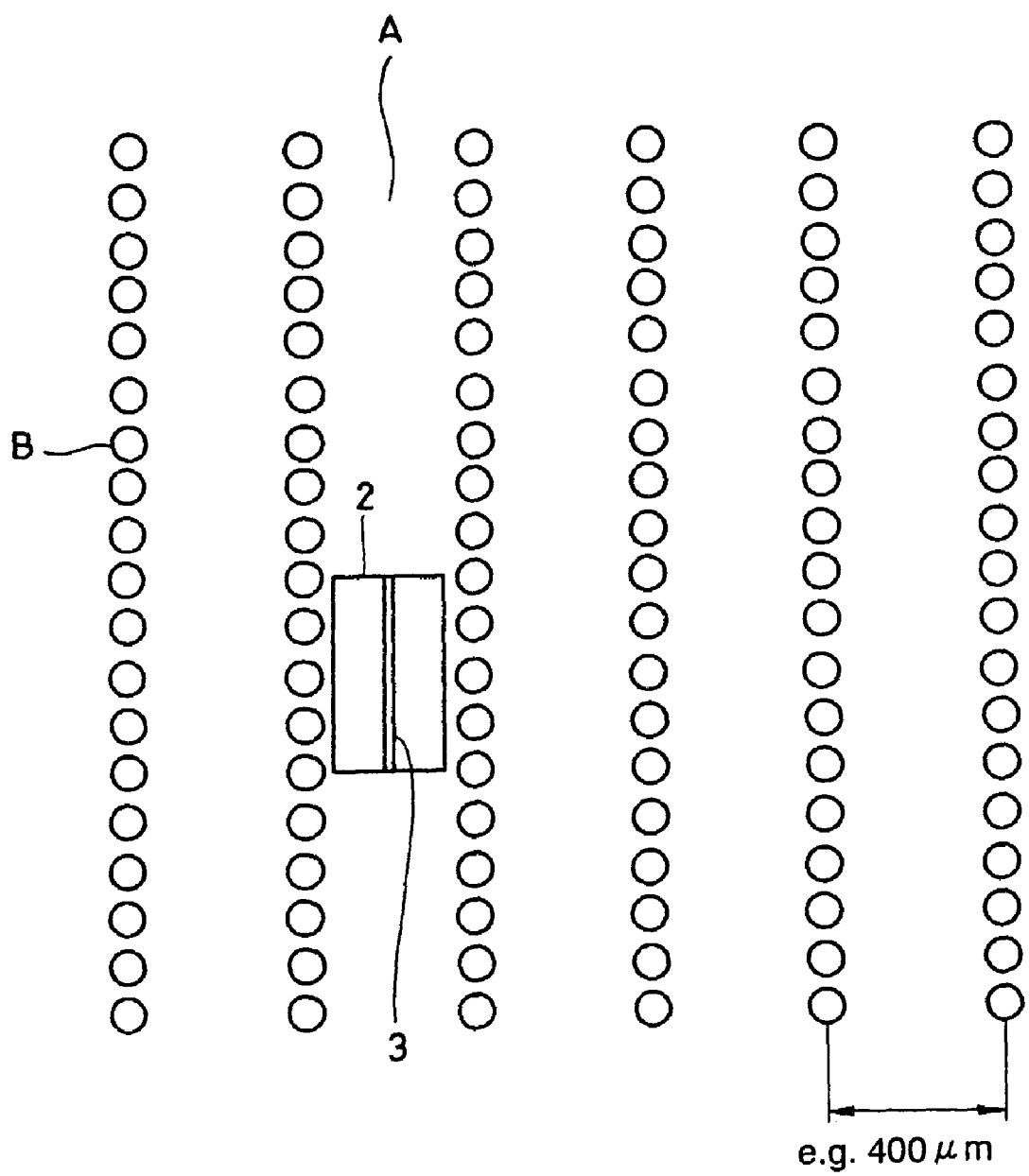
FIG. 18 is a plan view describing a method for producing a GaN type semiconductor laser according to a seventh embodiment of the present invention.

As shown in FIG. 18, according to the seventh embodiment, a GaN substrate 1 that is the same as the fifth embodiment is used. However, unlike with the fifth embodiment, according to the seventh embodiment, a device region 2 is confined so that a pair of end planes of a laser stripe 3 are positioned between two rows of regions B in a <1-100> direction and that a laser stripe 3 is positioned near the center of a region between the two rows of the regions B. In this case, the device region 2 does not substantially contain the rows of the regions B.

Except for the foregoing portion, the seventh embodiment is the same as the fifth embodiment and the first embodiment. Thus, the description of the other portions of the seventh embodiment is omitted.

According to the seventh embodiment, the same advantage as the first embodiment can be obtained.

Eighth Embodiment

Next, an eighth embodiment of the present invention will be described.

Figure 19:
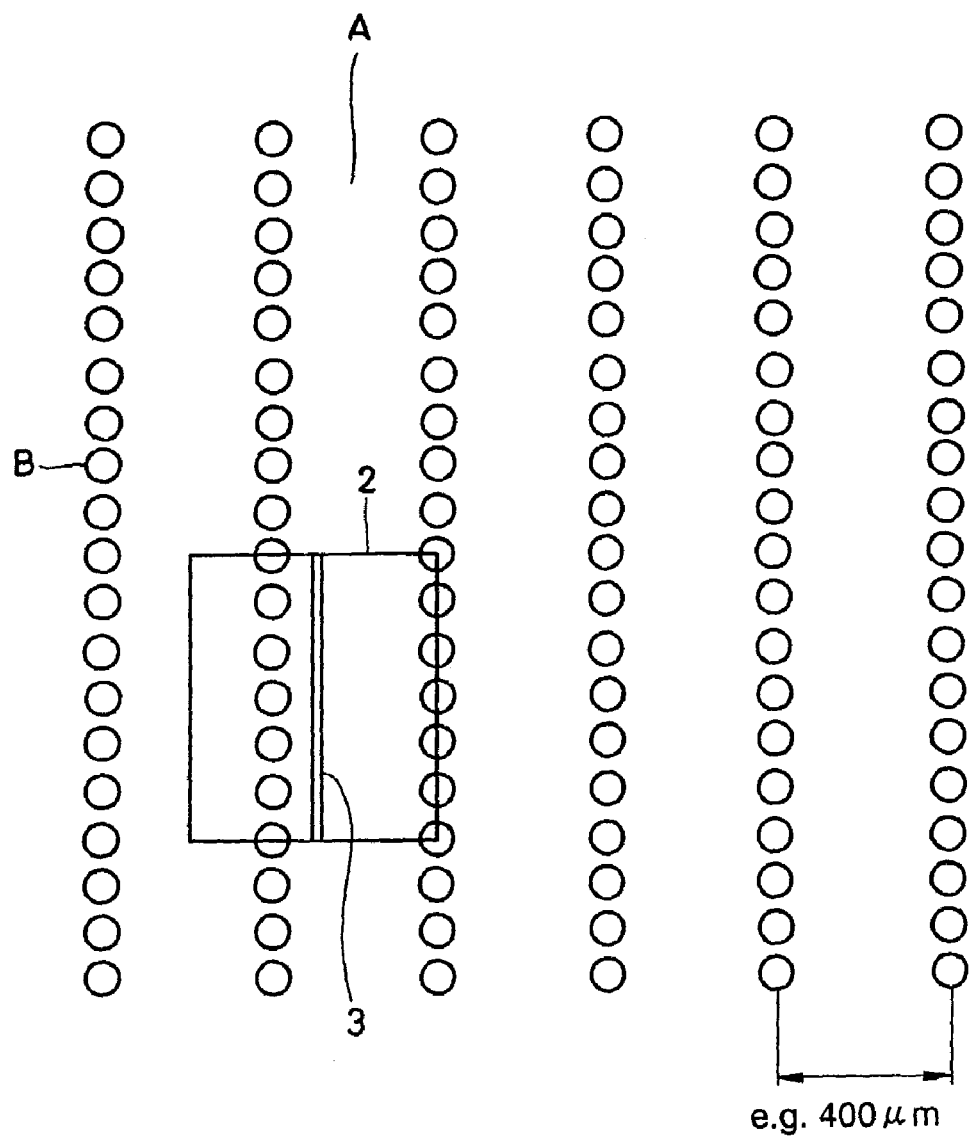
FIG. 19 is a plan view describing a method for producing a GaN type semiconductor laser according to an eighth embodiment of the present invention.

As shown in FIG. 19, according to the eighth embodiment, a GaN substrate 1 that is the same as the fifth embodiment is used. However, unlike with the fifth embodiment, one end plane that is in parallel with a laser stripe 3 passes through a row of regions B in a <1-100> direction and that another end plane is positioned between the adjacent two rows of regions B and that a laser stripe 3 passes through a position spaced apart from the, row of regions B through which the one end plane passes by 50 µm or greater. In this case, the device region 2 contains one row of regions B.

Except for the foregoing portion, the eighth embodiment is the same as the fifth embodiment and the first embodiment. Thus, the description of the other portions of the eighth embodiment is omitted.

According to the eighth embodiment, the same advantage as the first embodiment can be obtained.

Ninth Embodiment

Next, a ninth embodiment of the present invention will be described.

Figure 20:
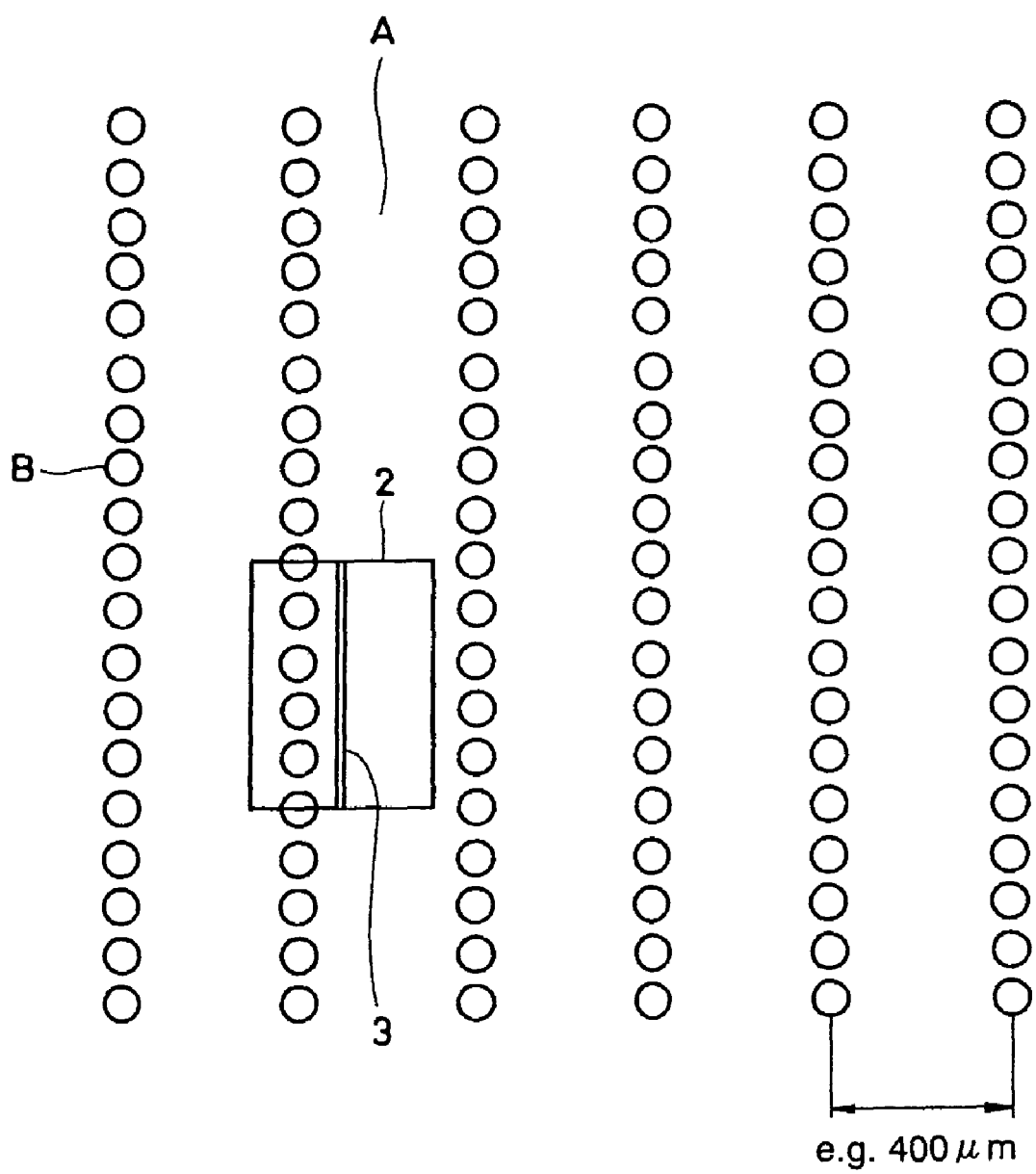
FIG. 20 is a plan view describing a method for producing a GaN type semiconductor laser according to a ninth embodiment of the present invention.

As shown in FIG. 20, according to the ninth embodiment, a GaN substrate 1 that is the same as the fifth embodiment is used. However, unlike with the fifth embodiment, one end plane that is in parallel with a laser stripe 3 passes through a position that is apart from a row of regions B in a <1-100> direction. Another end plane passes through a position between the adjacent two rows of regions B. A laser stripe 3 passes through a position spaced apart from the row of regions B by 50 µm or greater. In this case, a device region 2 contains one row of regions B.

Except for the foregoing portion, the ninth embodiment is the same as the fifth embodiment and the first embodiment. Thus, the description of the other portions of the ninth embodiment is omitted.

According to the ninth embodiment, the same advantage as the first embodiment can be obtained.

Tenth Embodiment

Next, a tenth embodiment of the present invention will be described.

Figure 21:
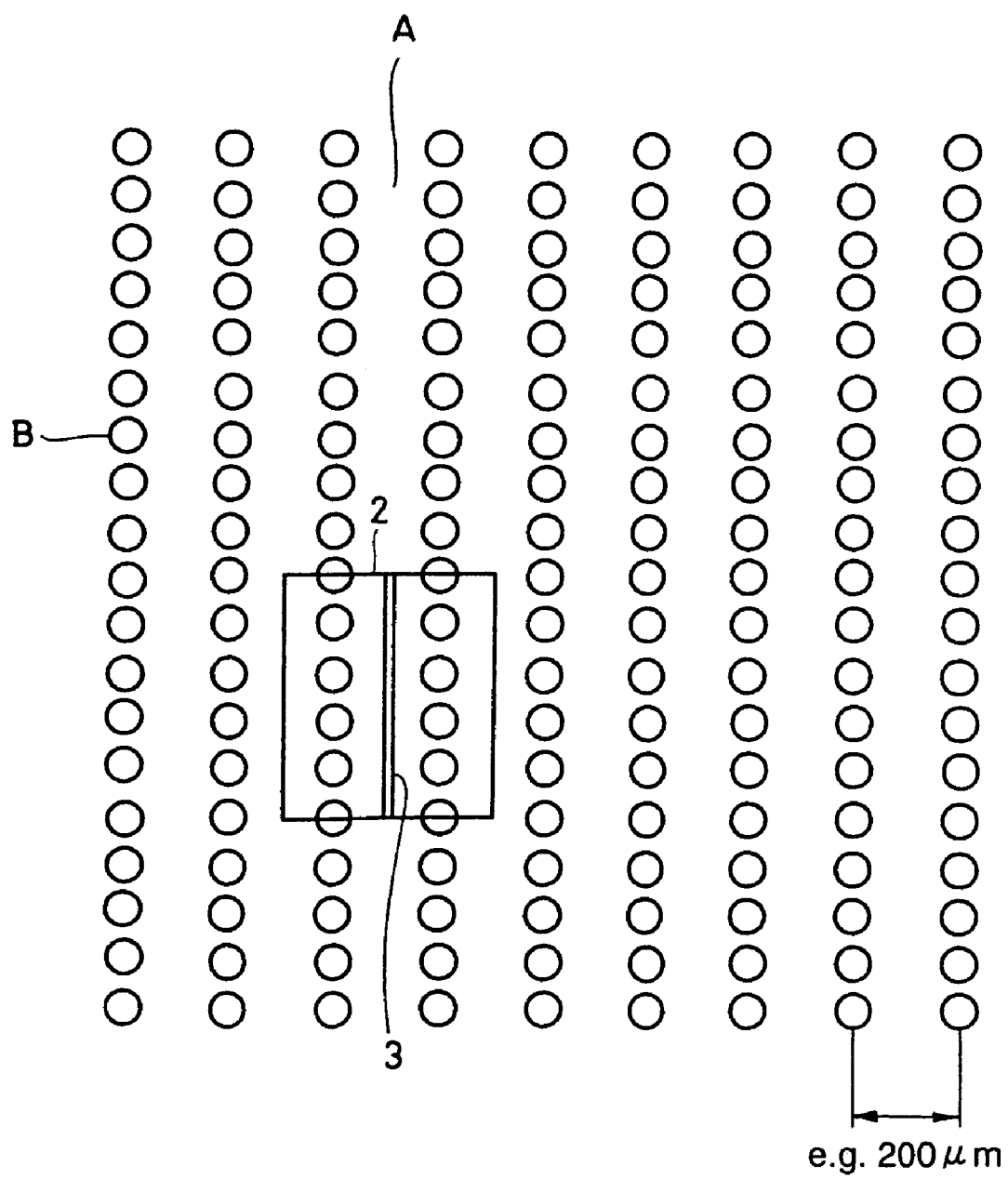
FIG. 21 is a plan view describing a method for producing a GaN type semiconductor laser according to a tenth embodiment of the present invention.

FIG. 21 is a plan view showing a GaN substrate 1 according to the tenth embodiment. The GaN substrate 1 according to the tenth embodiment is the same as the tenth embodiment except that regions B are periodically arranged at an interval of for example 200 µm in a <11-20> orientation of GaN. In this case, a device region 2 contains two rows of regions B.

As shown in FIG. 21, according to the tenth embodiment, a laser stripe 3 is positioned near the center of adjacent rows of regions B. A pair of end planes that are in parallel with the laser stripe 3 are positioned near the centers of regions between two adjacent rows of regions B on the right and left of the laser stripe 3.

Except for the foregoing portion, the tenth embodiment is the same as the fifth embodiment and the first embodiment. Thus, the description of the other portions of the tenth embodiment is omitted.

According to the tenth embodiment, the same advantage as the first embodiment can be obtained.

Eleventh Embodiment

Next, an eleventh embodiment of the present invention will be described.

Figure 22:
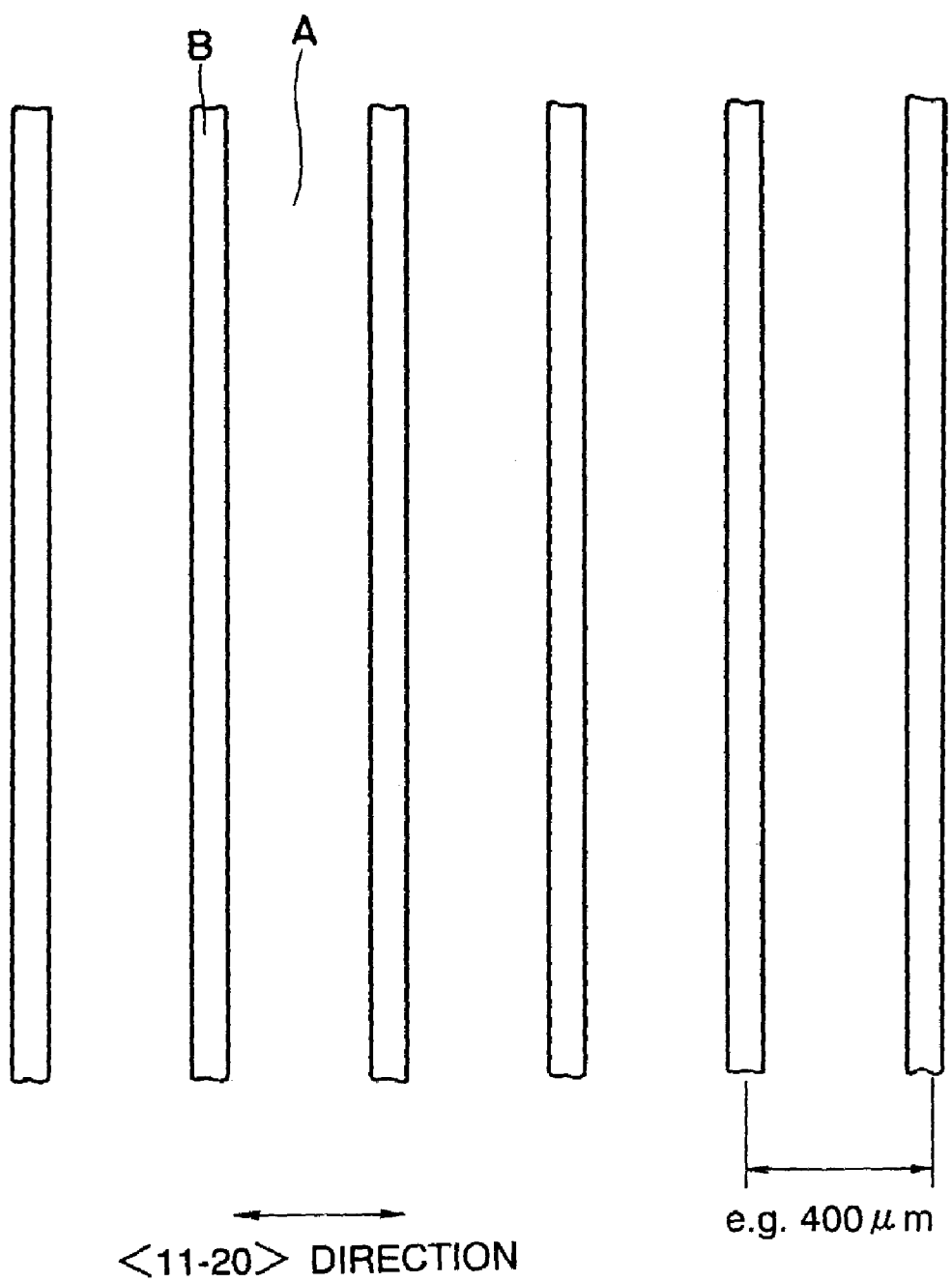
FIG. 22 is a plan view describing a method for producing a GaN type semiconductor laser according to an eleventh embodiment of the present invention.

FIG. 22 is a plan view showing a GaN substrate according to the eleventh embodiment. The GaN substrate 1 is an n-type semiconductor and has a C plane orientation. Alternatively, the GaN substrate 1 may have an R plane orientation, an A plane orientation, or an M plane orientation. In the GaN substrate 1, regions B that are made of a crystal having a high average dislocation density and that linearly extend in a <1-100> direction of GaN are periodically arranged at an interval of for example 400 µm in a <11-20> orientation perpendicular to the <1-100> direction in a region A made of a low average dislocation density . Alternatively, the <1-100> direction may be substituted for the <11-20> orientation.

Figure 23:
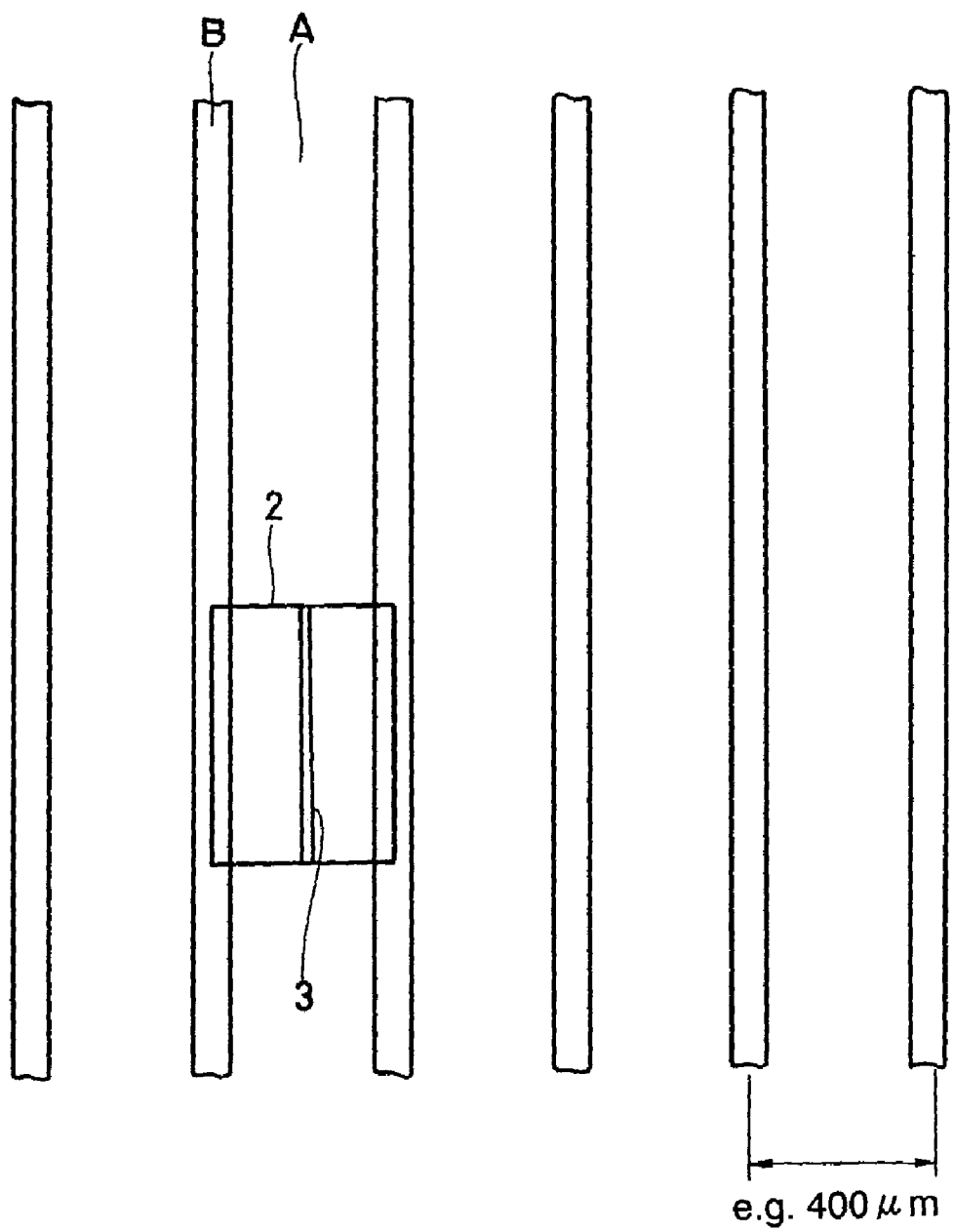
FIG. 23 is a plan view describing the method for producing the GaN type semiconductor laser according to the eleventh embodiment of the present invention.

According to the eleventh embodiment, as shown in FIG. 23, a device region 2 is confined so that a pair of end planes that are in parallel with a laser stripe 3 pass through regions B and that the laser stripe 3 is positioned near the center of a region between the regions B. In this case, the device region 2 does not substantially contain regions B.

Except for the foregoing portion, the eleventh embodiment is the same as the first embodiment. Thus, the description of the other portions of the eleventh embodiment is omitted.

According to the eleventh embodiment, the same advantage as the first embodiment can be obtained.

Twelfth Embodiment

Next, a twelfth embodiment of the present invention will be described.

Figure 24:
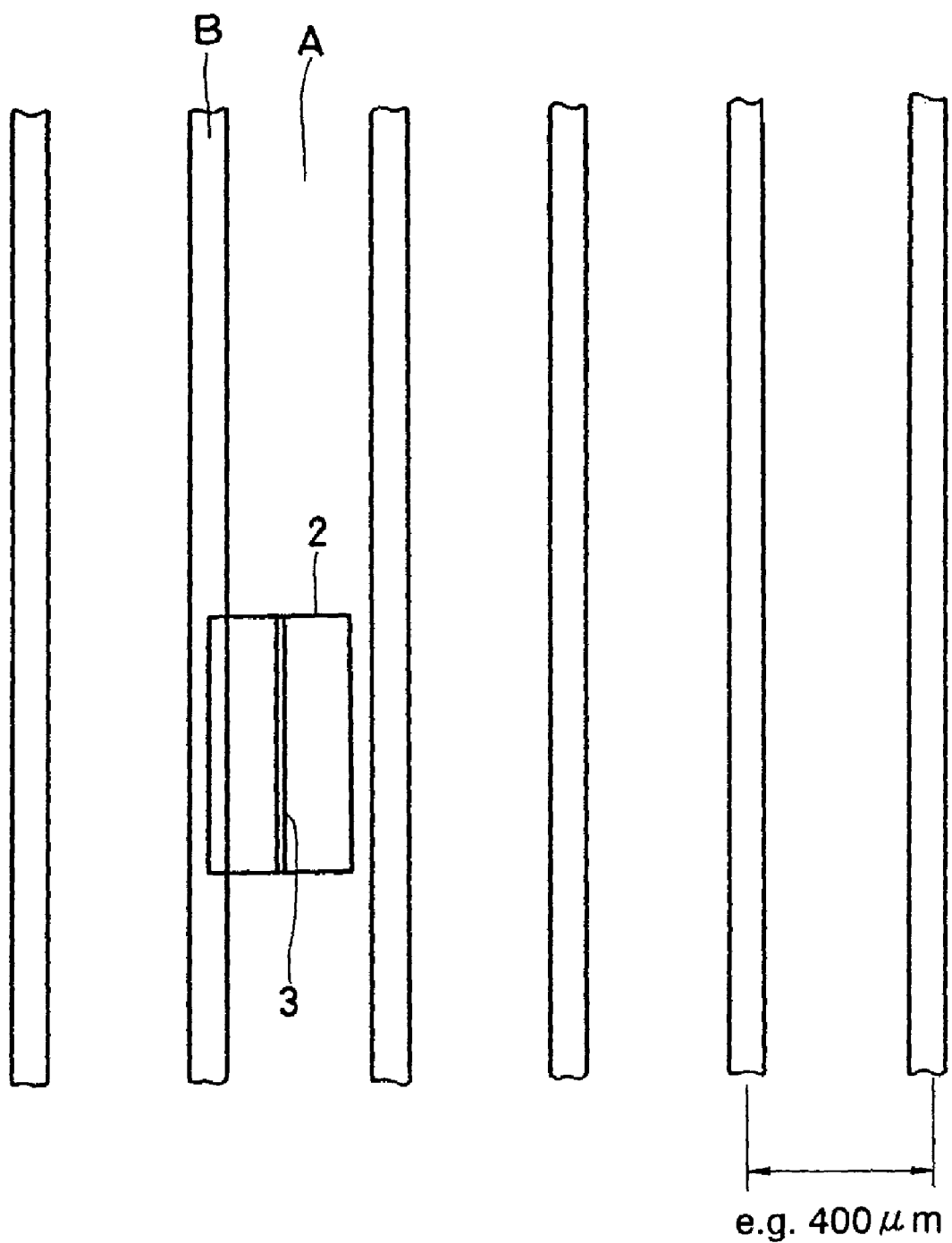
FIG. 24 is a plan view describing a method for producing a GaN type semiconductor laser according to a twelfth embodiment of the present invention.

As shown in FIG. 24, according to the twelfth embodiment, a GaN substrate 1 that is the same as the eleventh embodiment is used. However, unlike with the eleventh embodiment, one end plane that is in parallel with a laser stripe 3 passes through a region B. Another end plane passes through a position apart from a region B. In this case, a device region 2 does not substantially contain a region B.

Except for the foregoing portion, the twelfth embodiment is the same as the eleventh embodiment and the first embodiment. Thus, the description of the other portions of the twelfth embodiment is omitted.

According to the twelfth embodiment, the same advantage as the first embodiment can be obtained.

Thirteenth Embodiment

Next, a thirteenth embodiment of the present invention will be described.

Figure 25:
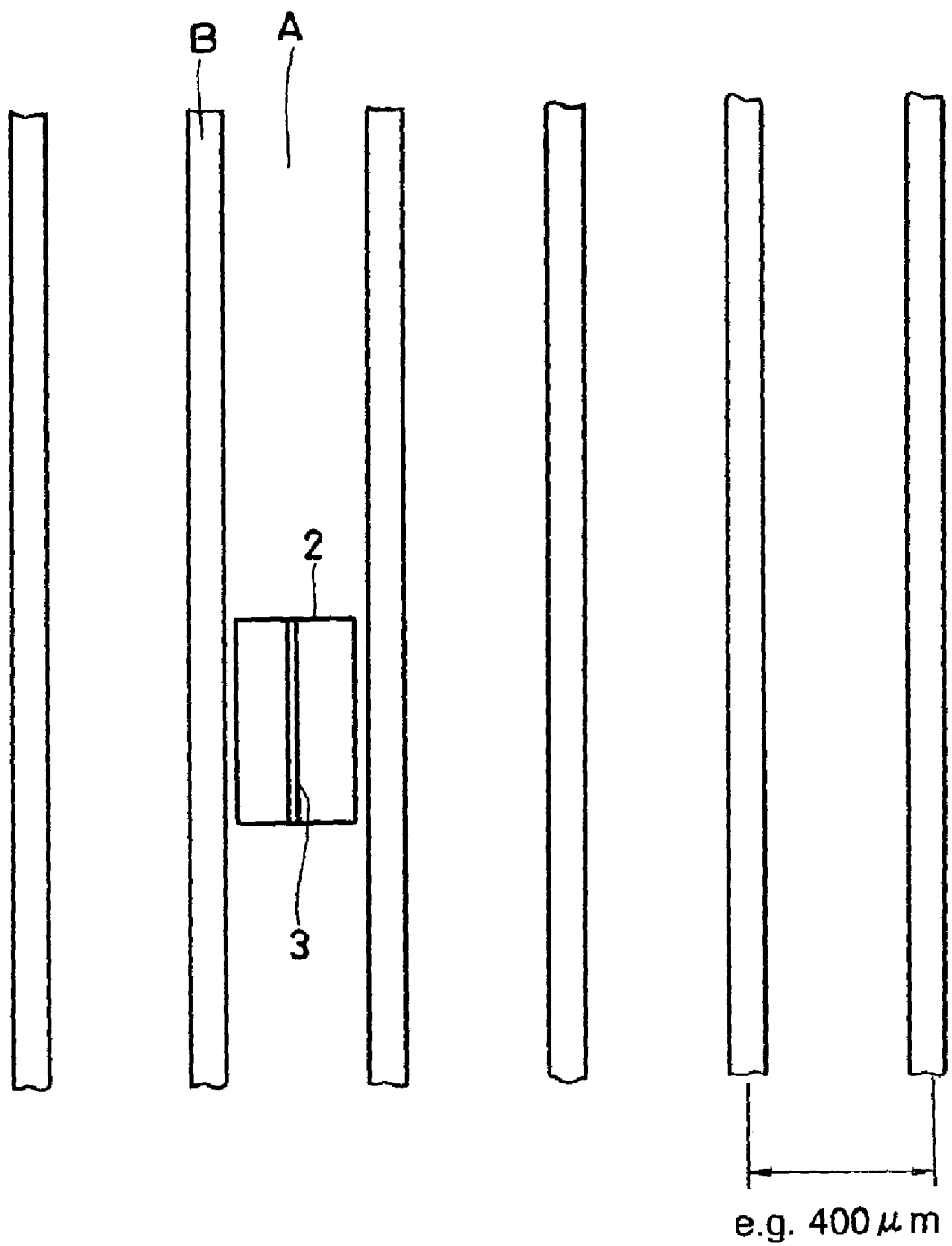
FIG. 25 is a plan view describing a method for producing a GaN type semiconductor laser according to a thirteenth embodiment of the present invention.

As shown in FIG. 25, according to the thirteenth embodiment, a GaN substrate 1 that is the same as the eleventh embodiment is used. However, unlike with the eleventh embodiment, a device region 2 is confined so that a pair of end planes that are in parallel with a laser stripe 3 are positioned between regions B. The laser stripe 3 is positioned near the center of a region between the regions B. In this case, a device region 2 does not substantially contain the regions B.

Except for the foregoing portion, the thirteenth embodiment is the same as the eleventh embodiment and the first embodiment. Thus, the description of the other portions of the thirteenth embodiment is omitted.

According to the thirteenth embodiment, the same advantage as the first embodiment can be obtained.

Fourteenth Embodiment

Next, a fourteenth embodiment of the present invention will be described.

Figure 26:
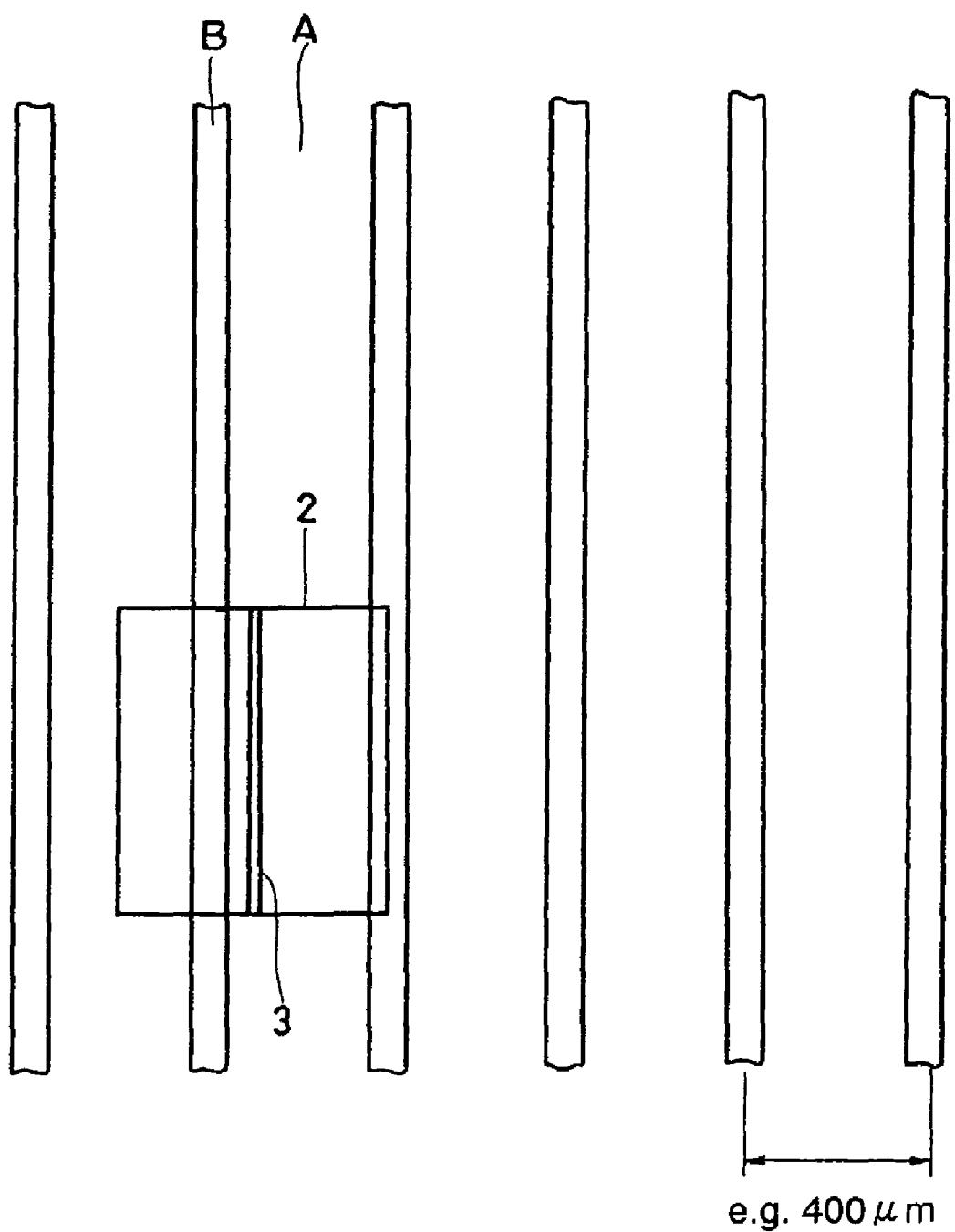
FIG. 26 is a plan view describing a method for producing a GaN type semiconductor laser according to a fourteenth embodiment of the present invention.

As shown in FIG. 26, according to the fourteenth embodiment, a GaN substrate 1 that is the same as the eleventh embodiment is used. However, unlike with the eleventh embodiment, one end plane that is in parallel with a laser stripe 3 passes through a region B. Another end plane is positioned between the adjacent regions B. The laser stripe 3 passes through a position apart from the region B by 50 μm or greater. In this case, a device region 2 contains one region B.

Except for the foregoing portion, the fourteenth embodiment is the same as the eleventh embodiment and the first embodiment. Thus, the description of the other portions of the fourteenth embodiment is omitted.

According to the fourteenth embodiment, the same advantage as the first embodiment can be obtained.

Fifteenth Embodiment

Next, a fifteenth embodiment of the present invention will be described.

Figure 27:
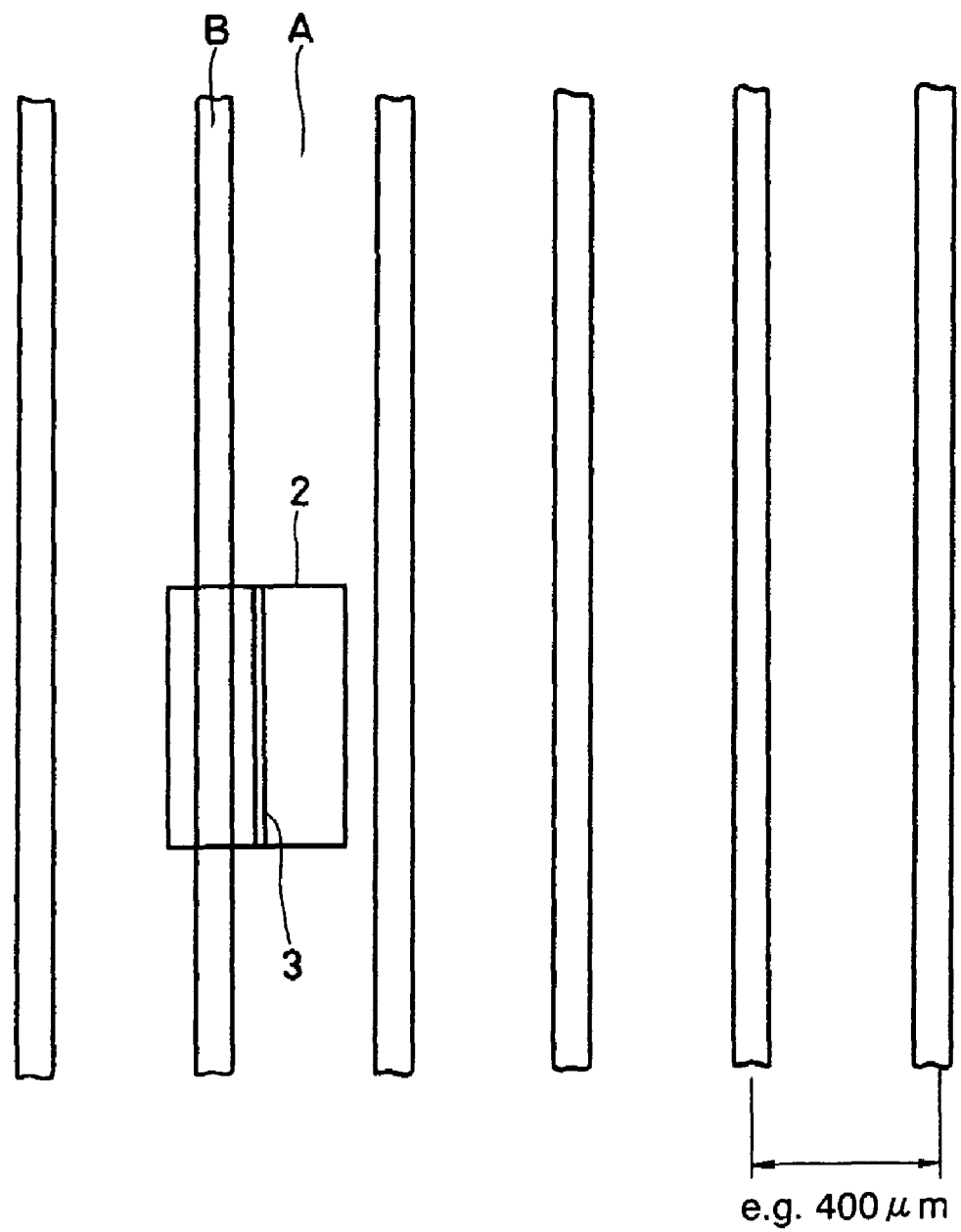
FIG. 27 is a plan view describing a method for producing a GaN type semiconductor laser according to a fifteenth embodiment of the present invention.

As shown in FIG. 27, according to the fifteenth embodiment, a GaN substrate 1 that is the same as the eleventh embodiment is used. However, unlike with the eleventh embodiment, one end plane that is in parallel with a laser stripe 3 passes through a position apart from a region B. Another end plane passes through a position that is placed between the two adjacent regions B and that is apart from the region B by 50 μm or greater. In this case, a device region 2 contains one region B.

Except for the foregoing portion, the fifteenth embodiment is the same as the eleventh embodiment and the first embodiment. Thus, the description of the other portions of the fifteenth embodiment is omitted.

According to the fifteenth embodiment, the same advantage as the first embodiment can be obtained.

Sixteenth Embodiment

Next, a sixteenth embodiment of the present invention will be described.

Figure 28:
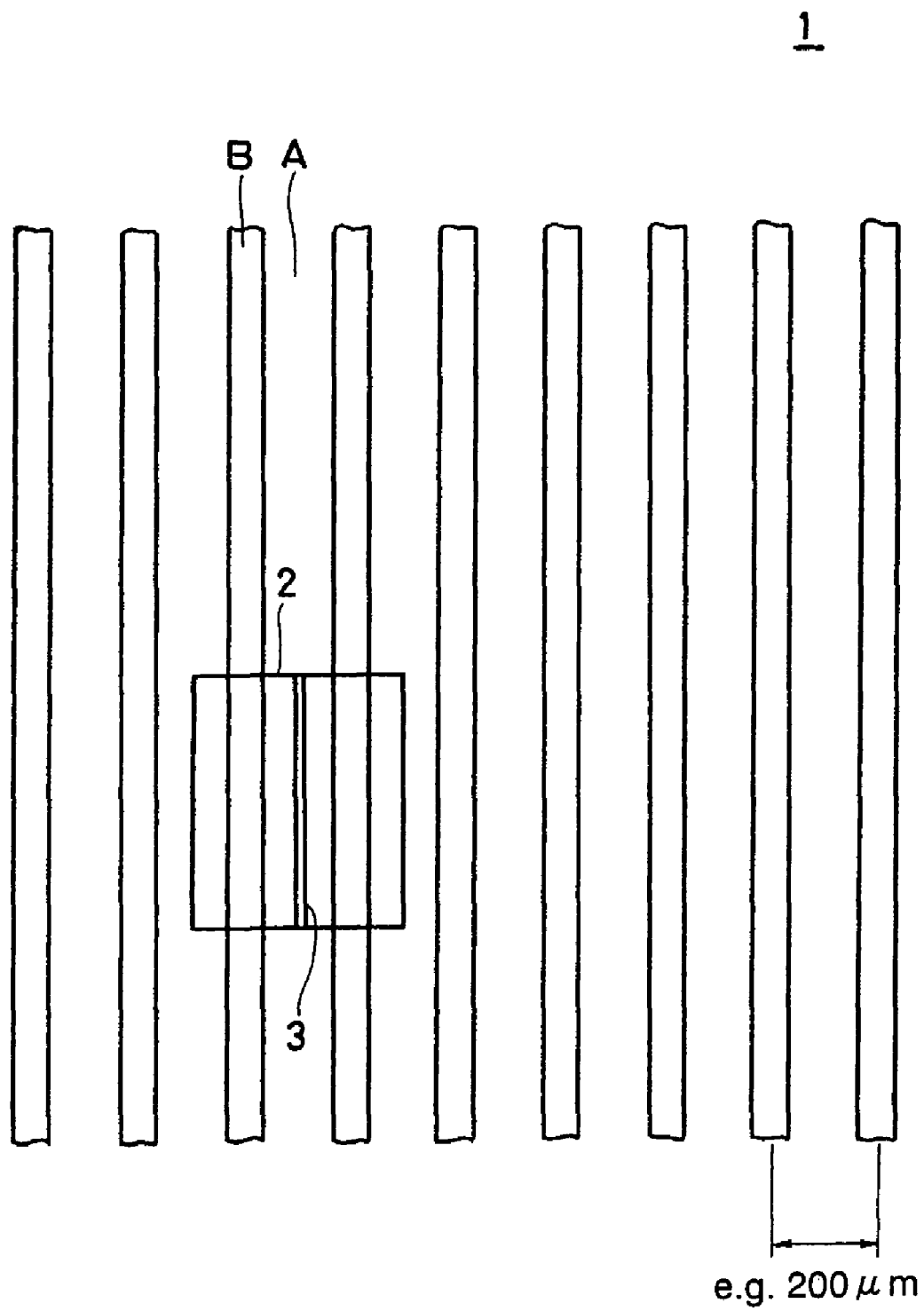
FIG. 28 is a plan view describing a method for producing a GaN type semiconductor laser according to a sixteenth embodiment of the present invention.

FIG. 28 is a plane view showing a GaN substrate 1 according to the sixteenth embodiment. The GaN substrate 1 according to the sixteenth embodiment is the same as the GaN substrate 1 according to the eleventh embodiment except that regions B of the GaN substrate 1 are periodically arranged at an interval of for example 200 μm in a <11-20> direction of GaN. In this case, a device region 2 contains two regions B.

As shown in FIG. 28, according to the sixteenth embodiment, a laser stripe 3 is positioned near the center of a region between two adjacent regions B. A pair of end planes that are in parallel with the laser stripe 3 are positioned near the centers of regions between two adjacent regions B on the left and right of the laser stripe 3.

Except for the foregoing portion, the sixteenth embodiment is the same as the eleventh embodiment and the first embodiment. Thus, the description of the other portions of the sixteenth embodiment is omitted.

According to the sixteenth embodiment, the same advantage as the first embodiment can be obtained.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

For example, numeric values, structures, substrates, materials, processes, and so forth of the foregoing embodiments are just examples. When necessary, different numeric values, structures, substrates, materials, processes, and so forth can be used.

In reality, in the foregoing embodiments, the present invention was applied to a method for producing a GaN type semiconductor laser having a SCH structure. In addition, the present invention can be also applied to a method for producing a GaN type semiconductor laser having a double heterostructure (DH). Moreover, the present invention can be also applied to a method for producing a GaN type light emitting diode. In addition, the present invention can be applied to an electron traveling device using a nitride type III-V group compound semiconductor such as a GaN type FET or a GaN type hetero-junction bipolar transistor (HBT).

In addition, according to the foregoing embodiments, as a carrier gas with which a crystal is grown by the MOCVD method, $H_2$ gas is used. When necessary, another carrier gas for example a mixed gas of $H_2$ and $N_2$ or a mixed gas of He and Ar may be used.

In addition, according to the foregoing embodiment, end planes of a resonator are formed by cleaving. Alternatively, end planes of a resonator may be formed by a dry-etching method such as RIE.

As described above, according to the present invention, since a structure, for example, an active region for a semiconductor device or a light emitting region for a semiconductor light emitting device is formed on a nitride type III-V group compound semiconductor substrate, a semiconductor substrate, or a substrate in such a manner that the active region or the light emitting region does not pass through any one of the second regions whose average dislocation density, average defect density, or crystallinity is greater or worse than the first region, the active region or light emitting region can be prevented from being adversely affected by the second regions. Thus, a semiconductor device having good characteristics such as good light emitting characteristic, good reliability, and long life or various types of devices having good characteristics, good reliability, and long life can be accomplished.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A method for producing a structured substrate, comprising the step of:
   using a nitride type III-V group compound semiconductor substrate in which a plurality of stripe-shaped second regions made of a crystal having a second average dislocation density are regularly arranged in a first region made of a crystal having a first average dislocation density so as to produce the structured substrate, the second average dislocation density being greater than the first average dislocation density, at least one of the second regions having a c-axis that is inverted relative to the first region,
   wherein the structured substrate has a structure that does not pass through any one of the second regions.

2. The method for producing the structured substrate as set forth in claim 1,
   wherein the structured substrate has a structure whose position and orientation are designated so that the structure does not pass through any one of the second regions.

3. The method for producing the structured substrate as set forth in claim 1,
   wherein the plurality of second regions are periodically arranged.

4. The method for producing the structured substrate as set forth in claim 1,
   wherein the structured substrate has a structure, and wherein the structure and the plurality of second regions are periodically arranged.

5. The method for producing the structured substrate as set forth in claim 4,
   wherein the relation of $w_2=n \times w_1$ is satisfied where $w_1$ represents the period the structure of the structured substrate, $w_2$ represents the period of the plurality of second regions, and n represents any natural number.

6. The method for producing the structured substrate as set forth in claim 4,
   wherein the relation of $w_1=n \times w_2$ is satisfied where $w_1$ represents the period the structure of the structured substrate, $w_2$ represents the period of the plurality of second regions, and n represents any natural number.

7. The method for producing the structured substrate as set forth in claim 1,
   wherein the structured substrate has a structure that is an active region.

8. The method for producing the structured substrate as set forth in claim 1,
   wherein the structured substrate has a structure that is a mask pattern used for epitaxial lateral overgrowth.

9. The method for producing the structured substrate as set forth in claim 1,
   wherein the interval of the two adjacent second regions is 20 μm or greater.

10. The method for producing the structured substrate as set forth in claim 1,
    wherein the interval of the two adjacent second regions is 50 μm or greater.

11. The method for producing the structured substrate as set forth in claim 1,
    wherein the interval of the two adjacent second regions is 100 μm or greater.

12. The method for producing the structured substrate as set forth in claim 3,
    wherein the arrangement period of the second regions is 20 μm or greater.

13. The method for producing the structured substrate as set forth in claim 3,
    wherein the arrangement period of the second regions is 50 μm or greater.

14. The method for producing the structured substrate as set forth in claim 3,
    wherein the arrangement period of the second regions is 100 μm or greater.

15. The method for producing the structured substrate as set forth in claim 1,
    wherein the second regions pierce the nitride type III-V group compound semiconductor substrate.

16. The method for producing the structured substrate as set forth in claim 1,
    wherein third regions are disposed between the first region and the second regions, the third regions having a third average dislocation density that is greater than the first average dislocation density and lower than the second average dislocation density.

17. The method for producing the structured substrate as set forth in claim 16,
    wherein the structure of the structured substrate does not pass through any one of the second regions and any one of the third regions.

18. The method for producing the structured substrate as set forth in claim 1,
    wherein the average dislocation density of each of the second regions is five times greater than the average dislocation density of the first region.

19. The method for producing the structured substrate as set forth in claim 1,
    wherein the average dislocation density of each of the second regions is $1 \times 10^8$ cm$^{-2}$ or greater.

20. The method for producing the structured substrate as set forth in claim 1, wherein the average dislocation density of the first region is $2 \times 10^6$ cm$^{-2}$ or smaller and the average dislocation density of each of the second regions is $1 \times 10^8$ cm$^{-2}$ or greater.

21. The method for producing the structured substrate as set forth in claim 16,
wherein the average dislocation density of the first region is $2 \times 10^6$ cm$^{-2}$ or smaller, the average dislocation density of each of the second regions is $1 \times 10^8$ cm$^{-2}$ or greater, and the average dislocation density of each of the third regions is $1 \times 10^8$ cm$^{-2}$ or smaller and $2 \times 10^6$ cm$^{-2}$ or greater.

22. The method for producing the structured substrate as set forth in claim 1,
wherein the structured substrate has a structure that is spaced apart from any one of the second regions by 1 μm or greater.

23. The method for producing the structured substrate as set forth in claim 1,
wherein the structured substrate has a structure that is spaced apart from any one of the second regions by 10 μm or greater.

24. The method for producing the structured substrate as set forth in claim 1,
wherein the structured substrate has a structure that is spaced apart from any one of the second regions by 100 μm or greater.

25. The method for producing the structured substrate as set forth in claim 1,
wherein the structure is formed on a nitride type III-V group compound semiconductor layer grown on the nitride type III-V group compound semiconductor substrate.

26. The method for producing the structured substrate as set forth in claim 1,
wherein the nitride type III-V group compound semiconductor substrate is made of $Al_xB_yGa_{1-x-y-z}In_zAs_uN_{1-u-v}P_v$ (where $0 \leq x \leq 1$, $0 \leq y \leq 1$, $0 \leq z \leq 1$, $0 \leq u \leq 1$, $0 \leq v \leq 1$, $0 \leq x+y+z < 1$, $0 \leq u+v < 1$).

27. The method for producing the structured substrate as set forth in claim 1,
wherein the nitride type III-V group compound semiconductor substrate is made of $Al_xB_yGa_{1-x-y-z}In_zN$ (where $0 \leq x \leq 1$, $0 \leq y \leq 1$, $0 \leq z \leq 1$, $0 \leq x+y+z < 1$).

28. The method for producing the structured substrate as set forth in claim 1,
wherein the nitride type III-V group compound semiconductor substrate is made of $Al_xGa_{1-x-z}In_zN$ (where $0 \leq x \leq 1$, $0 \leq z \leq 1$).

29. The method for producing the structured substrate as set forth in claim 1,
wherein the nitride type III-V group compound semiconductor substrate is made of GaN.

30. The method for producing the structured substrate as set forth in claim 1, further comprising the step of:
forming a plurality of portions that are different from other portions in the interval of the second regions and/or the arrangement thereof as alignment marks so as to align a mask.

31. A method for producing a semiconductor light emitting device, comprising the step of:
using a nitride type III-V group compound semiconductor substrate in which a plurality of stripe-shaped second regions made of a crystal having a second average dislocation density are regularly arranged in a first region made of a crystal having a first average dislocation density so as to produce the semiconductor light emitting device, the second average dislocation density being greater than the first average dislocation density, at least one of the second regions having a c-axis that is inverted relative to the first region,
wherein the semiconductor light emitting device has a light emitting region that does not pass through any one of the second regions.

32. A method for producing a semiconductor device, comprising the step of:
using a nitride type III-V group compound semiconductor substrate in which a plurality of stripe-shaped second regions made of a crystal having a second average dislocation density are regularly arranged in a first region made of a crystal having a first average dislocation density so as to produce the semiconductor device, the second average dislocation density being greater than the first average dislocation density, at least one of the second regions having a c-axis that is inverted relative to the first region,
wherein the semiconductor device has an active region that does not pass through any one of the second regions.

33. A method for producing a structured substrate, comprising the step of:
using a nitride type III-V group compound semiconductor substrate in which a plurality of stripe-shaped second regions made of a crystal having a second average dislocation density are regularly arranged in a first region made of a crystal having a first average dislocation density so as to produce a structured substrate, the second average dislocation density being greater than the first average dislocation density, the second regions being arranged at a first interval in a first direction and at a second interval in a second direction perpendicular to the first direction, the second interval being smaller than the first interval, at least one of the second regions having a c-axis that is inverted relative to the first region,
wherein the structured substrate has a structure that does not pass through any one of the second regions.

34. A method for producing a structured substrate, comprising the step of:
using a nitride type III-V group compound semiconductor substrate in which a plurality of stripe-shaped second regions that linearly extend and that are made of a crystal having a second average dislocation density are regularly arranged in parallel in a first region made of a crystal having a first average dislocation density so as to produce a structured substrate, the second average dislocation density being greater than the first average dislocation density, at least one of the second regions having a c-axis that is inverted relative to the first region,
wherein the structured substrate has a structure that does not pass through any one of the second regions.

35. A method for producing a semiconductor light emitting device, comprising the step of:
using a nitride type III-V group compound semiconductor substrate in which a plurality of stripe-shaped second regions made of a crystal having a second average dislocation density are regularly arranged in a first region made of a crystal having a first average dislocation density so as to produce a semiconductor light emitting device, the second average dislocation density being greater than the first average dislocation density, the second regions being arranged at a first interval in a first direction and at a second interval in a second direction perpendicular to the first direction, the second interval being smaller than the first interval, at least one of the second regions having a c-axis that is inverted relative to the first region, wherein the semiconductor light emitting device has a light emitting region that does not pass through any one of the second regions.

36. A method for producing a semiconductor light emitting device, comprising the step of:

using a nitride type III-V group compound semiconductor substrate in which a plurality of stripe-shaped second regions that linearly extend and that are made of a crystal having a second average dislocation density are regularly arranged in parallel in a first region made of a crystal having a first average dislocation density so as to produce a semiconductor light emitting device, the second average dislocation density being greater than the first average dislocation density, at least one of the second regions having a c-axis that is inverted relative to the first region, wherein the semiconductor light emitting device has a light emitting region that does not pass through any one of the second regions.

37. A method for producing a semiconductor device, comprising the step of:

using a nitride type III-V group compound semiconductor substrate in which a plurality of stripe-shaped second regions made of a crystal having a second average dislocation density are regularly arranged in a first region made of a crystal having a first average dislocation density so as to produce a semiconductor device, the second average dislocation density being greater than the first average dislocation density, the second regions being arranged at a first interval in a first direction and at a second interval in a second direction perpendicular to the first direction, the second interval being smaller than the first interval, at least one of the second regions having a c-axis that is inverted relative to the first region, wherein the semiconductor device has an active region that does not pass through any one of the second regions.

38. A method for producing a semiconductor device, comprising the step of:

using a nitride type III-V group compound semiconductor substrate in which a plurality of stripe-shaped second regions that linearly extend and that are made of a crystal having a second average dislocation density are regularly arranged in parallel in a first region made of a crystal having a first average dislocation density so as to produce a semiconductor device, the second average dislocation density being greater than the first average dislocation density, at least one of the second regions having a c-axis that is inverted relative to the first region, wherein the semiconductor device has an active region that does not pass through any one of the second regions.

* * * * *